US 9,000,574 B2

(12) United States Patent
Komatsu et al.

(10) Patent No.: US 9,000,574 B2
(45) Date of Patent: *Apr. 7, 2015

(54) SEMICONDUCTOR DEVICE FOR BATTERY POWER VOLTAGE CONTROL

(75) Inventors: Mikihiko Komatsu, Tokyo (JP); Takao Hidaka, Tokyo (JP); Junko Kimura, Tokyo (JP)

(73) Assignee: Renesas Electronics Corporation, Kanagawa (JP)

(*) Notice: Subject to any disclaimer, the term of this patent is extended or adjusted under 35 U.S.C. 154(b) by 463 days.

This patent is subject to a terminal disclaimer.

(21) Appl. No.: 13/403,038

(22) Filed: Feb. 23, 2012

(65) Prior Publication Data

US 2012/0146245 A1    Jun. 14, 2012

Related U.S. Application Data

(63) Continuation of application No. 12/489,714, filed on Jun. 23, 2009, now Pat. No. 8,134,228.

(30) Foreign Application Priority Data

Sep. 19, 2008   (JP) ................................. 2008-240825

(51) Int. Cl.
*H01L 23/495*        (2006.01)
*H01L 23/02*         (2006.01)
(Continued)

(52) U.S. Cl.
CPC ...... *H01L 23/49575* (2013.01); *H01L 23/4952* (2013.01); *H01L 23/50* (2013.01); *H01L 24/05* (2013.01); *H01L 24/06* (2013.01); *H01L 24/48* (2013.01); *H01L 24/49* (2013.01); *H01L 25/0657* (2013.01); *H01L 25/16* (2013.01);
(Continued)

(58) Field of Classification Search
USPC ......................................... 257/666, 686, 777
See application file for complete search history.

(56) References Cited

U.S. PATENT DOCUMENTS 5,982,162 A    11/1999  Yamauchi
7,199,469 B2    4/2007  Ishida et al.
(Continued)

FOREIGN PATENT DOCUMENTS

JP        10-56029 A    2/1998
JP     2002-043504 A    2/2002
(Continued)

OTHER PUBLICATIONS

Tawainese Office Action received in TW Application No. 098128295 dated May 7, 2014.
(Continued)

*Primary Examiner* — James Mitchell
(74) *Attorney, Agent, or Firm* — Mattingly & Malur, P.C.

(57) ABSTRACT

A voltage generated in any of a plurality of semiconductor chips is supplied to another chip as a power supply voltage to realize a stable operation of a semiconductor device in which the semiconductor chips are stacked in the same package. For example, two chips are stacked with each other, first to third pads are disposed along corresponding sides of the respective chips, which are arranged close and in parallel to each other, and these pads are commonly connected to each other with first to third metal wires, respectively. In another example, fourth and fifth pads are disposed along a side different from a side along which the first to third pads are disposed, and further connected to each other with a fourth metal wire directly between the chips.

10 Claims, 37 Drawing Sheets

(51) Int. Cl.
  *H01L 29/40*   (2006.01)
  *H01L 23/50*   (2006.01)
  *H01L 23/00*   (2006.01)
  *H01L 25/065*  (2006.01)
  *H01L 25/16*   (2006.01)
  *G06F 1/26*    (2006.01)

(52) U.S. Cl.
  CPC . *G06F 1/26* (2013.01); *H01L 24/45* (2013.01); *H01L 24/85* (2013.01); *H01L 2223/6611* (2013.01); *H01L 2224/04042* (2013.01); *H01L 2224/05553* (2013.01); *H01L 2224/05556* (2013.01); *H01L 2224/05624* (2013.01); *H01L 2224/05647* (2013.01); *H01L 2224/0603* (2013.01); *H01L 2224/32145* (2013.01); *H01L 2224/45124* (2013.01); *H01L 2224/45144* (2013.01); *H01L 2224/45147* (2013.01); *H01L 2224/48091* (2013.01); *H01L 2224/48095* (2013.01); *H01L 2224/48137* (2013.01); *H01L 2224/48145* (2013.01); *H01L 2224/48247* (2013.01); *H01L 2224/48465* (2013.01); *H01L 2224/49111* (2013.01); *H01L 2224/49113* (2013.01); *H01L 2224/4917* (2013.01); *H01L 2224/49171* (2013.01); *H01L 2224/49175* (2013.01); *H01L 2224/85205* (2013.01); *H01L 2225/0651* (2013.01); *H01L 2225/06555* (2013.01); *H01L 2225/06562* (2013.01); *H01L 2924/01003* (2013.01); *H01L 2924/01004* (2013.01); *H01L 2924/01005* (2013.01); *H01L 2924/01013* (2013.01); *H01L 2924/01014* (2013.01); *H01L 2924/01028* (2013.01); *H01L 2924/01029* (2013.01); *H01L 2924/01033* (2013.01); *H01L 2924/01047* (2013.01); *H01L 2924/0105* (2013.01); *H01L 2924/01057* (2013.01); *H01L 2924/01073* (2013.01); *H01L 2924/01074* (2013.01); *H01L 2924/01075* (2013.01); *H01L 2924/01077* (2013.01); *H01L 2924/01078* (2013.01); *H01L 2924/01079* (2013.01); *H01L 2924/01082* (2013.01); *H01L 2924/01322* (2013.01); *H01L 2924/014* (2013.01); *H01L 2924/13091* (2013.01); *H01L 2924/15311* (2013.01); *H01L 2924/19041* (2013.01); *H01L 2924/19043* (2013.01); *H01L 2924/30105* (2013.01); *H01L 2924/01006* (2013.01); *H01L 2924/01019* (2013.01); *H01L 2924/01023* (2013.01); *H01L 2924/01055* (2013.01); *H01L 2224/32245* (2013.01); *H01L 2224/73265* (2013.01); *H01L 2224/48624* (2013.01); *H01L 2224/48647* (2013.01); *H01L 2224/48824* (2013.01); *H01L 2224/48847* (2013.01); *H01L 2224/48724* (2013.01); *H01L 2224/48747* (2013.01)

(56) References Cited

U.S. PATENT DOCUMENTS

| | | | |
|---|---|---|---|
| 7,368,960 | B2 | 5/2008 | Li et al. |
| 7,420,281 | B2 | 9/2008 | Tsunozaki |
| 7,676,912 | B2 | 3/2010 | Sasaki et al. |
| 7,745,559 | B2 | 6/2010 | Kobayashi |
| 8,134,228 | B2 * | 3/2012 | Komatsu et al. ............. 257/686 |
| 8,148,816 | B2 | 4/2012 | Sasaki et al. |
| 2004/0075488 | A1 | 4/2004 | Yamamoto et al. |
| 2006/0065962 | A1 | 3/2006 | Narendra et al. |
| 2008/0116550 | A1 | 5/2008 | Edwards |

FOREIGN PATENT DOCUMENTS

| | | |
|---|---|---|
| JP | 2002-124626 A | 4/2002 |
| JP | 2004-128329 A | 4/2004 |
| JP | 2004-165558 A | 6/2004 |
| JP | 2005-183611 A | 7/2005 |
| JP | 3732884 B2 | 10/2005 |
| JP | 2006-073625 A | 3/2006 |
| JP | 2008-060444 A | 3/2008 |
| TW | 200707873 A | 2/2007 |
| WO | 2008/084841 A1 | 7/2008 |

OTHER PUBLICATIONS

Japanese Office Action received in corresponding Japanese Application No. 2013-226582 dated Jul. 22, 2014.

Japanese Office Action received in corresponding Japanese Application No. 2013-226582 dated Jan. 20, 2015.

* cited by examiner (a)

A-A' CROSS-SECTIONAL VIEW (b)

B-B' CROSS-SECTIONAL VIEW (a)

Total R= RwireA+Rvreg1+Rwiresub+Rvdd+RwireC (b)

Total R= RwireA+Rvreg1+RwireC (a)

(b)

(a)

(b)

(a)

(b)

(a)

(b)

(a)

A-A' CROSS-SECTIONAL VIEW (b)

B-B' CROSS-SECTIONAL VIEW (a)

A-A' CROSS-SECTIONAL VIEW (b)

B-B' CROSS-SECTIONAL VIEW (a)

A-A' CROSS-SECTIONAL VIEW (b)

B-B' CROSS-SECTIONAL VIEW

SEMICONDUCTOR DEVICE FOR BATTERY POWER VOLTAGE CONTROL

CROSS REFERENCE

This application is a continuation application of U.S. Ser. No. 12/489,714, filed Jun. 23, 2009, the entire disclosure of which is hereby incorporated by reference.

CROSS-REFERENCE TO RELATED APPLICATION

The disclosure of Japanese Patent Application No. 2008-240825 filed on Sep. 19, 2008 including the specification, drawings and abstract is incorporated herein by reference in its entirety.

BACKGROUND OF THE INVENTION

The present invention relates to a semiconductor device having a plurality of semiconductor chips stacked in the same package, and relates to a technique supplying a voltage generated in any of the plurality of semiconductor chips to another semiconductor chip as a power supply voltage.

The following is generally known as a relationship between two semiconductor chips.

One semiconductor chip is supplied with an external power supply voltage and has a regulator circuit outputting an internal power supply voltage stepped down therefrom (first semiconductor chip).

The other semiconductor chip is supplied with the internal power supply voltage as an operating power supply voltage (second semiconductor chip).

In this case, the first semiconductor chip operates at a high power supply voltage and can operate at a voltage of 4 to 25 V, for example. The second semiconductor chip operates at a lower power supply voltage than the first semiconductor chip and can operate at a voltage of 1.4 to 3.6 V, for example.

That is, the first semiconductor chip is a semiconductor chip having a higher maximum voltage value than the second semiconductor chip, when the two semiconductor chips are compared with each other in terms of the maximum voltage value shown in a catalog of semiconductor device products or the like.

Until now, the first and second semiconductor chips have been accommodated in different packages and the two semiconductor chips are supplied with power supply voltages via external terminals connected with the semiconductor chips.

However, there has been a problem that mounting the two packages on a circuit substrate side by side requires a considerably large mounting area.

The following conventional techniques are known for reducing the mounting area.

Japanese patent laid open No. 2005-183611 (Patent document 1) discloses a technique regarding a multi-chip type semiconductor device containing a regulator circuit, which has been provided externally so far, within a chip and mounting two chips side by side (in the same plane) within one package.

It is possible to make the mounting area, that is, the package size, smaller in accommodating two chips arranged side by side in one package than in arranging two packages side by side.

This document discloses that two chip are mounted in the same plane in one package, but does not further disclose a technique sufficient for operating the regulator circuit stably mounted in one package.

In addition, a chip stacking technique is generally considered as a mounting method for further reducing the package size.

However, a preceding technology search at this time has not been able to find a document focused on a stable operation of the regulator circuit in the case of chip stacking.

Meanwhile, the preceding technology search at this time has found Japanese patent No. 3732884 (Patent document 2) which discloses a technique regarding a circuit and a semiconductor device for stabilizing the regulator circuit operation.

However, this document discloses only a stabilization technique of a regulator circuit in one chip, and does not disclose a technique such as one for operating the regulator circuit stably among a plurality of chips and in a structure stacking the chips.

SUMMARY OF THE INVENTION

The present invention relates to a semiconductor device having a plurality of semiconductor chips stacked in the same package, and aims at providing a technique to supply a voltage generated in any of the semiconductor chips to another semiconductor chip as a power supply voltage and to stably operate the semiconductor device.

Among the inventions disclosed in the present application, the one according to one embodiment is as follows. That is, a semiconductor device according to the present invention includes a first semiconductor chip which has four sides including a first side and a pad provided over a main surface thereof, a second semiconductor chip which has four sides including a second side and a pad provided over a main surface thereof, and which is stacked over the main surface of the first semiconductor chip such that the first side and the second side are close and in parallel to each other and both of the main surfaces are directed in the same direction, a sealing body sealing the first semiconductor chip and the second semiconductor chip, and a plurality of external terminals each of which is coupled to the pad and a part of which is exposed to an outside of the sealing body. The first semiconductor chip includes an external power supply input pad which is supplied with an external power supply voltage from the external terminal, a regulator circuit which is electrically connected to the external power supply input pad and generates an internal power supply voltage by stepping down the external power supply voltage according to a reference voltage and an input voltage to be compared with this reference voltage, an internal power supply voltage output pad which is electrically connected to the regulator circuit and from which the internal power supply voltage is output, and a monitor pad electrically connected to an input part of the regulator circuit to which the input voltage is input. The second semiconductor chip includes an internal power supply input pad to which the internal power supply voltage is input from the internal power supply voltage output pad. The internal power supply voltage output pad and the monitor pad are disposed along the first side of the first semiconductor chip, the internal power supply input pad is disposed along the second side of the second semiconductor chip, and the monitor pad is electrically connected to a coupling path between the internal power supply voltage output pad and the internal power supply input pad, or electrically connected to the internal power supply voltage output pad via the internal power supply input pad. Further, the first semiconductor chip includes a first signal pad which is disposed along a side different from the first side, and transmits and receives a signal to and from the second semiconductor chip, and the second semiconductor chip includes a second signal pad which is disposed along a side close and in parallel to the side along which the first signal pad is disposed, and electrically connected to the first signal pad.

The following explains briefly the effect acquired from the embodiment shown as a means for solving the above subject among the inventions disclosed in the present application.

That is, by the above chip stacking structure, it is possible to reduce an influence of a noise generated by signal transmission and reception between the first signal pad and the second signal pad, on the internal power supply voltage.

DETAILED DESCRIPTION OF THE PREFERRED EMBODIMENTS

Hereinafter, embodiments of the present invention will be described in detail with reference to the drawings. Note that in all the drawings for explaining embodiments, the same symbol is attached to the same member, as a principle, and the repeated explanation thereof is omitted.

Embodiment 1

Figure 1:
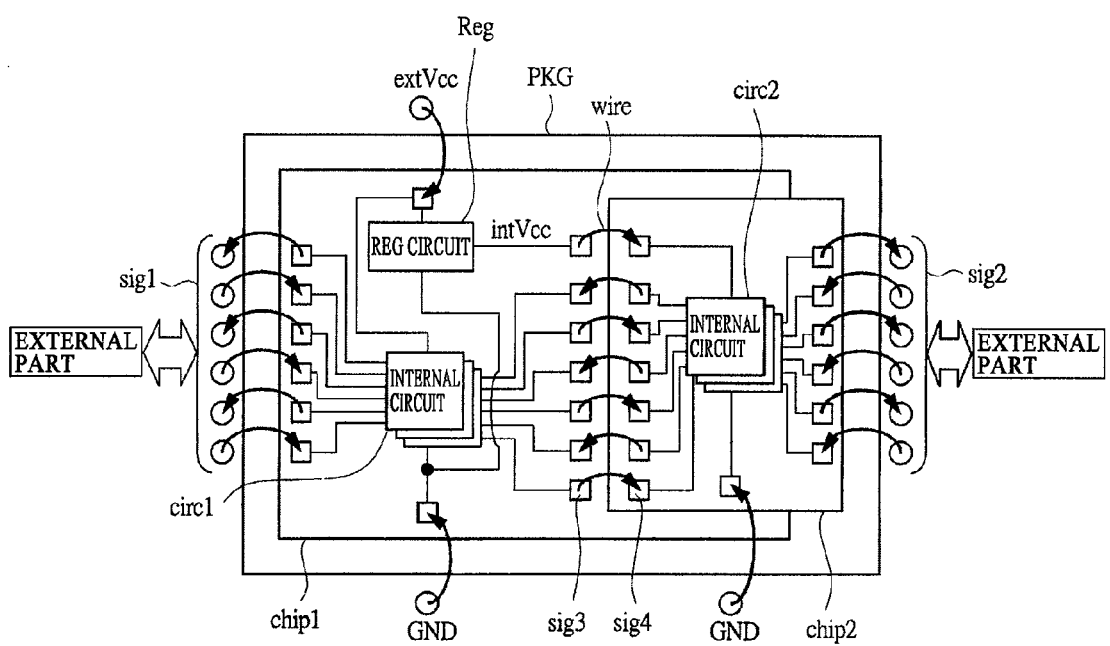
FIG. 1 is a functional block diagram of a semiconductor device in Embodiment 1 of the present invention.

FIG. 1 is a functional block diagram of a semiconductor device in Embodiment 1 of the present invention.

As shown in FIG. 1, a second semiconductor chip CHIP2 is stacked on a first semiconductor chip CHIP1, and these two chips are accommodated in one package PKG.

For example, the first semiconductor chip CHIP1 is an analog chip which has an analog circuit and carries out a power supply control and the like, and the second semiconductor chip CHIP2 is a microcomputer chip which controls the analog chip and carries out information processing.

The first semiconductor chip CHIP1 includes one or more regulator circuits REG outputting internal power supply voltages INTVcc which are stepped down from an external power supply voltage EXTVcc.

Further, the first semiconductor chip CHIP1 transmits and receives a signal to and from the outside of the package PKG through a signal terminal SIG1, and includes one or more internal circuits CIRC1 for information processing. The regulator circuit REG and the internal circuit CIRC1 are electrically connected to a terminal supplied with the external power supply voltage EXTVcc.

The second semiconductor chip CHIP2 transmits and receives a signal to and from the outside of the package PKG through a signal terminal SIG2 and includes one or more internal circuits CIRC2 for information processing.

The internal circuit CIRC2 is electrically connected to the regulator circuit REG.

The internal circuit CIRC1 includes a signal terminal SIG3 for transmitting and receiving a signal to and from the internal circuit CIRC2.

The internal circuit CIRC2 includes a signal terminal SIG4 for transmitting and receiving a signal to and from the internal circuit CIRC1.

The signal terminal SIG3 and the signal terminal SIG4 are electrically connected via a metal wire WIRE.

Here, the first semiconductor chip operates at a high power supply voltage and can operate at a voltage of 4 to 25 V, for example. The second semiconductor chip operates at a power supply voltage lower than that of the first semiconductor chip and can operate at a voltage of 1.4 to 3.6 V, for example.

That is, the first semiconductor chip has a maximum voltage value higher than that of the second semiconductor chip, when the two chips are compared with each other in terms of maximum voltage value shown in a catalog of semiconductor device products or the like.

The regulator circuit REG, the internal circuit CIRC1 and the internal circuit CIRC2 are electrically connected to a terminal provided with the earth (ground) potential GND.

Figure 2:
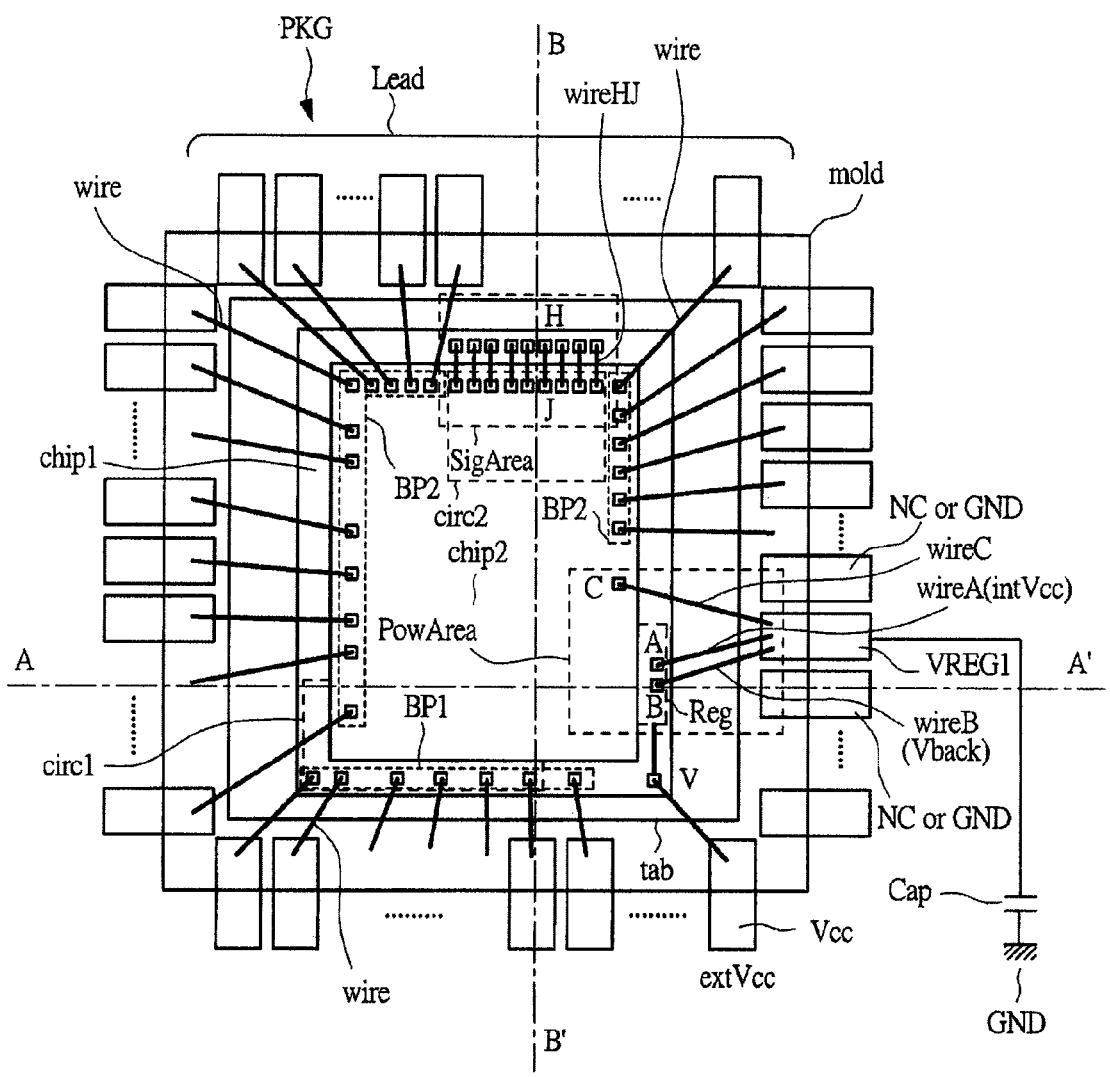
FIG. 2 is a plan view of a package structure for the semiconductor device in Embodiment 1 of the present invention.

FIG. 2 is a plan view showing a package structure of the semiconductor device in Embodiment 1 of the present invention.

Figure 3:
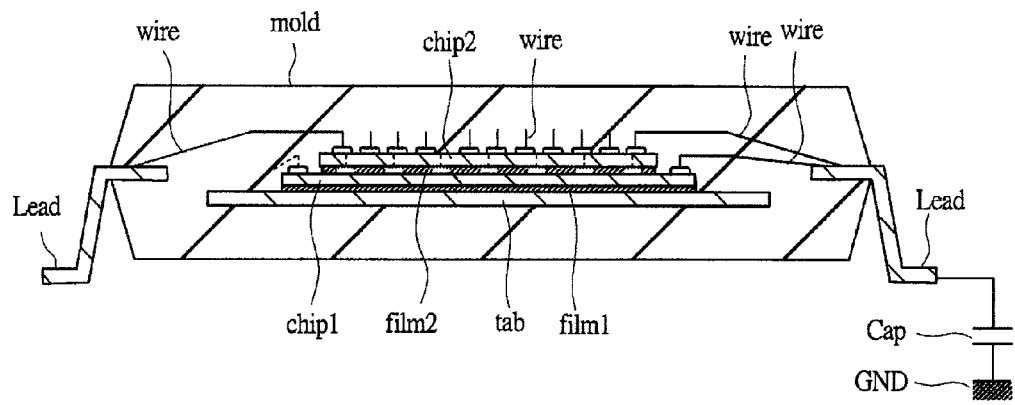
FIG. 3A is a cross-sectional view taken along the line A-A' of FIG. 2 of a package structure for the semiconductor device in Embodiment 1 of the present invention.
FIG. 3B is a cross-sectional view taken along the line B-B' of FIG. 2 of a package structure for the semiconductor device in Embodiment 1 of the present invention.
Figure 3:
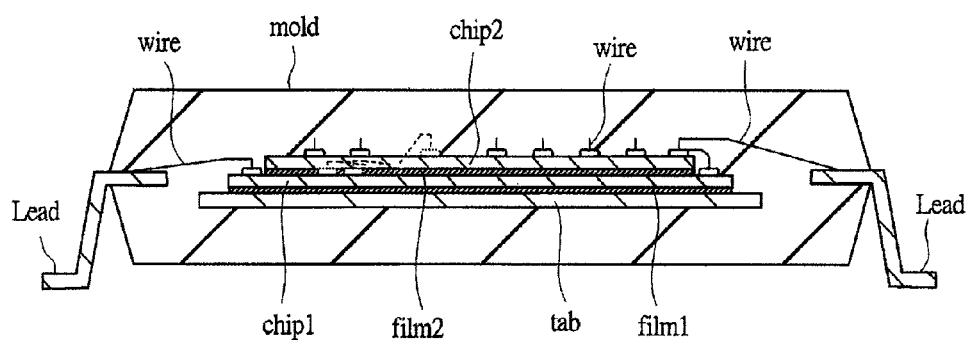

FIGS. 3A and 3B are cross-sectional views showing the package structure of the semiconductor device in Embodiment 1 of the present invention.

FIG. 3A is a cross-sectional view taken along the line A-A' of FIG. 2. FIG. 3B is a cross-sectional view taken along the line B-B' of FIG. 2.

As shown in FIG. 2 and FIGS. 3A and 3B, a package of the semiconductor device of Embodiment 1 here uses a QFP (Quad Flat Package).

As shown in FIG. 2 and FIGS. 3A and 3B, the package has a tab TAB for mounting a semiconductor chip. The tab TAB is held by hanging leads at four corners thereof, which are not shown in the drawing. The first semiconductor chip CHIP1 is mounted on the tab TAB.

Each of the first semiconductor chip CHIP1 and the second semiconductor chip CHIP2 to be described hereinafter has a main surface which includes a circuit layer having a transistor and the like formed by use of a semiconductor wafer production process technology. Meanwhile, the opposite side, that is, the surface facing the main surface is a rear surface.

As shown in FIGS. 3A and 3B, the rear surface of the first semiconductor chip CHIP1 is fixed to the surface of the tab TAB with a thermosetting epoxy-based adhesive film FILM1 or the like, for example. The tab TAB is one of materials composing the QFP and formed integrally with the hanging lead, lead terminal LEAD, etc. in a production step of a lead frame which is made of a metallic (conductive) material. In other words, the tab TAB is a part of the lead frame for mounting the semiconductor chip.

The second semiconductor chip CHIP2 is stacked on the main surface of the first semiconductor chip CHIP1 such that the main surface thereof is directed in the same direction as that of the first semiconductor chip CHIP1.

The main surface of the first semiconductor chip CHIP1 and the rear surface of the second semiconductor chip CHIP2 are also fixed with each other with an adhesive film FILM2 or the like.

For example, the thicknesses of the first semiconductor chip CHIP1 and the second semiconductor chip CHIP2 are approximately 150 μm. Further, the adhesion thicknesses of the adhesive films FILM1 and FILM2 are approximately 25 μm.

As shown in FIG. 2, each of the first semiconductor chip CHIP1 and the second semiconductor chip CHIP2 has a quadrangular shape; here, a rectangular shape.

Further, the outer shape of the second semiconductor chip CHIP2 is smaller than that of the first semiconductor chip CHIP1, and thereby the four sides of the second semiconductor chip CHIP2 are surrounded by the four sides of the first semiconductor chip CHIP1.

Further, both of the chips are stacked such that the sides of the second semiconductor chip CHIP2 are arranged close and in parallel to respective sides of the first semiconductor chip CHIP1.

As shown in FIG. 2, in the main surface of the first semiconductor chip CHIP1, a plurality of pads BP1 are disposed connected to the built-in regulator circuit REG and the internal circuit CIRC1 so as to be arranged along the respective sides of the chip. It can be also said that the pads BP1 are disposed so as to be sandwiched between the sides of the first semiconductor chip CHIP1 and the corresponding sides of the second semiconductor chip CHIP2.

Further, in the main surface of the second semiconductor chip CHIP2, a plurality of pads BP2 is similarly disposed connected to the internal circuit CIRC2 so as to be arranged along the respective sides of the chip.

Note that the number of the pads BP1 of the first semiconductor chip CHIP1 and the number of the pads BP2 of the second semiconductor chip CHIP2 are shown by appropriate numbers in FIG. 2 for explanation and the actual numbers may be larger or smaller than these numbers.

As shown in FIG. 2 and FIGS. 3A and 3B, the pads BP1 and BP2 are connected to the corresponding lead (external) terminals LEAD with the metal wires WIRE, respectively. This wire WIRE is a gold (Au) wire, an aluminum (Al) wire, a copper (Cu) wire, or the like, for example. This metal wire WIRE is wired by a wire bonding method utilizing a combination of an ultrasonic wave and heat.

The first semiconductor chip CHIP1 and the second semiconductor chip CHIP2 accommodated in the package PKG are provided with the power supply voltage and the earth (ground) potential from the outside of the package via the lead terminals LEAD connected thereto with the metal wires WIRE, and further carry out transmission and reception of signals and the like via the lead terminals LEAD connected thereto with the metal wires WIRE (corresponding to the signal terminals SIG1 and SIG2 shown in FIG. 1).

As shown in FIG. 2 and FIGS. 3A and 3B, the first semiconductor chip CHIP1 and the second semiconductor chip CHIP2 are covered by a sealing body MOLD which is made of a material such as a thermosetting epoxy-based resin and formed by a transfer mold method or the like. The thickness of the sealing body MOLD is approximately 1.4 mm, for example.

The sealing body MOLD has a function to protect the semiconductor chips from external electrical and mechanical impacts.

Respective parts of the lead terminals LEAD are exposed from four sides of the sealing body MOLD.

Note that the number of the lead terminals LEAD of the package is shown by an appropriate number in FIG. 2 for explanation and the actual number may be larger or smaller than this number.

By stacking two semiconductor chips and accommodating the chips in one package in this manner, it is possible to make the mounting area smaller than that in the conventional mounting of two packages arranged side by side on a circuit substrate.

Figure 4:
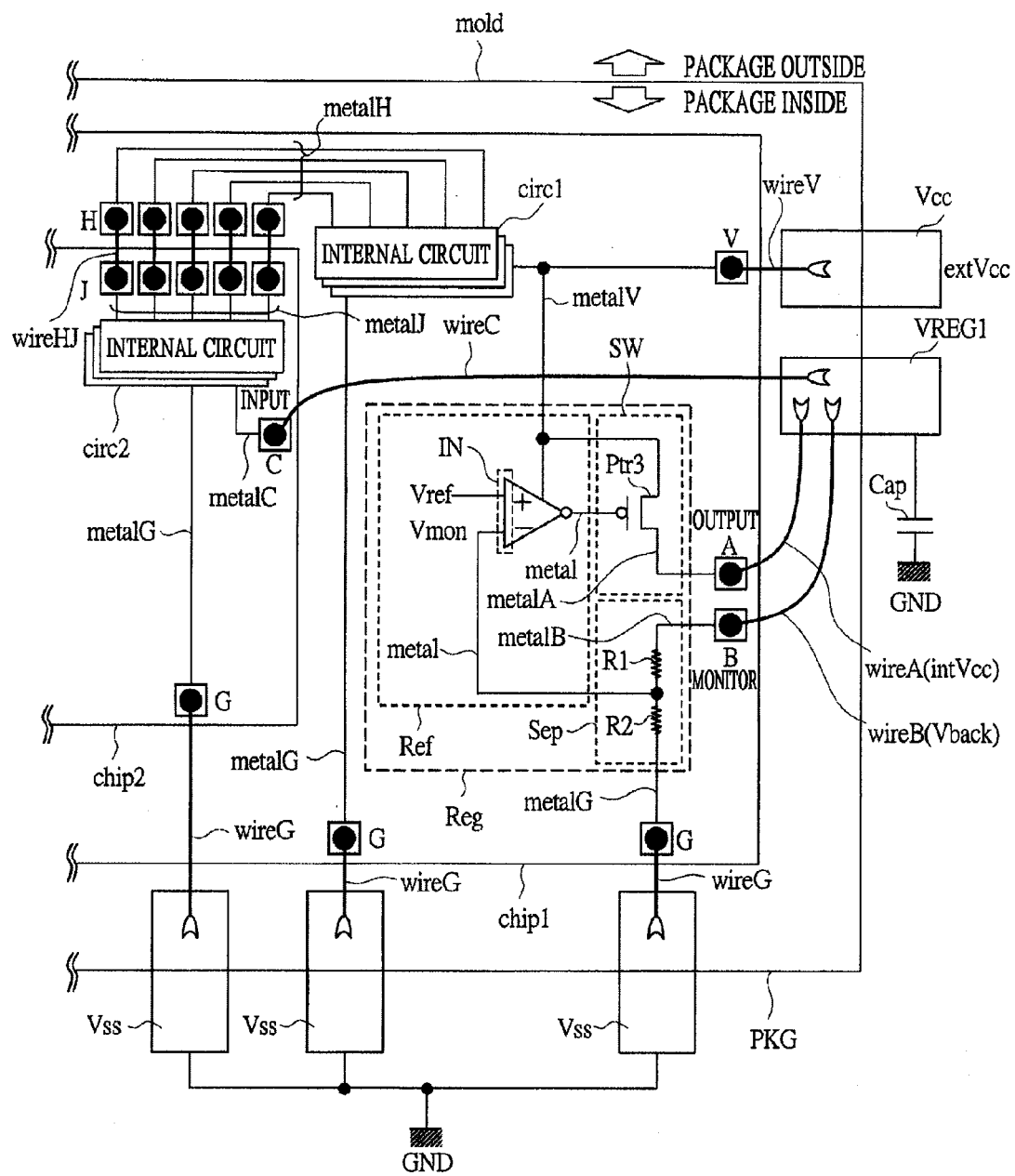
FIG. 4 is a diagram showing details of a regulator circuit and the surrounding part thereof for the semiconductor device in Embodiment 1 of the present invention.

FIG. 4 is a diagram showing details of the regulator circuit REG and the surrounding part thereof for the semiconductor device in Embodiment 1 of the present invention.

As shown in FIG. 4, the regulator circuit REG is configured with a comparison part REF, a voltage step-down switch part SW, and a voltage dividing part SEP.

Figure 5:
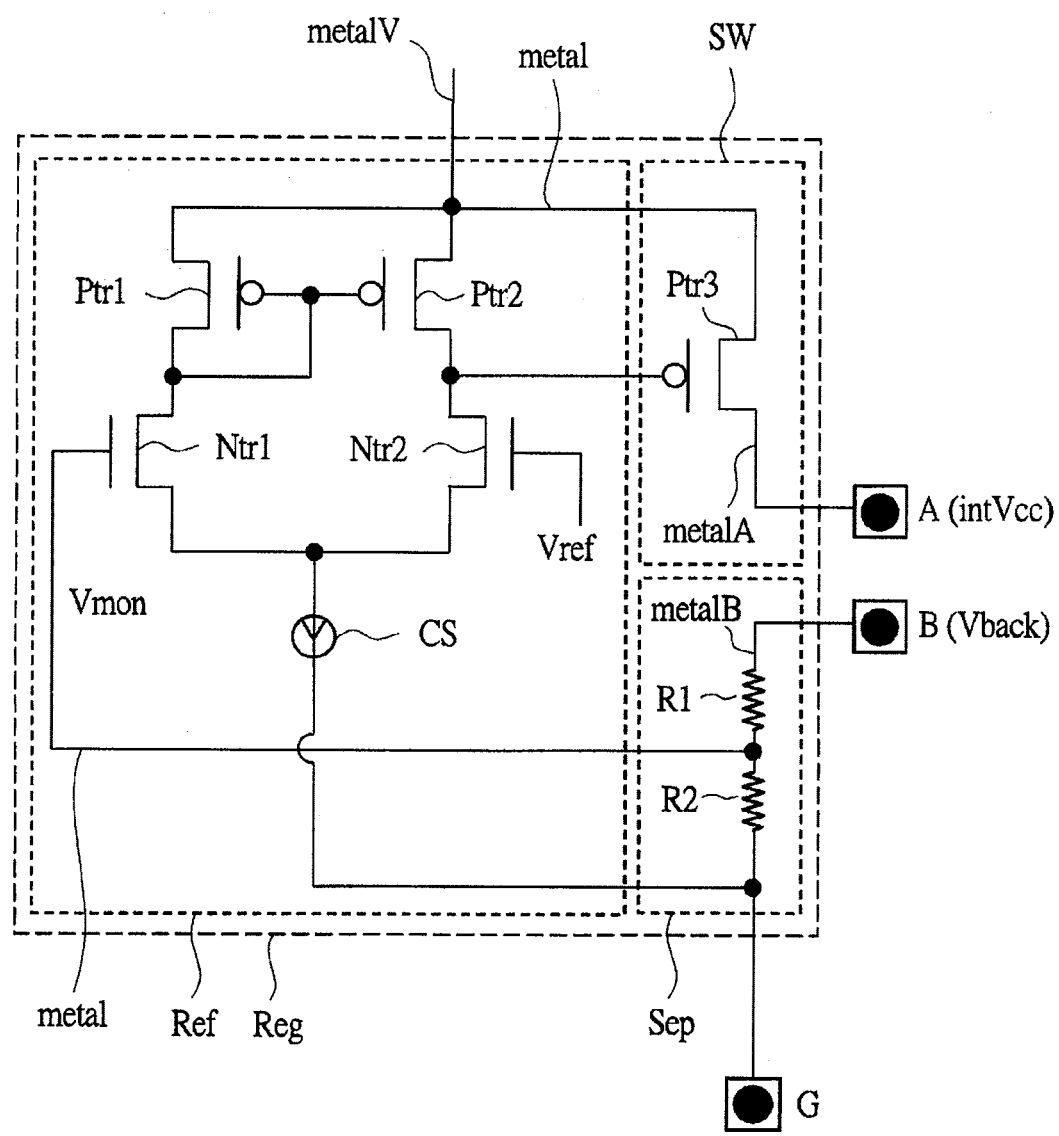
FIG. 5 is a diagram showing details of an equivalent circuit of a comparison part for the semiconductor device in Embodiment 1 of the present invention.

FIG. 5 is a diagram showing details of the comparison part REF for the semiconductor device in Embodiment 1 of the present invention.

As shown in FIG. 5, the comparison part REF here is a current mirror type amplification circuit configured with PMOS transistors PTR1 and PTR2, NMOS transistors NTR1 and NTR2, and a constant current source CS.

As shown in FIG. 4 and FIG. 5, the voltage step-down switch part SW is configured with a PMOS transistor PTR3.

As shown in FIG. 4 and FIG. 5, the voltage dividing part SEP is configured with a resistor R1 and a resistor R2. Note that the resistor R1 and resistor R2 are resistors formed by use of polysilicon or the like in the semiconductor chip.

The transistors, resistors, etc. configuring the regulator circuit REG are connected to each other with metal wirings METAL as shown in FIG. 4 and FIG. 5. The metal wiring METAL is a wiring made of aluminum (Al), copper (Cu) or the like by use of a semiconductor wafer process technology or the like.

As shown in FIG. 4, a pad V disposed on the main surface of the first semiconductor chip CHIP1 is connected with the internal circuit CIRC1 and the regulator REG with a metal wiring METALV and works for an external power supply input pad which inputs the external power supply voltage EXTVcc.

The pad V is connected to a lead terminal Vcc which inputs the external power supply voltage EXTVcc, with a metal wire WIREV.

As shown in FIG. 4, a pad A disposed in the main surface of the first semiconductor chip CHIP1 is connected to a drain electrode of the voltage step-down switch part SW in the regulator circuit REG with a metal wiring METALA and works as an internal power supply output pad from which the internal power supply voltage INTVcc is output.

As shown in FIG. 4, a pad B disposed in the main surface of the first semiconductor chip CHIP1 is connected to the voltage dividing part SEP in the regulator circuit REG with a metal wiring METALB and works as a monitor pad inputting an input voltage Vback which is to be compared with a reference voltage Vref to be described below, in the regulator circuit REG.

The voltage dividing part SEP and an input part IN provided in the comparison part REF for inputting the two voltages to be compared are connected to each other with the metal wiring METAL.

As shown in FIG. 4, a pad C disposed in the main surface of the second semiconductor chip CHIP2 is an internal power supply input pad which is connected to the internal circuit CIRC2 with a metal wiring METALC and inputs the internal power supply voltage INTVcc.

The pads A, B, and C are connected to a lead terminal VREG1, which outputs the internal power supply voltage INTVcc, with metal wires WIREA, WIREB, and WIREC, respectively.

As shown in FIG. 4, between the lead terminal VREG1 and the ground GND, is connected a capacitor CAP which is a regulator capacitance for phase compensation and voltage stabilization of the internal power supply voltage INTVcc. Typically, a large capacitance capacitor of a μF-class is often provided for the regulator capacitance capacitor. Therefore, it is better to use an electrolytic capacitor. The capacitor CAP is mounted outside the package PKG, that is, on the circuit substrate together with the package PKG.

As shown in FIG. 4, one or more pads H, which are disposed in the main surface of the first semiconductor chip CHIP1, are connected to the internal circuit CIRC1 with a metal wiring METALH and carry out the signal transmission and reception with the internal circuit CIRC2. Note that the pads H correspond to the signal terminal SIG3 of FIG. 1.

As shown in FIG. 4, one or more pads J, which are disposed in the main surface of the second semiconductor chip CHIP2, are connected to the internal circuit CIRC2 with a metal wiring METALJ and carry out the signal transmission and reception with the internal circuit CIRC1. Note that the pads J correspond to the signal terminal SIG4 of FIG. 1.

The pads H and the pads J are connected with each other with metal wires WIREHJ.

As shown in FIG. 4, one or more pads G, which are disposed in the main surfaces of the first semiconductor chip CHIP1 and the second semiconductor chip CHIP2, are ground pads which are connected to the regulator circuit REG, the internal circuit CIRC1, and the internal circuit CIRC2 with metal wirings METALG, respectively, and are provided with the earth (ground) potential GND.

The pads G are connected to one or more lead terminals Vss provided with the earth (ground) potential GND, with metal wires WIREG, respectively.

Next, operation of the circuit shown in FIG. 4 will be described.

The regulator circuit REG generates the internal power supply voltage INTVcc by stepping down the external power supply voltage EXTVcc.

The internal power supply voltage INTVcc is output from the pad A and input into the pad C of the second semiconductor chip CHIP2 via the lead terminal VREG1.

The internal power supply voltage INTVcc input from the pad C is input into the internal circuit CIRC2 of the second semiconductor chip CHIP2. Thereby, the internal circuit CIRC2, that is, the second semiconductor chip CHIP2 comes to have an operable state.

To the comparison part REF of the regulator circuit REG is input the reference voltage Vref generated in a band gap circuit in which a voltage value change is small against a circumference temperature change.

Figure 6:
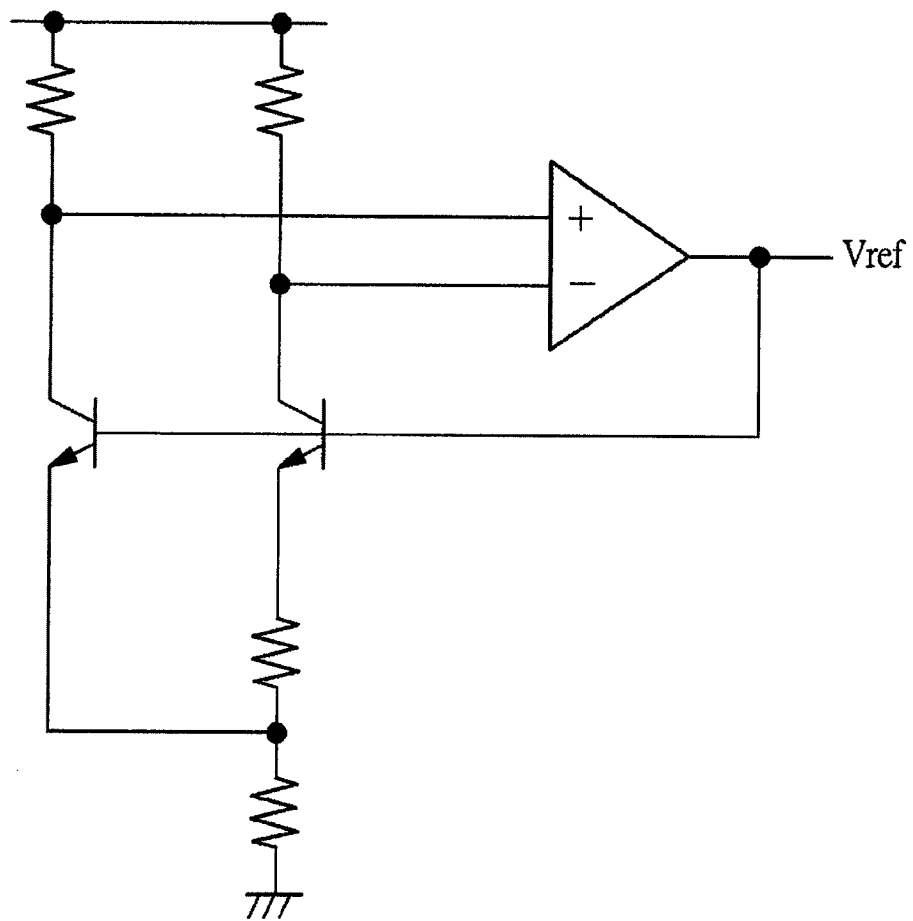
FIG. 6 is a diagram showing an example of a band gap circuit for the semiconductor device in Embodiment 1 of the present invention.

FIG. 6 is a diagram showing an example of the band gap circuit for the semiconductor device in Embodiment 1 of the present invention.

Generally, in a typical circuit, voltage value variation of a voltage is approximately ±3% of a target voltage value. By generating the voltage using the band gap circuit, it is possible to suppress this voltage value variation against temperature change, for example, to approximately ±0.5% of the target voltage value in the temperature range of 0° C. to 60° C.

As shown in FIG. 4, the internal power supply voltage INTVcc returning from the lead terminal VREG1, that is, the input voltage Vback input by the pad B and input into the voltage dividing part SEP which becomes the monitor voltage Vmon divided by the resister 1 and the resister 2 so as to be equal to the voltage value of the reference voltage Vref.

The comparison part REF of the regulator circuit REG adjusts the magnitude of the internal power supply voltage INTVcc by adjusting a voltage provided to a gate of the PMOS transistor PTR3 such that the reference voltage Vref input into the input part IN and the monitor voltage Vmon are equal to each other.

Hereinabove, description has been given for the configuration in which the power supply voltage is supplied from one chip to the other chip and the signal transmission and reception is carried out between the two semiconductor chips in the semiconductor device accommodating the two stacked semiconductor chips in the same package. Among many advantages thereof, examples will be shown as follows. Note that the advantages thereof are not limited to the following advantages.

One example is an advantage in an arrangement relationship among the internal power supply output pad (pad A), and the monitor pad (pad B) of the first semiconductor chip CHIP1, and the internal power supply input pad (pad C) of the stacked second semiconductor chip CHIP2.

Another example is an advantage in a connection method and arrangement of pads performing the signal transmission and reception between the first semiconductor chip CHIP1 and the second semiconductor chip CHIP2.

These advantages will be described in detail as follows by use of a comparative example.

Figure 7:
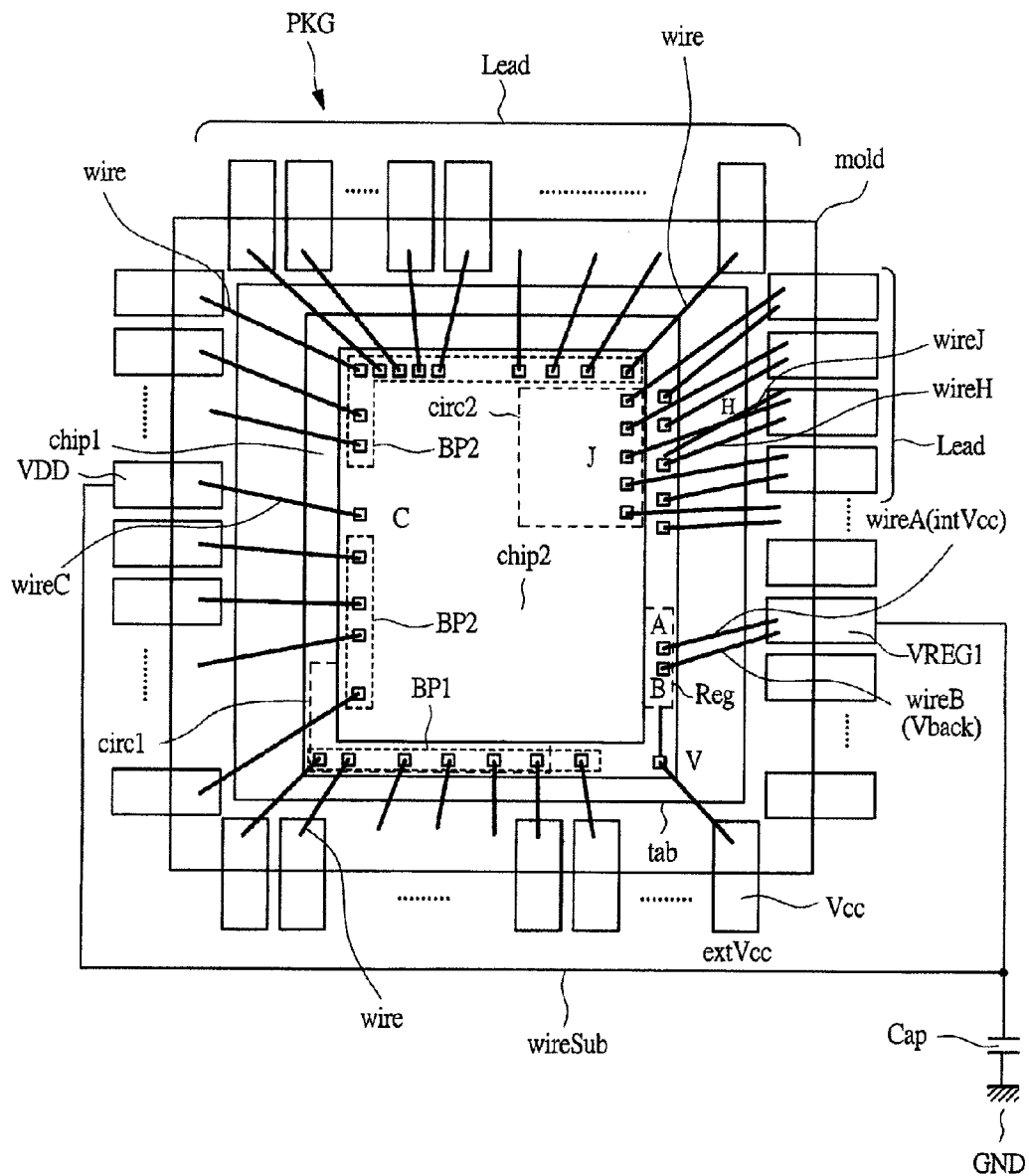
FIG. 7 is a diagram showing details of a comparative example for the plan view of the package structure shown in FIG. 2 for the semiconductor device in Embodiment 1 of the present invention.

FIG. 7 is a diagram showing details of a comparative example for the plan view of the package structure shown in FIG. 2 for the semiconductor device in Embodiment 1 of the present invention.

As shown in FIG. 7, the pad A and pad B are disposed on the main surface of the first semiconductor chip CHIP1 along one side among the four sides; here, along one long side.

Next, the pad C is disposed on the main surface of the second semiconductor chip CHIP2 along a long side of the second semiconductor chip CHIP2, which is opposite to the side along which the pad A and the pad B are disposed.

The pads A and B are commonly connected to the lead terminal VREG1 among the lead terminals LEAD with a metal wire WIREA and a metal wire WIREB, respectively.

Further, the lead terminal VREG1 and a lead terminal VDD are connected to each other with a wiring WIRESUB formed on the circuit substrate by etching of copper (Cu) or the like, and the lead terminal VDD is further connected to the pad C with a metal wire WIREC.

On the other hand, the pad C shown in FIG. 2 for the semiconductor device in Embodiment 1 of the present invention is disposed on the main surface of the second semiconductor chip CHIP2 along a side of the second semiconductor chip CHIP2, which is arranged close and in parallel to the side along which the pad A and the pad B are disposed.

Further, the pads A, B, and C are commonly connected to the lead terminal VREG1 with the metal wires WIREA, WIREB, and WIREC, respectively.

It can be also said that the pads A, B, and C are electrically connected to one another with the metal wires WIREA, WIREB, and WIREC via the lead terminal VREG1.

By stacking the two chips so as to arrange the corresponding sides thereof close and in parallel to each other, by disposing the pads A, B, and C along the corresponding sides arranged close and in parallel to each other in the respective two chips, and by connecting these pads commonly to the lead terminal VREG1 with the metal wires WIRE in this manner, it is possible to make a wiring length shorter than that in the connection by the wiring WIRESUB on the circuit substrate. Since a wiring resistance is made smaller by a shorter wiring length, it is possible to reduce a voltage drop of the internal power supply voltage INTVcc.

Further, in FIG. 2, the number of pins of the package PKG can be reduced, since the lead terminal VDD shown in FIG. 7 is not necessary.

Figure 8:
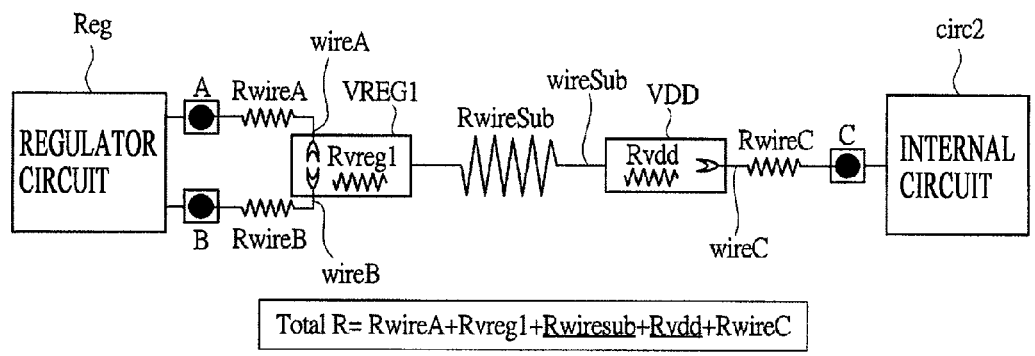
FIG. 8A is a diagram showing details of the equivalent circuit of FIG. 7.
FIG. 8B is a diagram showing details of the equivalent circuit of FIG. 2.
Figure 8:
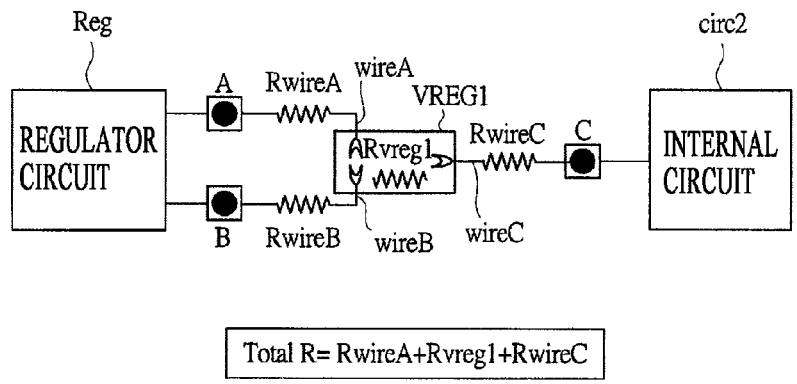

FIGS. 8A and 8B are diagrams showing details of equivalent circuits of FIG. 7 and FIG. 2.

FIG. 8A is a diagram showing details of the equivalent circuit of FIG. 7. FIG. 8B is a diagram showing details of the equivalent circuit of FIG. 2.

As shown in FIG. 8A, the metal wire WIREA connecting the pad A and the lead terminal VREG1 has a wiring resistance $R_{WIREA}$. The metal wire WIREB connecting the pad B and the lead terminal VREG1 has a wiring resistance $R_{WIREB}$. The lead terminal VREG1 has a conductor resistance $R_{VREG1}$. The wiring WIRESUB connecting the lead terminal VREG1 and the lead terminal VDD on the circuit substrate has a wiring resistance $R_{WIRESUB}$. The lead terminal VDD has a conductor resistance $R_{VDD}$. The metal wire WIREC connecting the pad C and the lead terminal VDD has a wiring resistance $R_{WIREC}$.

That is, a total resistance R between the pad A and the pad C in the comparative example shown in FIG. 7 can be expressed as $R=R_{WIREA}+R_{VREG1}+R_{WIRESUB}+R_{VDD}+R_{WIREC}$.

On the other hand, in the semiconductor device shown in FIG. 2 for Embodiment 1 of the present invention, the total resistance R between the pad A and the pad C can be expressed as $R=R_{WIREA}+R_{VREG1}+R_{WIREC}$, as shown in FIG. 8B.

The pad A in the semiconductor device shown in FIG. 2 for Embodiment 1 of the present invention is connected to the pad C via the lead terminal VREG1. Thereby, the semiconductor device shown in FIG. 2 for Embodiment 1 of the present invention does not have the interconnection WIRESUB on the circuit substrate and the connection at the lead terminal VDD, and thereby has a shorter wiring length than the comparative example of FIG. 7. That is, the total resistance can be made smaller by a resistance value of the wiring resistance $R_{WIRESUB}$ of the wiring WIRESUB on the circuit substrate and the conductor resistance $R_{VDD}$ of the lead terminal VDD, in the semiconductor device shown in FIG. 2 for Embodiment 1 of the present invention than in the comparative example of FIG. 7. By reducing the resistance, it is possible to reduce the voltage drop of the internal power supply voltage INTVcc.

Further, it is better to make the metal wire WIREA, in which a higher current flows than in the metal wire WIREB, to have a shorter metal wire length than that of the metal wire WIREB.

Thereby, the wiring resistance $R_{WIREA}$ of the metal wire WIREA becomes smaller and the voltage drop of the internal power supply voltage INTVcc can be reduced.

The next advantage will be described.

As shown in the comparative example of FIG. 7, one or more pads H are disposed in the main surface of the first semiconductor chip CHIP1 along the side along which the pads A and B are disposed.

As shown in FIG. 4, the pads H are connected to the internal circuit CIRC1 of the first semiconductor chip CHIP1 with the metal wiring METALH.

Next, as shown in the comparative example of FIG. 7, one or more pads J are disposed in the main surface of the second semiconductor chip CHIP2 along the side opposite to the side along which the pad C is disposed.

As shown in FIG. 4, the pads J are connected to the internal circuit CIRC2 of the second semiconductor chip CHIP2 with the metal wiring METALJ.

The pads H and the pads J are connected to each other via the corresponding lead terminal LEAD with a metal wire WIREH and a metal wire WIREJ, respectively.

Thereby, the internal circuit CIRC1 of the first semiconductor chip CHIP1 and the internal circuit CIRC2 of the second semiconductor chip CHIP2 can carry out the signal transmission and reception with each other.

Compared with the comparative example of FIG. 7, in the semiconductor device shown in FIG. 2 for Embodiment 1 of the present invention, the pads H are disposed on the main surface of the first semiconductor chip CHIP1 along a different side from the side along which the pads A and B are disposed. Here, the pads H are disposed along a side intersecting the side along which the pads A and B are disposed.

Further, the pads J are disposed on the main surface of the second semiconductor chip CHIP2 also along a different side from the side along which the pad C is disposed, and the side along which these pads J are disposed is arranged close and in parallel to the side along which the above pads H are disposed.

Further, the pads H and the pads J are connected to each other with metal wires WIREHJ directly between the chips. This direct connection between the chips is formed by a wire bonding method or the like. It is better to make the metal wires WIREHJ to have a metal wire length shorter than that of the metal wire WIREA. Thereby, it is possible to reduce signal deterioration and signal delay.

Note that a higher current flows in the metal wire WIREA than in the metal wire WIREB, and thereby it is better to make the metal wire WIREA to have a metal wire length shorter than that of the metal wire WIREB. From the above reasons, relationships among the metal wire lengths are expressed as metal wire WIREHJ<metal wire WIREA<metal wire WIREB.

As shown in FIG. 2, by connecting the pads H and the pads J directly between the chips, it is possible to make the wiring length shorter than that in the connection via the lead as shown in the comparative example of FIG. 7. By the shorter wiring length, it is possible to reduce the deterioration and the delay of the signal transmitted and received between the internal circuit CIRC1 and the internal circuit CIRC2, compared to the case of the connection via the lead terminal LEAD as shown in FIG. 7.

Further, by connecting the pads H and the pads J directly between the chips, it is possible to reduce the number of pins of the package PKG, since the lead terminal LEAD used for the connection becomes unnecessary. Moreover, it is possible to minimize influence of a noise from the outside of the package PKG to the signal line.

In the semiconductor device shown in FIG. 2 for Embodiment 1 of the present invention, a signal area SIGAREA including the pads H and the pads J and a power supply area POWAREA including the pad A, the pad B, the pad C, and the lead terminal VREG1 are disposed along sides different from each other. The reason will be described.

Figure 9:
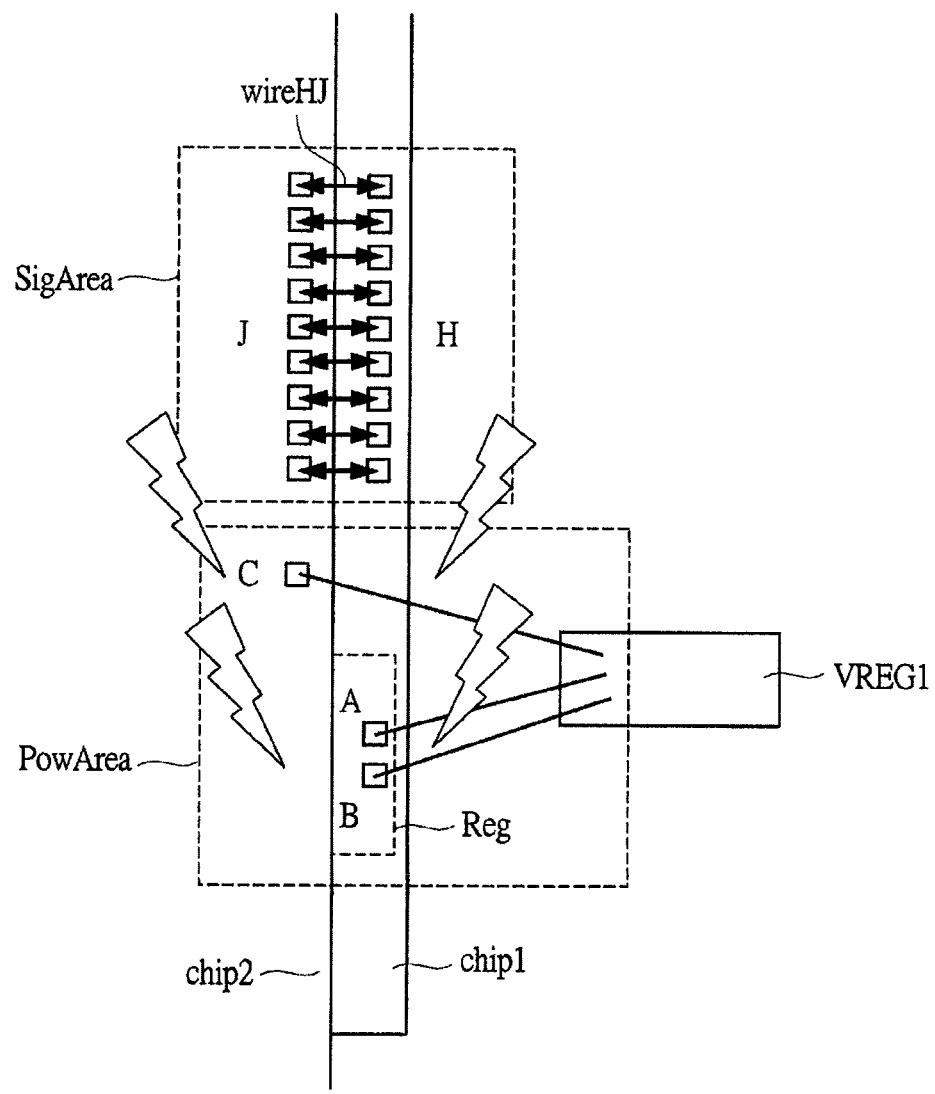
FIG. 9 is a diagram showing details of a case that a signal area and a power supply area are arranged along the same side.

FIG. 9 is a diagram showing details of a case that the signal area SIGAREA and the power supply area POWAREA are disposed along the same side.

As shown in FIG. 9, in the case that the signal area SIGAREA and the power supply area POWAREA are disposed in a line, when the internal circuit CIRC1 and the internal circuit CIRC2 carry out the signal transmission and reception via the metal wires WIREHJ, the metal wires WIRE form loops in the signal area SIGAREA and the power supply area POWAREA, respectively, to work as antennas, and thereby the signal area SIGAREA sometimes provides a noise to the power supply area POWAREA. Such a noise is often a high frequency noise generated from a signal such as one having a frequency exceeding several hundred MHz. In particular, the power supply area POWAREA has three metal wires and is easily affected by the noise.

Therefore, as shown in FIG. 2, by disposing the signal area SIGAREA and the power supply area POWAREA not in a line but along the sides different from each other (here, perpendicular to each other), it is possible to reduce the influence of the noise which the power area POWAREA receives from the signal area SIGAREA.

Figure 10:
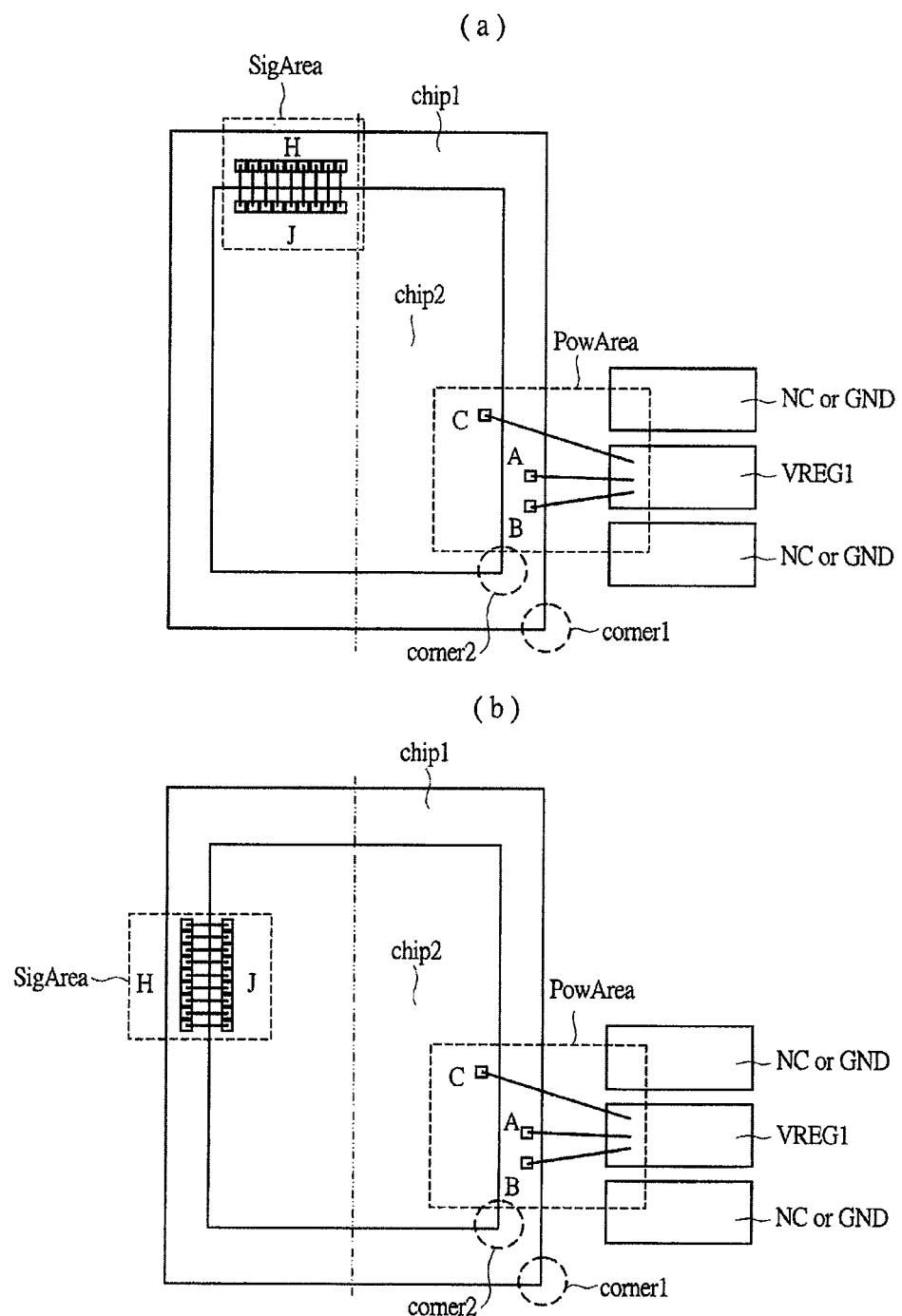
FIG. 10A is a diagram showing details of an example in which the signal area is disposed along a side intersecting a side along which the power supply area is disposed.
FIG. 10B is a diagram showing details of an example in which the signal area is disposed along a side opposite to a side along which the power supply area is disposed.

FIGS. 10A and 10B are diagrams showing details of an example in which the signal area SIGAREA is disposed along a side different from a side along which the power supply area POWAREA is disposed.

FIG. 10A is a diagram showing details of an example in which the signal area SIGAREA is disposed along a side intersecting a side along which the power supply area POWAREA is disposed. FIG. 10B is a diagram showing details of an example in which the signal area SIGAREA is disposed along a side opposite to a side along which the power supply area POWAREA is disposed.

In FIG. 10A, as in FIG. 2, the signal area SIGAREA is disposed along the side intersecting the side along which the power supply area POWAREA is disposed. Further, unlike in FIG. 2, the signal area SIGAREA is disposed closer to the opposite side along which the power supply area POWAREA is not disposed than to the side along which the power supply area POWAREA is disposed.

In FIG. 10B, the signal area SIGAREA is disposed along the side opposite to the side along which the power supply area POWAREA is disposed. In other words, the power supply area POWAREA and the signal area SIGAREA are disposed so as to sandwich the second semiconductor chip CHIP2.

In this manner, in both of FIGS. 10A and 10B, the signal area SIGAREA is disposed along a side different from the side along which the power supply area POWAREA is disposed. Thereby, the power supply area POWAREA and the signal area SIGAREA are not arranged in a line and it is possible to reduce the noise which the power supply area POWAREA receives from the signal area SIGAREA. This layout method of the signal area SIGAREA is effective for noise reduction in a limited space of the package.

Figure 11:
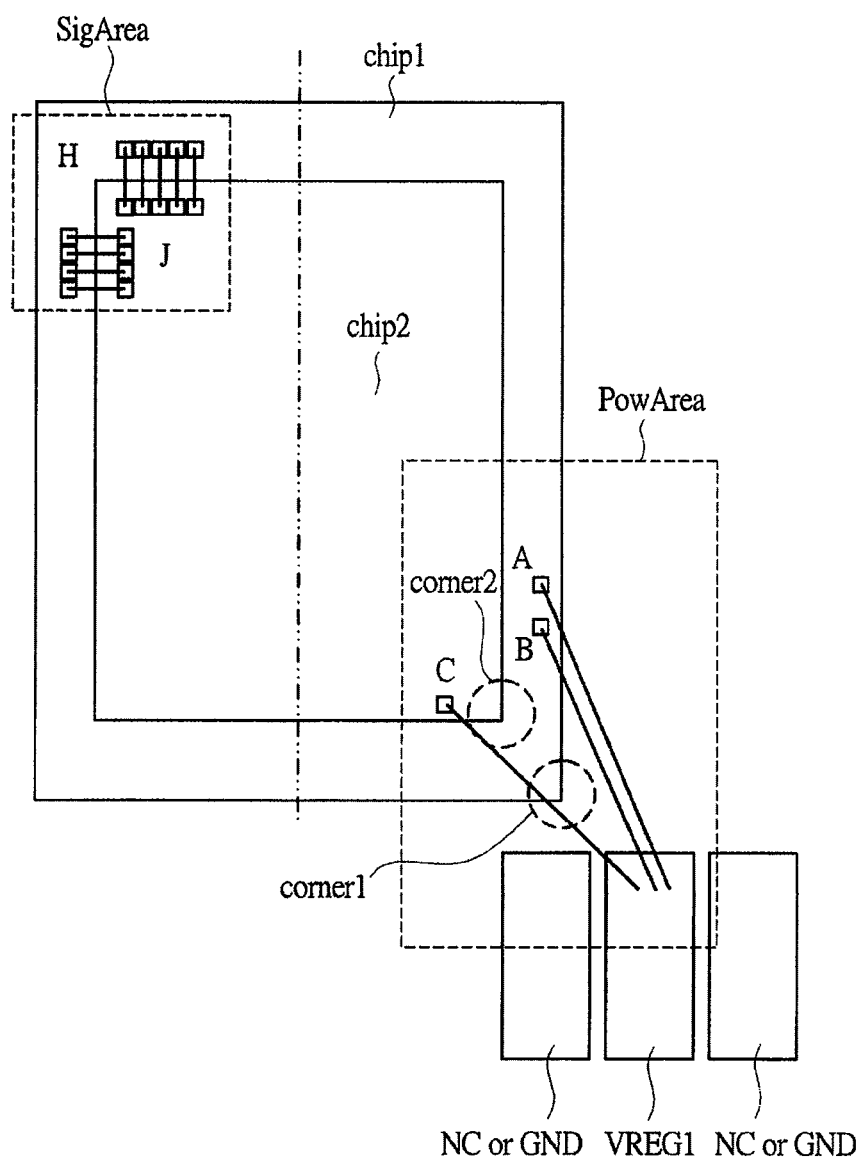
FIG. 11 is a diagram showing details of an example different from that of FIGS. 10A and 10B, in which a signal area is disposed along a side different from a side along which a power supply area is disposed.

FIG. 11 is a diagram showing details of an example different from that of FIGS. 10A and 10B, in which the signal area SIGAREA is disposed along a side different from the side along which the power supply area POWAREA is disposed.

A difference between FIG. 11 and FIGS. 10A and 10B is that the pad C is disposed not along the side along which the pads A and B are disposed but along the side intersecting the side along which the pads A and B are disposed. In this manner, the power supply area POWAREA may be disposed across the two sides.

On the other hand, the signal area SIGAREA is disposed by use of the two sides on the opposite corner side, along which the power supply area POWAREA is not disposed. In other words, the power supply area POWAREA and the signal area SIGAREA are disposed in a diagonal direction so as to sandwich the second semiconductor chip CHIP2.

Also in the arrangement as shown in FIG. 11, the power supply area POWAREA is not disposed in a line with the signal area SIGAREA as in FIGS. 10A and 10B, and thereby can reduce the noise received from the signal area SIGAREA.

Note that the arrangement of the pads A, B and C and the arrangement of the pads H and the pads J, in FIGS. 10A and 10B and FIG. 11, are summarized in the following expression.

The first semiconductor chip CHIP1 has four corners, and, when one of the corners is denoted by CORNER1, the pad A and the pad B are disposed closer to the corner CORNER1 among the four corners.

Next, the second semiconductor chip CHIP2 also has four corners, and when one of the four corners is denoted by CORNER2, the second semiconductor chip CHIP2 is stacked on the main surface of the first semiconductor chip CHIP1 such that the corner CORNER2 is closer to the corner CORNER1 than to the other corners of the first semiconductor chip CHIP1. Further, the pad C is disposed so as to be closer to the corner CORNER2 among the four corners.

Next, the pads H are disposed along aside different from a side forming the first corner, and the pads J are disposed along the side close and in parallel to the side along which the pads H are disposed.

Note that it is better to allot terminals on the both sides of lead terminal VREG1, shown in FIGS. 10A and 10B and FIG. 11, to a noncontact NC or the earth (ground) potential GND than to allot the terminals for the signal or a clock. Thereby, a noise provided to the internal power supply voltage INTVcc can be reduced.

Next, description will be given for the influence which the signal transmission and reception between the internal circuits in the signal area SIGAREA provides to the regulator circuit REG in the power supply area POWAREA, and for a reduction method of the influence.

Figure 12:
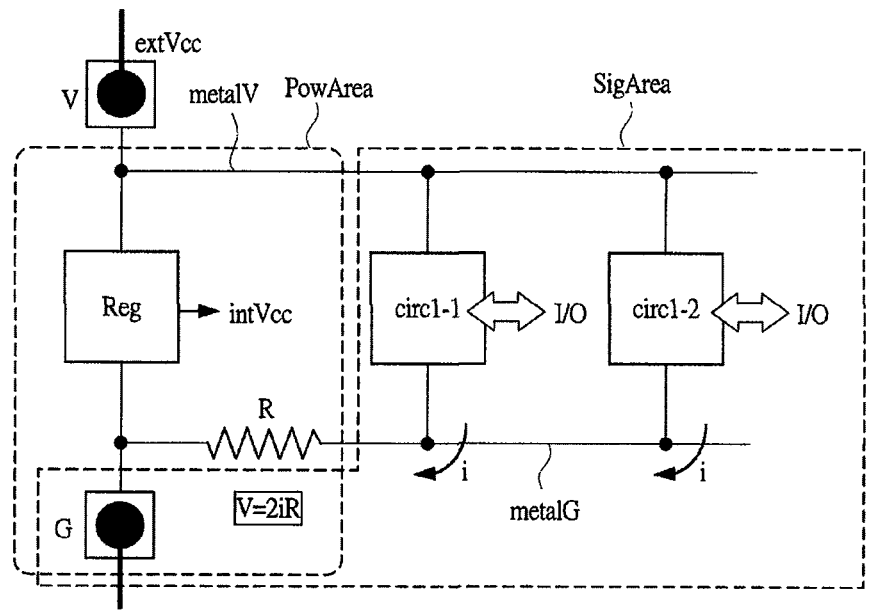
FIG. 12A is a diagram showing that all of the regulator circuit, first internal circuit 1, and first internal circuit 2 are connected commonly to pads through metal wirings.
FIG. 12B is a diagram showing that a pad connected with the regulator circuit through a metal wiring and a pad connected with the first internal circuit 1 and the first internal circuit 2 through a metal wiring are provided separately.
Figure 12:
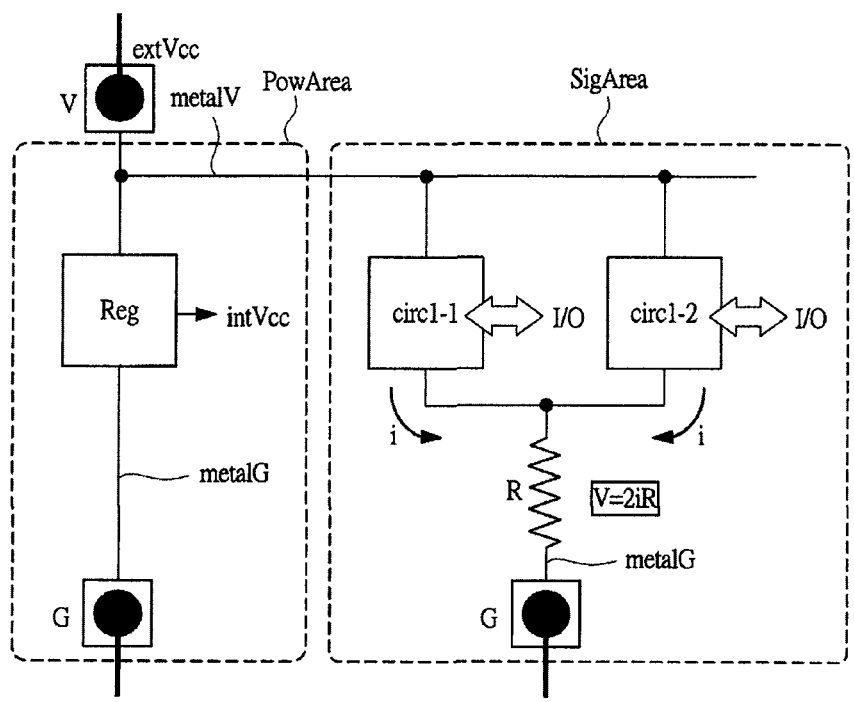

FIGS. 12A and 12B are diagrams showing details of a configuration such that each of the regulator circuit REG, the internal circuit CIRC1-1, and the internal circuit CIRC1-2 is connected to a metal wiring METALV and a metal wiring METALG. The internal circuit CIRC1-1 and the internal circuit CIRC1-2 mean that the internal circuit CIRC1 shown in FIG. 1 is provided in the plural number.

FIG. 12A is a diagram showing that the regulator circuit REG, the internal circuit CIRC1-1, and the internal circuit CIRC1-2 are connected commonly to a pad G. FIG. 12B is a diagram showing that the pad G connected with the regulator circuit REG and the pad G connected with the internal circuit CIRC1-1 and the internal circuit CIRC1-2 are provided separately.

As shown in FIG. 12A, the regulator circuit REG, the internal circuit CIRC1-1, and the internal circuit CIRC1-2 are connected to a pad V, which is supplied with the external power supply voltage EXTVcc from the outside of the package PKG, with the metal wiring METALV.

Further, the regulator circuit REG, the internal circuit CIRC1-1, and the internal circuit CIRC1-2 are connected to the pad G which are supplied with the earth (ground) potential GND from the outside of the package PKG, with the metal wiring METALG.

When the internal circuit CIRC1-1, and the internal circuit CIRC1-2 carry out the signal transmission and reception with the internal circuit CIRC2, a current I flows into the metal wiring G from the respective circuits. The metal wiring METALG has a wiring resistance R and, when the current flows here from the two circuits, a voltage of 2IR (=V) is generated.

At this time, the potential of the ground GND is sometimes floated by the generated 2IR (=V) (ground shift generation). Further the potential of the ground GND in the regulator circuit REG, which is connected to the same pad G, is also floated and thereby the operation thereof sometimes becomes unstable.

For avoiding such an unstable operation of the regulator circuit REG, it is better to separate the pad G connected with the regulator circuit REG and the pad G connected with the internal circuit CIRC1-1 and the internal circuit CIRC1-2, as shown in FIG. 12B.

That is, it is better to separately provide the pad G of the power supply area POWAREA and the pad G of the signal area SIGAREA.

By providing the pads G separately, the current does not flow in the ground GND of the regulator circuit REG and the potential of the ground GND is not floated, resulting in prevention of the operation of the regulator circuit REG from becoming unstable, when the internal circuit CIRC1-1 and the internal circuit CIRC1-2 carry out the signal transmission and reception with the internal circuit CIRC2.

Hereinabove, some advantages have been described for the semiconductor device in Embodiment 1.

One example of the main advantages is that two chips are stacked so as to dispose the pads A, B and C along the corresponding sides arranged close and in parallel to each other and these pads are connected commonly with metal wires WIREA, WIREB, and WIREC, respectively.

Thereby, the wiring length can be made shorter than that in the connection by the wiring on the circuit substrate, and the internal power supply voltage INTVcc comes to have less influence from the voltage drop by the wiring resistance.

Another example is that the pads H and the pads J are disposed along the sides different from the sides along which the pads A, B and C are disposed, and further are connected with the metal wires WIREHJ by direct bonding between the chips.

Thereby, the wiring length is made shorter than that in the connection via the lead terminal LEAD and the signal deterioration can be reduced. Further, since the power supply area POWAREA and the signal area SIGAREA are disposed along the different sides and are not arranged in a line, the power supply area POWAREA can be made less likely to receive noise from the signal area SIGAREA.

Note that, while the plurality of advantages have been described for Embodiment 1, the embodiment does not always need to have all the advantages but also may have one of these advantages or a combination of the advantages. This also applies to embodiments to be described hereinbelow.

Embodiment 2

Figure 13:
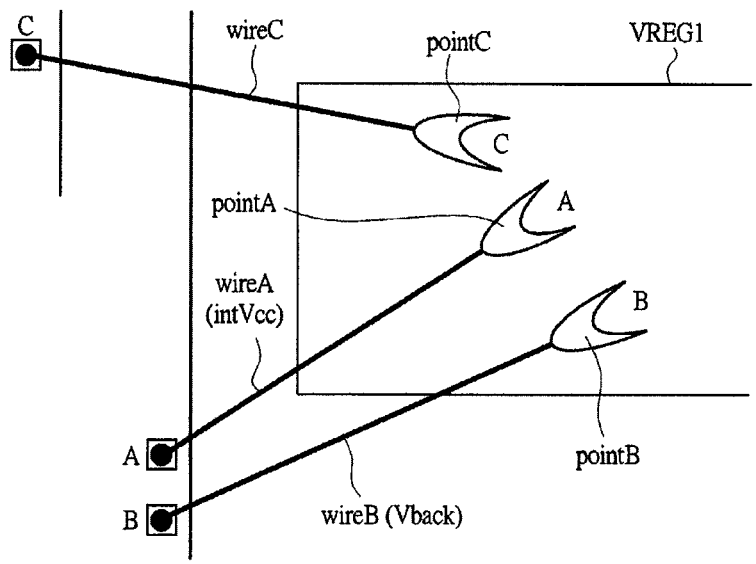
FIG. 13A is an enlarged view of connection parts showing a state that a third contact point between the third metal wire and the lead terminal is located closer to a first contact point of the first metal wire than to a second contact point of the second metal wire in Embodiment 2 of the present invention.
FIG. 13B is an enlarged view of connection parts showing a state that the third contact point between the third metal wire and the lead terminal is located between the first contact point and the second contact point in Embodiment 2 of the present invention.
Figure 13:
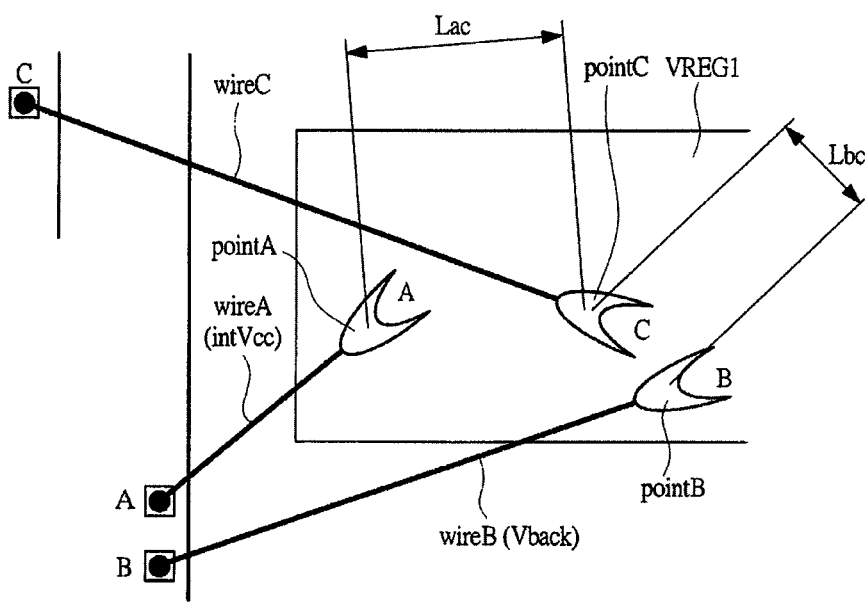

FIGS. 13A and 13B are enlarged views of connection parts between the lead terminal VREG1 and the metal wires WIREA, WIREB, and WIREC in a semiconductor device of Embodiment 2 in the present invention.

FIG. 13A is a diagram showing a state that a contact point POINTC between the metal wire and the lead terminal is located at a position closer to a contact point POINTA than a contact point POINTB. FIG. 13B is a diagram showing a state that the contact point POINTC between the metal wire and the lead terminal is located between the contact point POINTA and the contact point POINTB.

As shown in FIG. 13A, the pad A, which is the internal power supply output pad, and the lead terminal VREG1 are connected to each other with the metal wire WIREA. The connection part of this metal wire WIREA and the lead terminal REG1 is assumed to be the contact point POINTA.

The pad B, which is the monitor pad, and the lead terminal VREG1 are connected to each other with the metal wire WIREB. The connection part of this metal wire WIREB and the lead terminal VREG1 is assumed to be the contact point POINTB.

The pad C, which is the internal power supply input pad, and the lead terminal VREG1 are connected to each other with the metal wire WIREC. The connection part of this metal wire WIREC and the lead terminal VREG1 is assumed to be the contact point POINTC.

The internal power supply voltage INTVcc, which is output from the pad A and input into the lead terminal VREG1 through the metal wire WIREA and the contact point POINTA, is input into the pad C from the contact point POINTC through the metal wire WIREC.

At this time, since the contact point POINTB is closer to the contact point POINTA than the contact point POINTC, the input voltage Vback is taken out from the neighborhood of the contact point POINTA.

Differently from FIG. 13A, FIG. 13B shows the state that the contact point POINTC is provided between the contact point POINTA and the contact point POINTB.

By providing the contact point POINC between the contact point POINTA and the contact point POINTB, the contact point POINTB can take out the input voltage Vback from the neighborhood of the contact point POINTC.

By taking out the input voltage Vback not from the neighborhood of the contact point POINTA but from the neighborhood of the contact point POINTC in this manner, it is possible to take out the input voltage Vback from the position closer to the pad C. The internal power supply voltage INTVcc has a gradual voltage drop caused by the influence of the wiring resistance and the like in the wiring path to the input at the pad C. Therefore, it is effective to take out the input voltage Vback at the position close to the pad C for obtaining a highly accurate voltage.

Further, for improving the accuracy, it is better to make the contact point POINTC closer to the contact point POINTB. That is, it is better to make a distance Lbc from the contact point POINTB to the contact point POINTC shorter than a distance Lac from the contact point POINTA to the contact point POINTC. The highly accurate voltage can be obtained for the same reason as the above.

Embodiment 3

Figure 14:
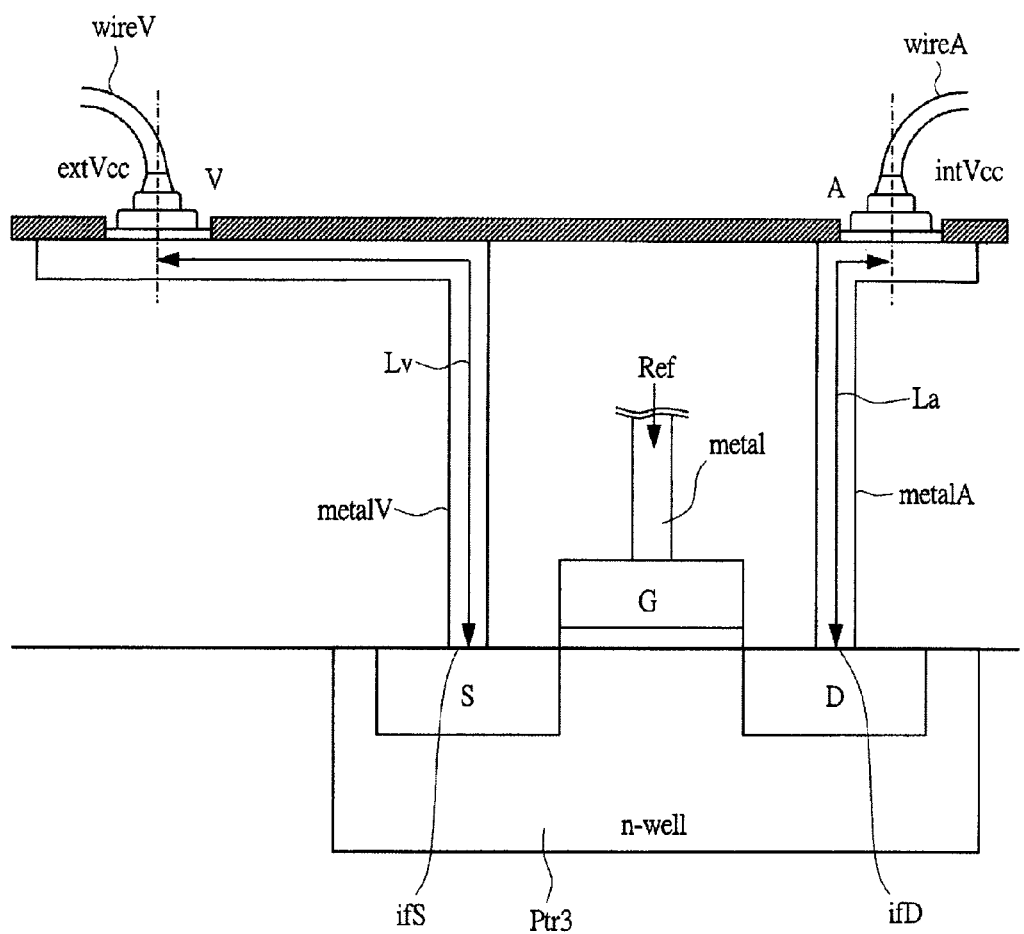
FIG. 14 is a diagram showing details of a cross-section of a PMOS transistor and the surrounding part thereof in a voltage step-down switch part for a semiconductor device in Embodiment 3 of the present invention.

FIG. 14 is a diagram showing details of a cross-section for the PMOS transistor PTR3 and the surrounding part thereof in the voltage step-down switch part SW of the semiconductor device in Embodiment 3 of the present invention.

As shown in FIG. 14, the pad V, into which the external power supply voltage EXTVcc is input, is connected to a contact part IFS of a source electrode in the PMOS transistor PTR3 with a metal wiring METALV.

Further, the pad A, to which the internal power supply voltage INTVcc is output, is connected to a contact part IFD of a drain electrode of the PMOS transistor PTR3 with a metal wiring METALA.

For example, in a case such as one that the external power supply voltage EXTVcc having a voltage value of 4 to 25 V is stepped down to an internal power supply voltage INTVcc of 1.4 to 3.6 V, the voltage drop by the wiring resistance of the metal wiring METALV shown in FIG. 4 often may not be considered so seriously with respect to the stable operation of the semiconductor device.

Note that the voltage drop, which is caused by the wiring resistance of the metal wiring METALV shown in FIG. 4, sometimes, however, causes a problem of inviting unstable operation of the internal circuit CIRC2 in the case that the internal power supply voltage INTVcc has a low voltage value of 1.4 to 3.6 V.

From such a reason, it is better to make a length La shown in FIG. 14 from the pad A to the contact part IFD of the drain electrode shorter than a length Lv from the pad V to the contact part IFS of the source electrode.

By making the distance shorter, it is possible to reduce the influence of the wiring resistance on the internal power supply voltage INTVcc.

Further, it is better to make the wiring width of the metal interconnection METALA wider than the width of the metal wiring (gate wiring) METAL.

By making the wiring width wider, it is possible to reduce the wiring resistance.

Figure 15:
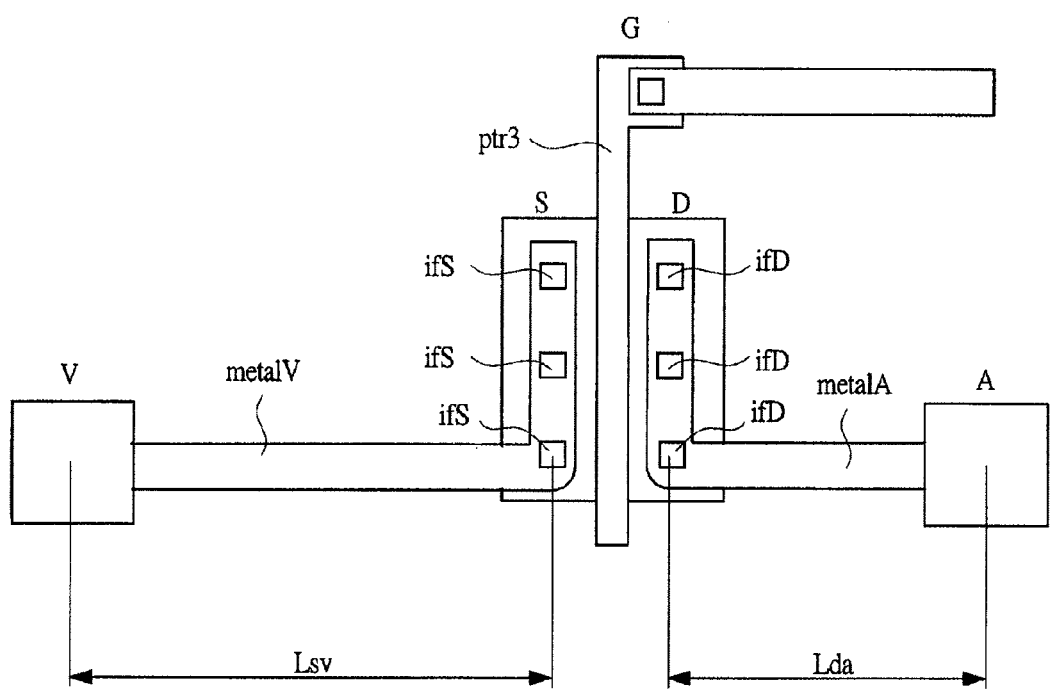
FIG. 15 is a diagram showing details of a layout of the PMOS transistor and the surrounding part thereof in the voltage step-down switch part for the semiconductor device in Embodiment 3 of the present invention.

FIG. 15 is a diagram showing details of a layout for the PMOS transistor PTR3 and the surrounding part thereof in the voltage step-down switch part SW for the semiconductor device in Embodiment 3 of the present invention.

In the case that it is difficult to compare the above length La from the pad A to the contact part IFD of the drain electrode and the length Lv from the pad V to the contact part IFS of the source electrode, horizontal distances between the contact parts and the pads sometimes may be compared with each other instead, for the reason that there is not a big difference qualitatively.

That is, it is better to dispose each of the pads A and V such that a horizontal distance Lda shown in FIG. 15 from the pad A to the contact part IFD of the drain electrode is shorter than a horizontal distance Lsv from the pad V to the contact part IFS of the source electrode.

Further, for making the horizontal distance Lda shorter than the horizontal distance Lsv, it is better to dispose the regulator circuit REG closer to the side along which the pad A and the pad C are disposed than to the side along which the pad A and the pad C are not disposed.

Embodiment 4

Figure 16:
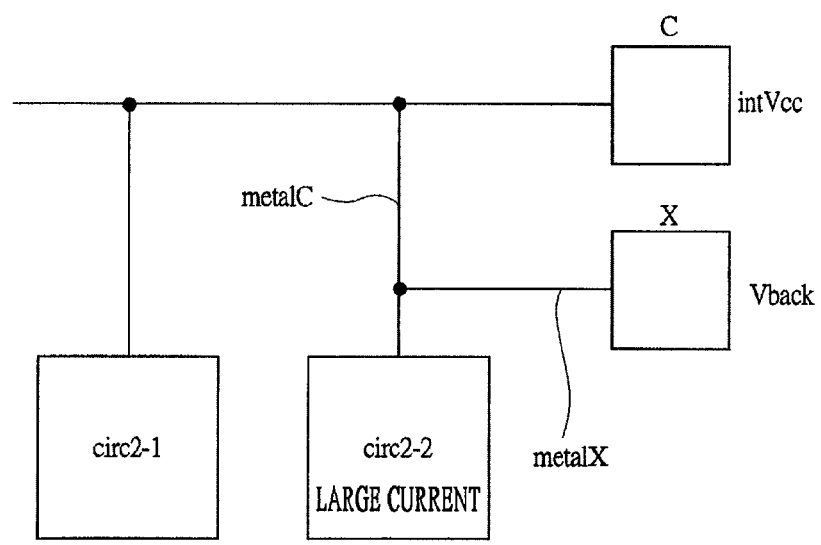
FIG. 16A is a diagram showing that a second internal circuit 1 and a second internal circuit 2 are connected to a pad and a pad X is connected between the pad and the second internal circuit 2 in a semiconductor device in Embodiment 4 of the present invention.
FIG. 16B is a diagram showing that the second internal circuit 1, the second internal circuit 2, a second internal circuit 3, and a second internal circuit 4 are connected commonly to the pad in the semiconductor device in Embodiment 4 of the present invention.
Figure 16:
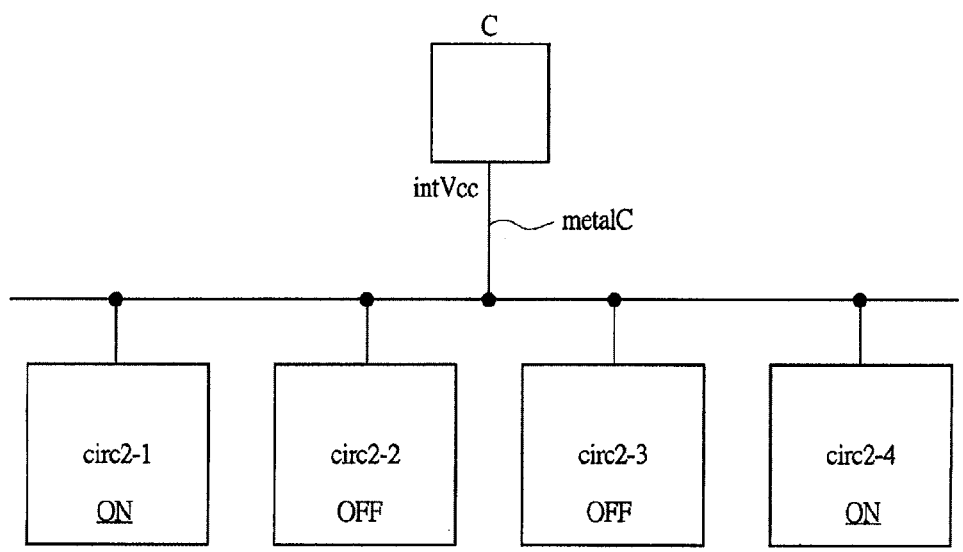

FIGS. 16A and 16B are diagrams showing that the pad C and the plurality of internal circuits CIRC2 are connected to each other in a semiconductor device of Embodiment 4 in the present invention.

FIG. 16A is a diagram showing that the pad C is connected with an internal circuit CIRC2-1 and an internal circuit CIRC2-2 and a pad X is connected between the pad C and the internal circuit CIRC2-2. FIG. 16B is a diagram showing that the pad C is connected commonly with the internal circuit CIRC2-1, the internal circuit CIRC2-2, an internal circuit CIRC2-3, and an internal circuit CIRC2-4. The internal circuit CIRC2-1, the internal circuit CIRC2-2, the internal circuit CIRC2-3, and the internal circuit CIRC2-4 mean that the internal circuit CIRC2 shown in FIG. 1 is provided as a plurality.

As shown in FIG. 16A, the internal circuit CIRC2-2 is a circuit in which a higher current flows than in the other circuit such as a CPU, when compared with the internal circuit CIRC2-1. For accurately grasping the voltage input into the internal circuit CIRC2-2 in which such a high current flows, it is better to connect the pad X to the metal wiring METALC, which connects the pad C and the internal circuit CIRC2-2, with a metal wiring METALX.

By connecting the pad X with the metal wiring METALX in this manner and taking out the input voltage Vback to be returned to the regulator circuit REG from the pad X, it is possible to take out a more highly accurate voltage than that taken out at the lead terminal VREG1 shown in FIG. 4.

Note that, at this time, it is better to connect the pad B of the first semiconductor chip CHIP1 shown in FIG. 4 not to the lead terminal VREG1 but to the pad X shown in FIG. 16A using the metal wire WIREB.

However, the individual monitoring by connecting the above pad X to each of the circuits requires many pads and is difficult to realize, in the case that the internal circuit CIRC2 exists in the plural number and comes to have a state such as one that circuits with power turned on and turned off are mixed during the operation of the second semiconductor chip CHIP2.

In such a case, as shown in FIG. 16B, it is better to cause the metal wiring METALC to branch from the pad C and connect the branches to the internal circuit CIRC2-1, the internal circuit CIRC2-2, the internal circuit CIRC2-3, and the internal circuit CIRC2-4, respectively.

Thereby, the pad B, which monitors the voltage of the pad C via the lead terminal VREG1, can monitor at least the whole voltage input into the internal circuit CIRC2, even when the circuits turned on and turned off are mixed.

Embodiment 5

Figure 17:
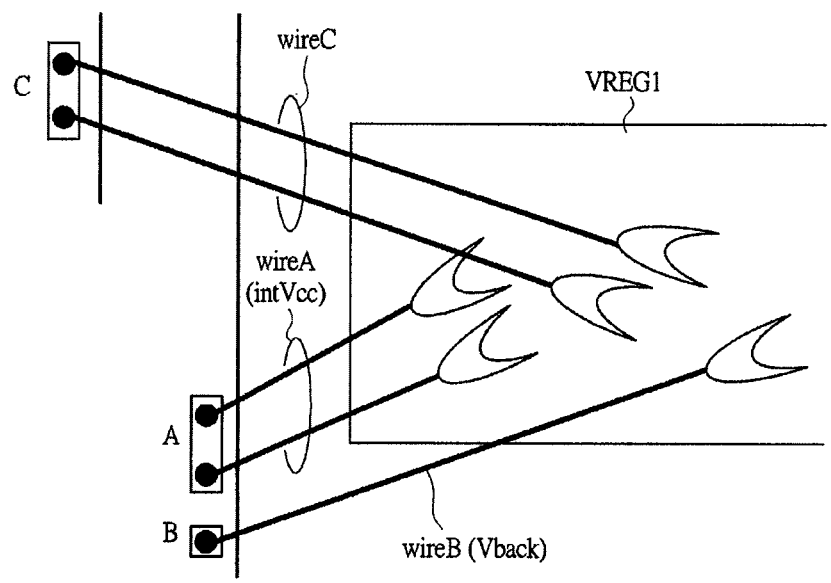
FIG. 17A is an enlarged view of connection parts of a lead terminal with a first metal wire, a second metal wire and a third metal wire for a semiconductor device in Embodiment 5 of the present invention, showing a state that a first pad and a third pad are connected to a lead terminal with a plurality of first metal wires and a plurality of third metal wires, respectively.
FIG. 17B is an enlarged view of connection parts of a lead terminal with a first metal wire, a second metal wire and a third metal wire for the semiconductor device in Embodiment 5 of the present invention, showing a state that a plurality of first pads and a third pad are connected to a lead terminal with a plurality of first metal wires and a third metal wire, respectively.
Figure 17:
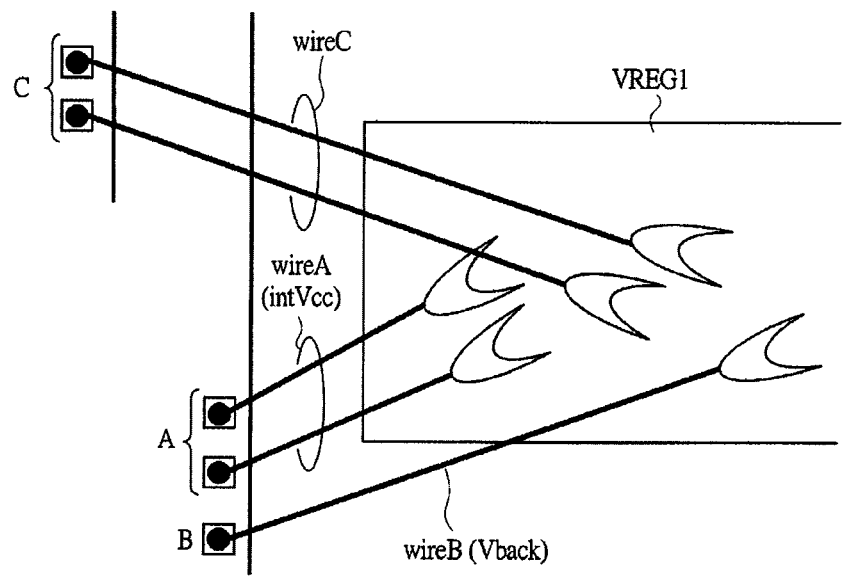

FIGS. 17A and 17B are enlarged views of the connection parts between the lead terminal VREG1 and the metal wires WIREA, WIREB, and WIREC for the semiconductor device in Embodiment 5 of the present invention.

FIG. 17A is a diagram showing a state that the pad A and the pad C are connected to the lead terminal VREG1 with the plurality of metal wires WIREA and the plurality of metal wires WIREC, respectively. FIG. 17B is a diagram showing a state that a plurality of pads A and pad C are connected to the lead terminal VREG1 with the plurality of metal wires WIREA and the plurality of metal wires WIREC, respectively.

As shown in FIG. 17A, it is better to arrange the pad A and the pad C so as to make the pad areas thereof large enough to allow a plurality of metal wires to be connected, respectively, and to provide the metal wire WIREA connecting the pad A and the lead terminal VREG1 and the metal wire WIREC connecting the pad C and the lead terminal VREG1 in plural numbers, respectively.

By providing the metal wire WIREA and the metal wire WIREC in plural numbers, it is possible to reduce the wiring resistances between the two pads (pad A and pad C) and the lead terminal VREG1 and to reduce the voltage drop of the internal power supply voltage INTVcc.

Further, as shown in FIG. 17B, the metal wire WIREA and the metal wire WIREC may be provided in plural numbers by use of a plurality of pads A and a plurality of pads C.

Also in this case, it is possible to reduce the wiring resistances between the two pads (pad A and pad C) and the lead terminal VREG1 and to reduce the voltage drop of the internal power supply voltage INTVcc.

Embodiment 6

Figure 18:
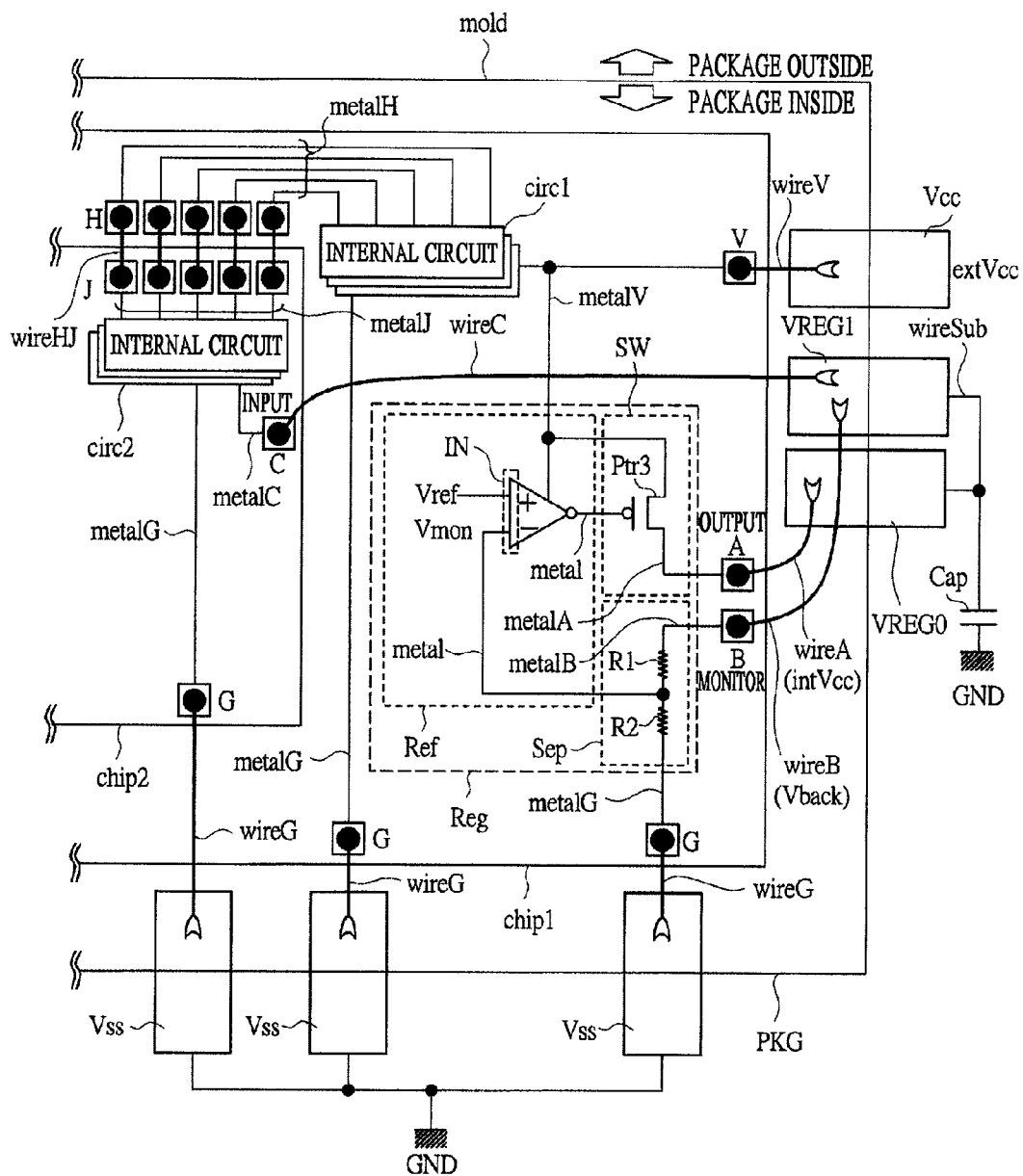
FIG. 18 is a diagram showing details of a regulator circuit and the surrounding part thereof for a semiconductor device in Embodiment 6 of the present invention.

FIG. 18 is a diagram showing details of a regulator circuit and the surrounding part thereof for a semiconductor device in Embodiment 6 of the present invention.

As shown in FIG. 18, a main difference of the semiconductor device in Embodiment 6 of the present invention from that in Embodiment 1 is that the metal wire WIREA is connected to a lead terminal VREG0 which is different from the lead terminal VREG1.

Note that the lead terminal VREG1 and the different lead terminal VREG0 are connected with each other with a wiring WIRESUB on the circuit substrate where the package is mounted.

In the case that the width of the lead terminal is narrow, or in a case such as one that a bonding apparatus or the like to be used does not have a sufficient performance to connect all of the metal wires WIREA, WIREB, and WIREC to the lead terminal VREG1 in a lump, the connection may be carried out using two separated terminals as shown in FIG. 18, if an additional terminal is available.

By connecting these two lead terminals outside the package PKG, it is possible to obtain a similar effect as that in the semiconductor device of Embodiment 1.

Embodiment 7

Figure 19:
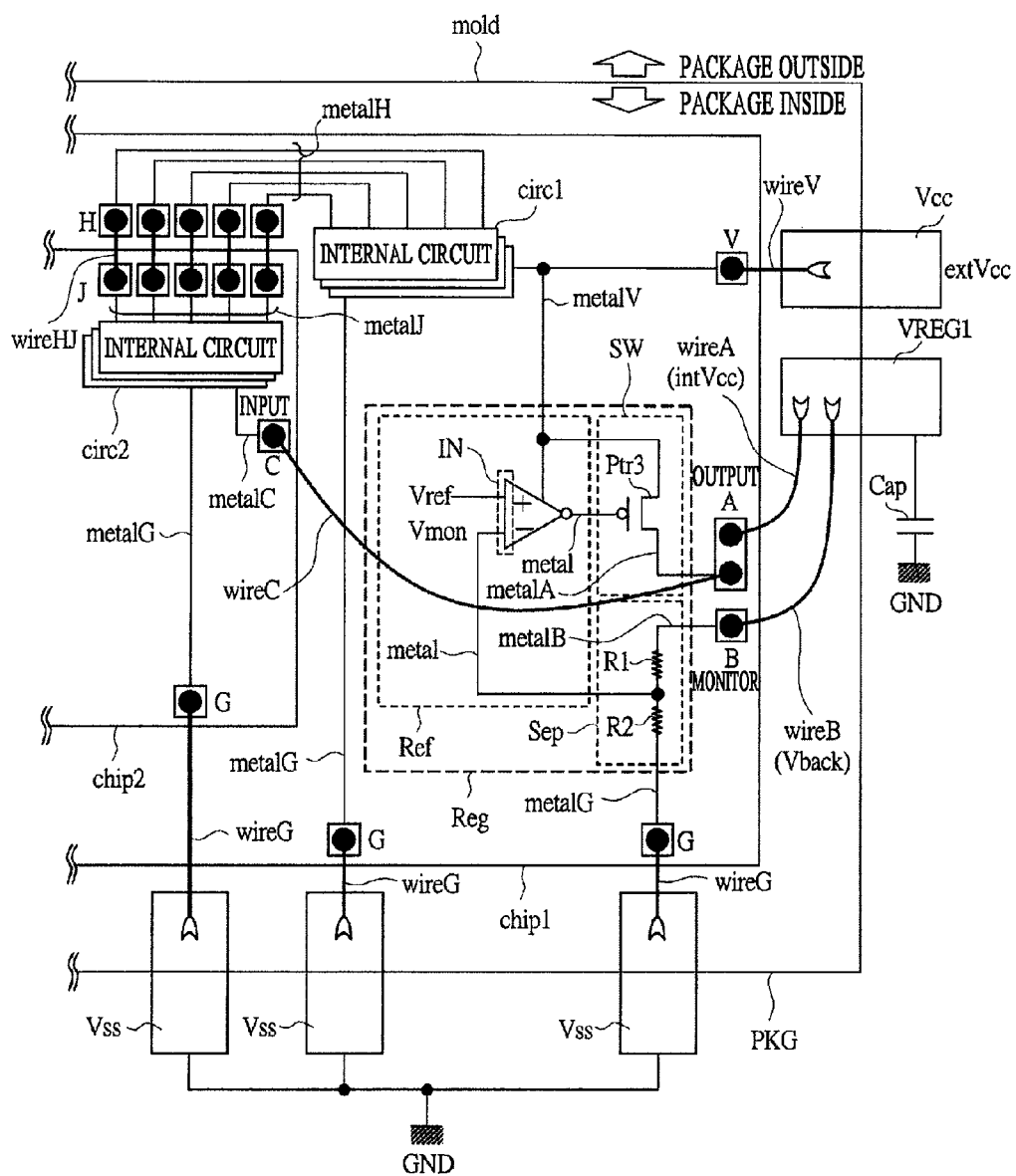
FIG. 19 is a diagram showing details of a regulator circuit and the surrounding part thereof for a semiconductor device in Embodiment 7 of the present invention.

FIG. 19 is a diagram showing details of a regulator circuit and the surrounding part thereof for a semiconductor device in Embodiment 7 of the present invention.

As shown in FIG. 19, a main difference of the semiconductor device in Embodiment 7 of the present invention from that in Embodiment 1 is that the metal wire WIREC is connected not to the lead terminal VREG1 but to the pad A which is the internal power supply output pad.

By the connection of the metal wire METALC to the pad A, the wiring length is reduced by a length which is eliminated by a route without passing through the lead terminal VREG1. Thereby, the internal power supply voltage INTVcc can be input into the pad C having a smaller voltage drop than that in the semiconductor device of Embodiment 1.

Note that, since the pad C and the lead terminal VREG1 are not connected, the voltage which can be monitored from the outside of the package PKG via the lead terminal VREG1 is not the voltage of the pad C but the voltage of the pad A.

Embodiment 8

Figure 20:
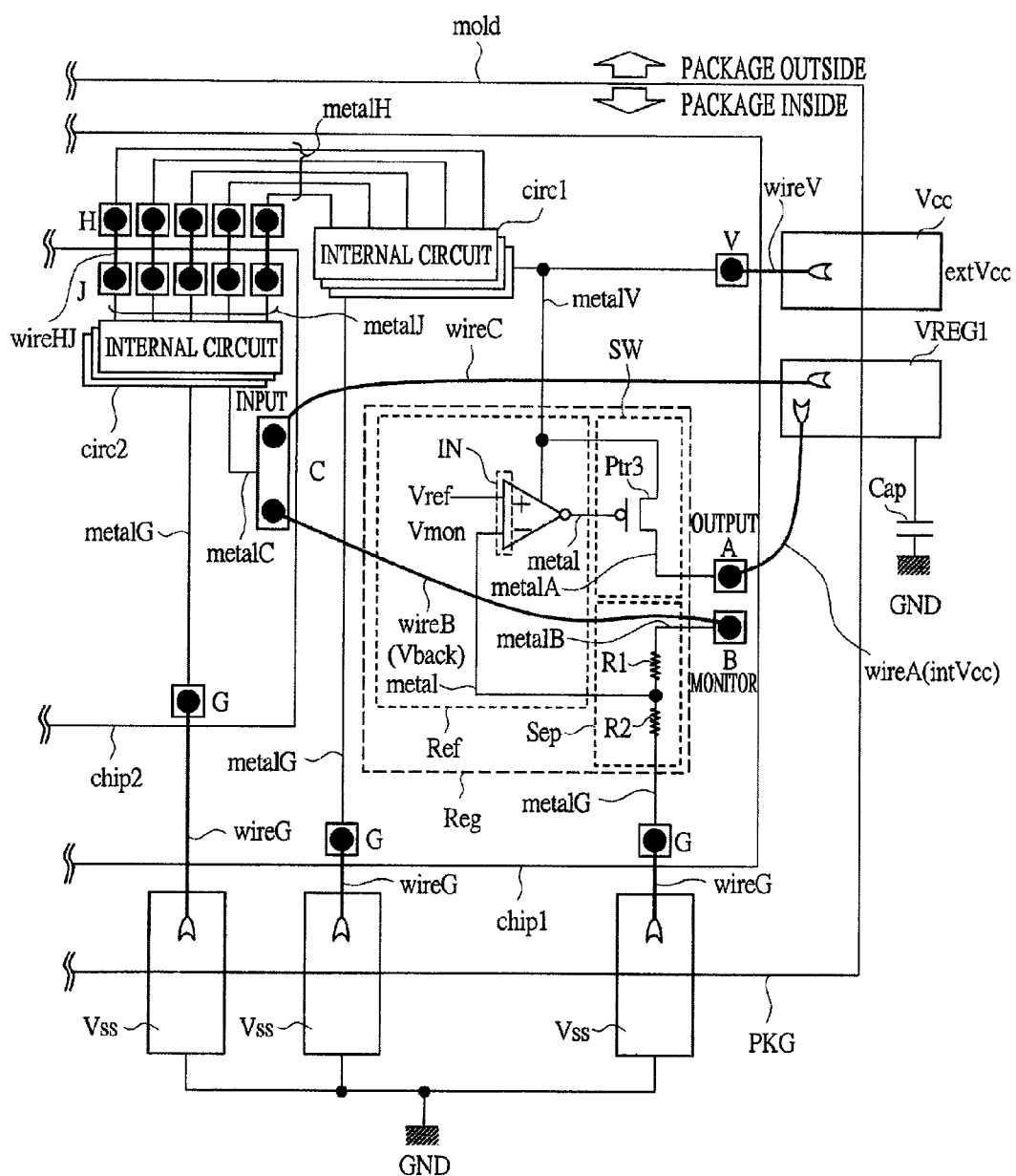
FIG. 20 is a diagram showing details of a regulator circuit and the surrounding part thereof for a semiconductor device in Embodiment 8 of the present invention.

FIG. 20 is a diagram showing details of a regulator circuit and the surrounding part thereof for a semiconductor device in Embodiment 8 of the present invention.

As shown in FIG. 20, a main difference of the semiconductor device in Embodiment 8 of the present invention from that in Embodiment 1 is that the metal wire WIREB is connected not to the lead terminal VREG1 but to the pad C which is the internal power supply input pad.

By connecting the metal wire WIREB to the pad C, the input voltage Vback can be taken out from the pad C without passing through the lead terminal VREG1. Thereby, the voltage drop caused in the lead terminal VREG1 is eliminated, and the input voltage Vback can be taken out and returned to the regulator circuit REG, having a higher accuracy than that in the semiconductor device of Embodiment 1.

Embodiment 9

Figure 21:
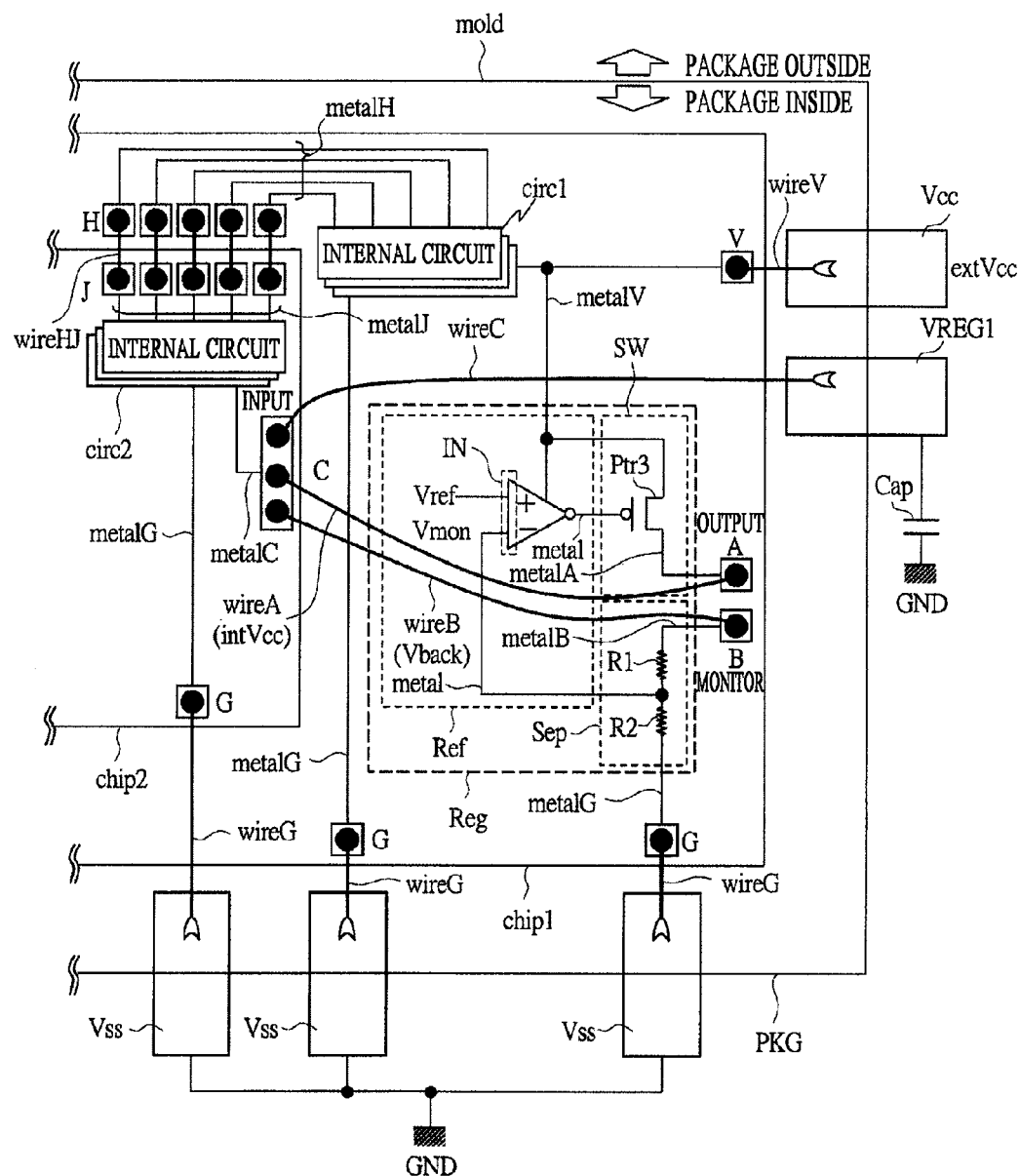
FIG. 21 is a diagram showing details of a regulator circuit and the surrounding part thereof for a semiconductor device in Embodiment 9 of the present invention.

FIG. 21 is a diagram showing details of a regulator circuit and the surrounding part thereof for a semiconductor device in Embodiment 9 of the present invention.

As shown in FIG. 21, a main difference of the semiconductor device in Embodiment 9 of the present invention from that in Embodiment 8 is that the metal wire WIREA is connected not to the lead terminal VREG1 but to the pad C which is the internal power supply input pad.

By the connection of the metal wire WIREA to the pad C, the wiring length is reduced by a length which is eliminated by a route without passing through the lead terminal VREG1. Thereby, the internal power supply voltage INTVcc can be input into the pad C having a higher accuracy than that in the semiconductor device of Embodiment 8.

Further, since the pad B is connected to the pad C via the metal wire WIREB, the input voltage Vback can be taken out and returned to the regulator circuit REG, having a higher accuracy than that in the semiconductor device of Embodiment 8 according to the improved accuracy of the input voltage.

Hereinabove, the semiconductor devices in Embodiments 1, 6, 7, 8, and 9 have been described. These embodiments are broadly classified into two types in the connection method of the pad B which is the monitor pad.

In each of the semiconductor devices of Embodiments 1, 6, and 7, the pad B takes out the input voltage Vback from the lead terminal VREG1.

That is, it can be said that the pad B of the monitor pad is electrically connected to the pad A of the internal power supply output pad via the connection path between the pad C of the power supply input pad and the pad A and via the connection path between the pad C and the pad B.

Next, in each of the semiconductor devices of Embodiment 8 and 9, the pad B takes out the input voltage Vback from the pad C.

That is, it can be said that the pad B of the monitor pad is electrically connected to the pad A of the internal power supply output pad via the pad C of the internal power supply input pad.

Embodiment 10

Figure 22:
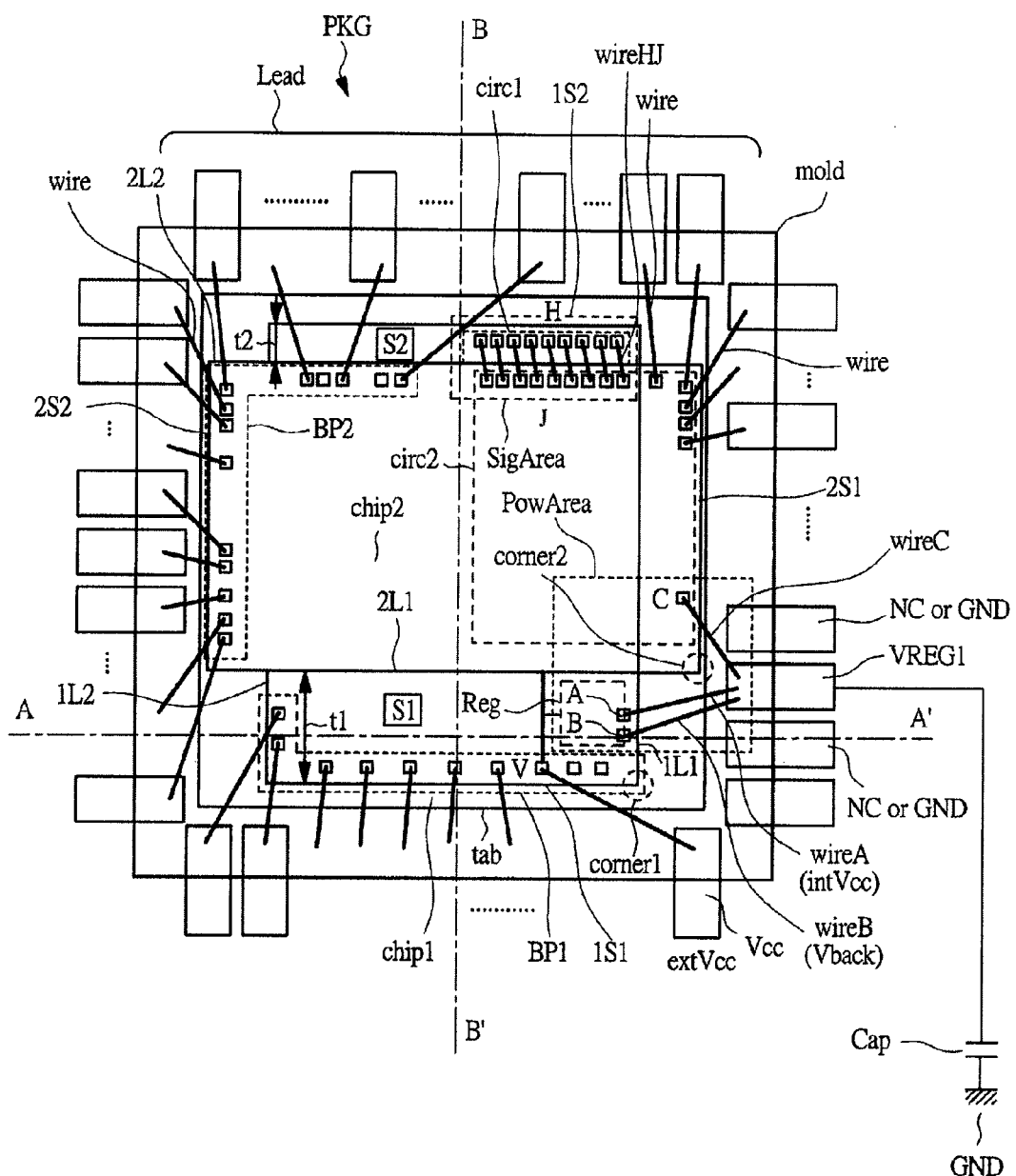
FIG. 22 is a plan view of a package structure for the semiconductor device in Embodiment 10 of the present invention.

FIG. 22 is a plan view of a package structure for a semiconductor device in Embodiment 10 of the present invention.

Figure 23:
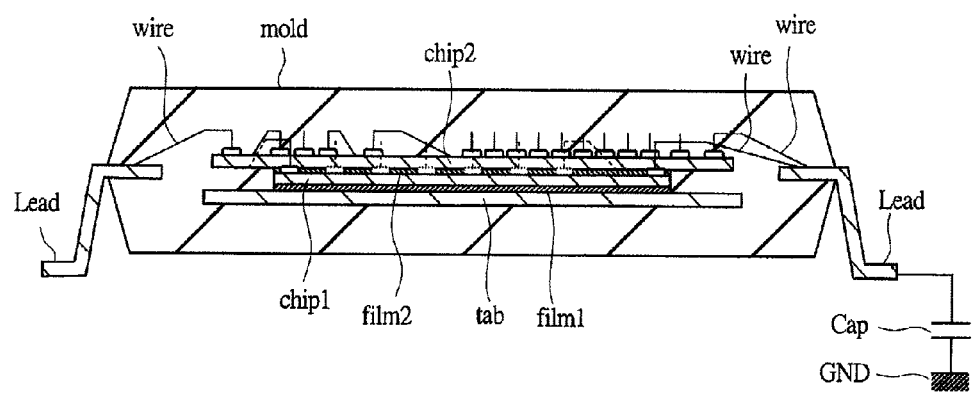
FIG. 23A is a cross-sectional view of a package structure for a semiconductor device, taken along the line A-A' of FIG. 22 in Embodiment 10 of the present invention.
FIG. 23B is a cross-sectional view of the package structure for the semiconductor device, taken along the line B-B' of FIG. 22 in Embodiment 10 of the present invention.
Figure 23:
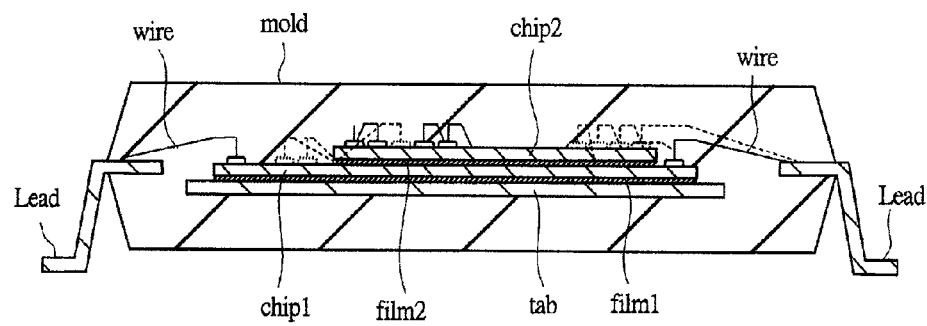

FIGS. 23A and 23B are cross-sectional views of the package structure for the semiconductor device in Embodiment 10 of the present invention.

FIG. 23A is a cross-sectional view taken along the line A-A' of FIG. 22. FIG. 23B is a cross-sectional view taken along the line B-B' of FIG. 22.

As shown in FIG. 22 and FIGS. 23A and 23B, a main difference of the semiconductor device in Embodiment 10 of the present invention from that in Embodiment 1 is that the second semiconductor chip CHIP2 is stacked on the main surface of the first semiconductor chip CHIP1 so as to form a crisscross planar shape. Further, a plurality of pads BP1 is disposed collectively in a region which is exposed on the main surface of the first semiconductor chip CHIP1 without being overlapped by the second semiconductor chip CHIP2.

The reason of stacking in this manner will be described.

Figure 24:
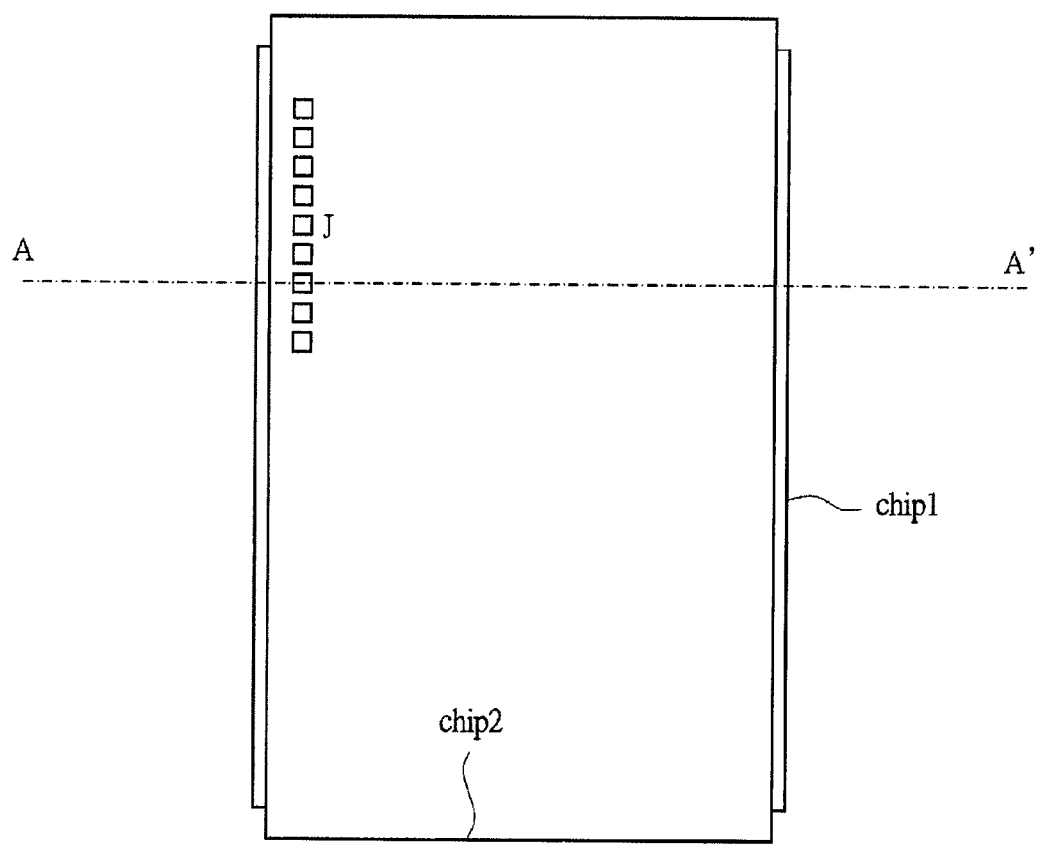
FIG. 24 is a diagram showing details of a comparative example for the plan view of FIG. 22.

FIG. 24 is a diagram showing details of a comparative example for the plan view of FIG. 22. Line A-A' is a line indicating a cross-sectional plane similar to FIGS. 2, 22 and 34.

As shown in FIG. 24, the outer shapes of the first semiconductor chip CHIP1 and the second semiconductor chip CHIP2 are approximately the same here. In such a case, when the second semiconductor chip CHIP2 is stacked on the main surface of the first semiconductor chip CHIP1 such that the long sides of the respective chips are arranged close and in parallel to each other, a plurality of pads BP1 and a plurality of pads H, which are disposed on the main surface of the first semiconductor chip CHIP1, are overlapped by the second semiconductor chip CHIP2.

When the two chips are stacked with each other and the upper chip overlaps the main surface of the lower chip, it is better to carry out stacking in consideration of the mounting direction of the upper chip so as to secure a region for disposing the pads of the lower chip, as shown in FIG. 22.

By securing the region for disposing the pads of the lower chip, it is possible to carry out the whole pad layout easily.

Further, some advantages are obtained by stacking the two chips as shown in FIG. 22. In the following, examples of the advantages will be described.

The first example relates to the layout relationship among the internal power supply output pad (pad A) and the monitor pad (pad B) in the first semiconductor chip CHIP1, and the internal power supply input pad (pad C) in the second semiconductor chip CHIP2.

As shown in FIG. 22, the first semiconductor chip CHIP1 has a first long side 1L1, a second long side 1L2, a first short side 1S1, and a second short side 1S2.

The second semiconductor chip CHIP2 has a first long side 2L1, a second long side 2L2, a first short side 2S1, and a second short side 2S2.

As shown in FIG. 22, the pad A and the pad B are disposed in a region S1 on the main surface of the first semiconductor chip CHIP1, where the first semiconductor chip CHIP1 and the second semiconductor chip CHIP2 do not overlap each other.

This region S1 is a region sandwiched by the first short side 1S1 of the first semiconductor chip CHIP1 and the first long side 2L1 of the second semiconductor chip CHIP2.

Further, the pad A and the pad B are disposed along the first long side 1L1 on the region S1.

The pad C is disposed along the first short side 2S1 on the main surface of the second semiconductor chip CHIP2.

The first long side 1L1 of the first semiconductor chip CHIP1 and the first short side 2 S1 of the second semiconductor chip CHIP2 are arranged close and in parallel to each other. Accordingly, the pads A, B and C disposed along these sides are disposed close to each other on the same side.

Further, the pads A, B and C are connected commonly to the lead terminal VREG1 with the metal wires WIREA, WIREB and WIREC, respectively.

In other words, the pads A, B and C are electrically connected to one another with the metal wires WIREA, WIREB and WIREC via the lead terminal VREG1.

As shown in FIG. 22, also in the case of stacking the two chips so as to form the crisscross planar shape, it is possible to dispose the pads A, B and C along the corresponding sides arranged close and in parallel to each other in the respective chips, and to connect commonly to the lead terminal VREG1 with the metal wires WIREA, WIREB and WIREC, respectively. Thereby, it is possible to make the wiring length shorter than that in the connection by the wiring on the circuit substrate in which the package PKG is mounted, as in the semiconductor device in Embodiment 1.

The next example will be described.

As shown in FIG. 22, a region S2 is provided in the main surface of the first semiconductor chip CHIP1, sandwiched by the second short side 1S2 of the first semiconductor chip CHIP1 and the second long side 2L2 of the second semiconductor chip CHIP2.

On this region S2, one or more pads H are disposed.

Further, in the main surface of the second semiconductor chip CHIP2, the plurality of pads J are disposed along the second long side 2L2 of the second semiconductor chip CHIP2.

The pads H and the pads J are connected directly between the chips with the metal wires WIREHJ as in the semiconductor device of Embodiment 1.

Thereby, as in the semiconductor device of Embodiment 1, the internal circuit CIRC1 in the first semiconductor chip CHIP1 connected to the pads H and the internal circuit CIRC2 connected to the pads J in the second semiconductor chip CHIP2 can carry out the signal transmission and reception with each other.

Further, also in the semiconductor device in Embodiment 10, the signal area SIGAREA where the pads H and J are connected with each other directly between the chips is disposed along the side different from the side which has the power supply area POWAREA where the pads A, B and C are connected commonly to the lead terminal VREG1, as in the semiconductor device of Embodiment 1.

Thereby, as in the semiconductor device of Embodiment 1, it is possible to reduce the noise provided from the signal area SIGAREA to the power supply area POWAREA by the antennas formed by the metal wires.

The next example will be described.

As shown in FIG. 22, a plurality of pads BP2 is disposed in the main surface of the second semiconductor chip CHIP2 along the second long side 2L2, the first short side 2S1, and the second short side 2S2 thereof. Note that the pads BP2 are not disposed along the first long side 2L1.

Problems will be described for the case that the pads BP2 are disposed along the first long side 2L1 of the second semiconductor chip CHIP2.

Figure 25:
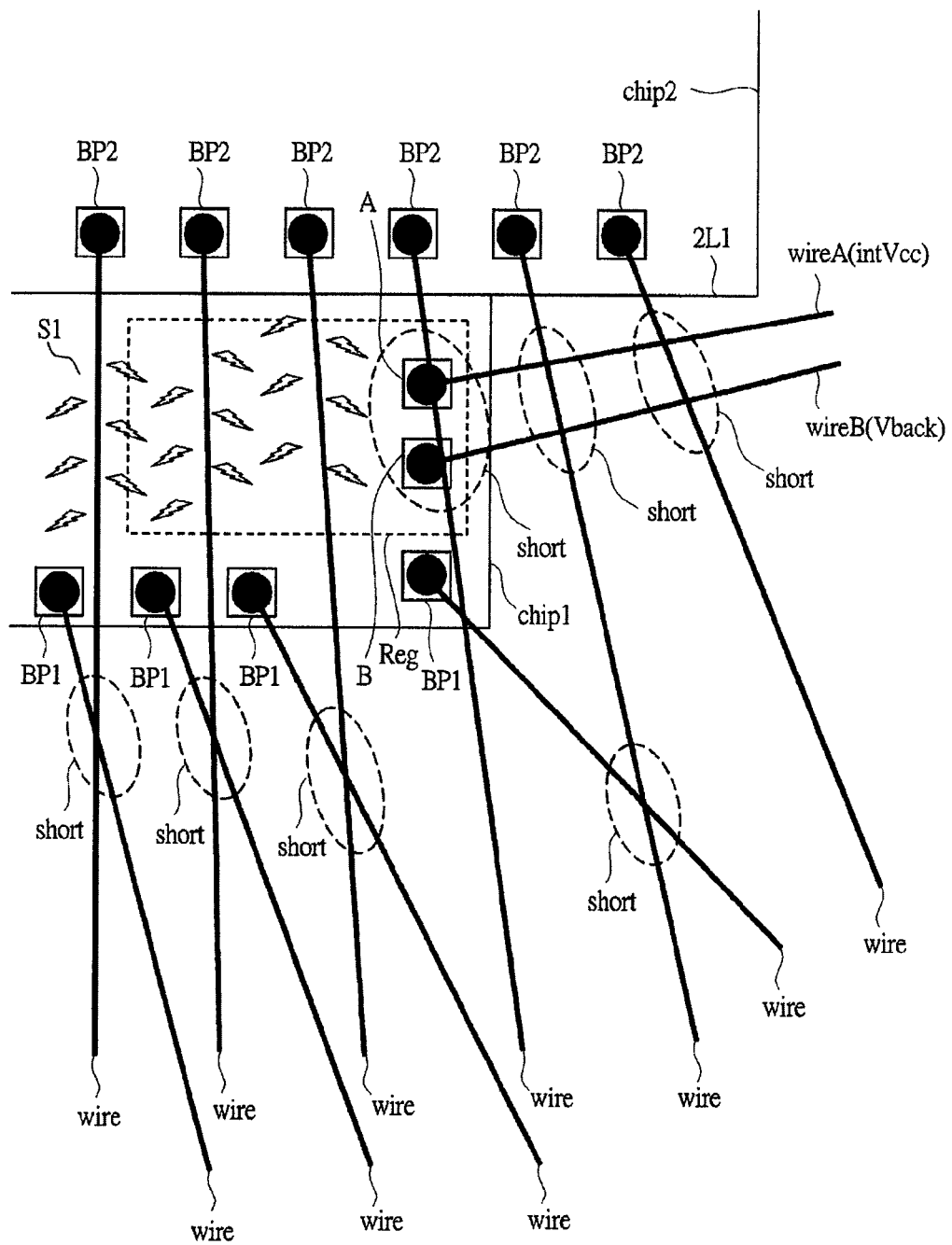
FIG. 25 is an enlarged view of first pads, second pads, and the surrounding part thereof in the case that the pads are disposed along a first long side of a second semiconductor chip.

FIG. 25 is an enlarged view of the pads A and B in the case that the pads BP2 are disposed along the first long side 2L1 of the second semiconductor chip CHIP2.

As shown in FIG. 25, the plurality of pads BP2 are disposed along the first long side 2L1 of the second semiconductor chip CHIP2 and further connected with the metal wires WIRE. In addition, on the region S1, the pad A, the pad B, and the pads BP1 are disposed and similarly connected with metal wires WIRE. The metal wires WIRE connected to the pads BP2 are arranged so as to cover the metal wires WIRE connected to the pad A, the pad B and the pads BP1.

Here, in the case that the distance (clearance) is not sufficient between the metal wires connected to the pads BP2 and the metal wires connected to the pad A, the pad B and the pads BP1, when melted resin is injected into a mold die forming the sealing body MOLD of the package PKG, wire flowing, which is a phenomenon that the metal wire is made to fall down by the injection pressure, is caused and frequently the metal wires WIRE are shorted with each other.

Another problem is that, for example, when a metal wire WIRE, through which a signal with a frequency such as one higher than several hundred MHz is transmitted and received, is located over the metal wire WIREA carrying the internal power supply voltage INTVcc or the metal wire WIREB carrying the input voltage Vback, noise is transferred by the antennas of the metal wires WIRE and sometimes the internal power supply voltage INTVcc is affected by the influence of the noise.

From these above reasons, the pad BP2 is not disposed along the first long side 2L1 of the second semiconductor chip CHIP2.

The next example will be described.

In the case that the regulator circuit REG is disposed under the second semiconductor chip CHIP2 stacked in the upper level, heat generated in the operation of the regulator circuit REG sometimes provides an influence to the operation of the second semiconductor chip CHIP2.

The semiconductor device shown in FIG. 22 for Embodiment 10 of the present invention is assumed to be supplied with the external power supply voltage EXTVcc having a maximum value of 25 V, and assumed to generate the internal power supply voltage INTVcc stepped down to 1.5 V, for example. Also in this case, a current having a maximum value of approximately 20 mA is assumed to flow in the regulator circuit REG.

Further, the thermal resistance of the QFP is assumed to be 51° C./W, for example.

By these assumptions, the regulator circuit REG in operation has a temperature rise of (25−1.5) (V)×0.020 (A)×51 (° C./W)=23.97 (° C.), that is, approximately 24° C. at maximum.

If the surrounding environmental temperature is 85° C., the temperature of the regulator circuit REG is increased by 24° C. to 109° C.

Silicon (Si), for example, is used for a material composing a semiconductor chip. The thermal conductivity of this silicon is 168 W/(m·K).

Further, the thermal conductivity of epoxy resin composing the sealing body MOLD is 0.21 W/(m·K).

Silicon has a larger thermal conductivity than epoxy resin. That is, the semiconductor chip is more likely to conduct heat than the sealing body.

The second semiconductor chip CHIP2 is stacked over the first semiconductor chip CHIP1 via the adhesive film FILM2.

The adhesive film FILM2, while typically composed of the epoxy resin, has a small film thickness (approximately 25 μm) and thus can be neglected here as a cause hindering the thermal conduction.

In the case that the regulator circuit REG is disposed under the second semiconductor chip CHIP2, the heat thereof (here, 109° C.) is conducted to the second semiconductor chip CHIP2.

Typically, the junction temperature of a semiconductor chip is approximately 150° C., and, at this temperature, junction leak increases and chip operation sometimes becomes unstable. In an actual case, when the temperature exceeds 120° C., the leak current sometimes increases abruptly by a μA order.

When the heat from the regulator circuit REG (here, 109° C.) is conducted to the second semiconductor chip CHIP2 and saturated around the temperature, for example, a margin for the chip junction temperature is reduced.

Further, in the case that the second semiconductor chip CHIP2 is a chip in which a current larger than the here calculated 20 mA flows, the heat generated in the regulator circuit REG for supplying the internal power supply voltage INTVcc is also increased and the margin is reduced further.

Figure 26:
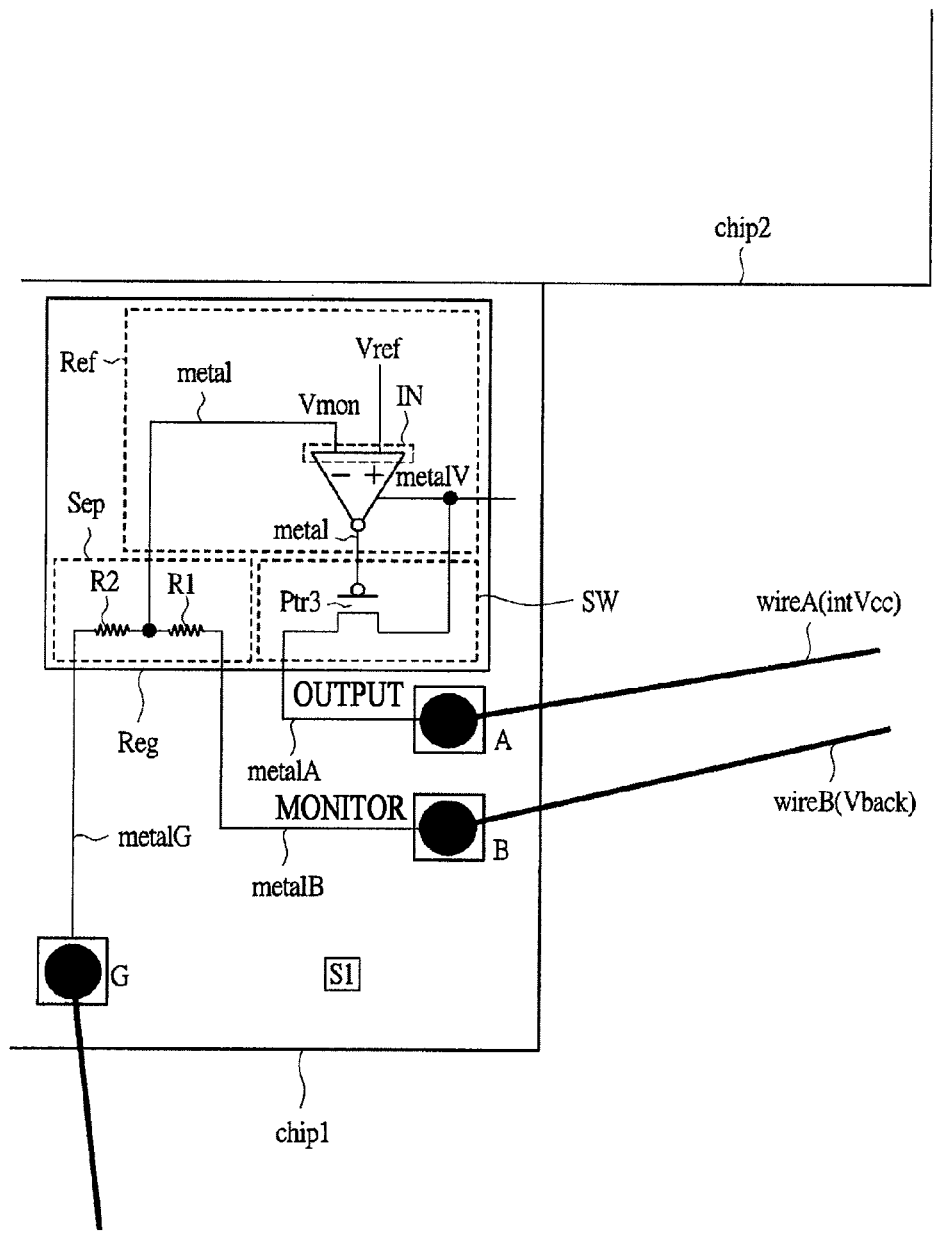
FIG. 26 is a diagram showing a configuration in which a regulator circuit is disposed not under a second semiconductor chip but on a region which does not overlap the second semiconductor chip.

Accordingly, for securing a sufficient margin for the chip junction temperature, it is better to dispose the regulator circuit REG not under the second semiconductor chip CHIP2 but in the region S1 as shown in FIG. 26.

Thereby, the second semiconductor chip CHIP2 becomes unlikely to have the influence of the heat.

When the second semiconductor chip CHIP2 and the regulator circuit REG overlap each other for convenience of layout, it is better to make the exposed area of the regulator circuit REG larger than the unexposed area thereof from the first long side 2L1 of the second semiconductor chip CHIP2.

Figure 27:
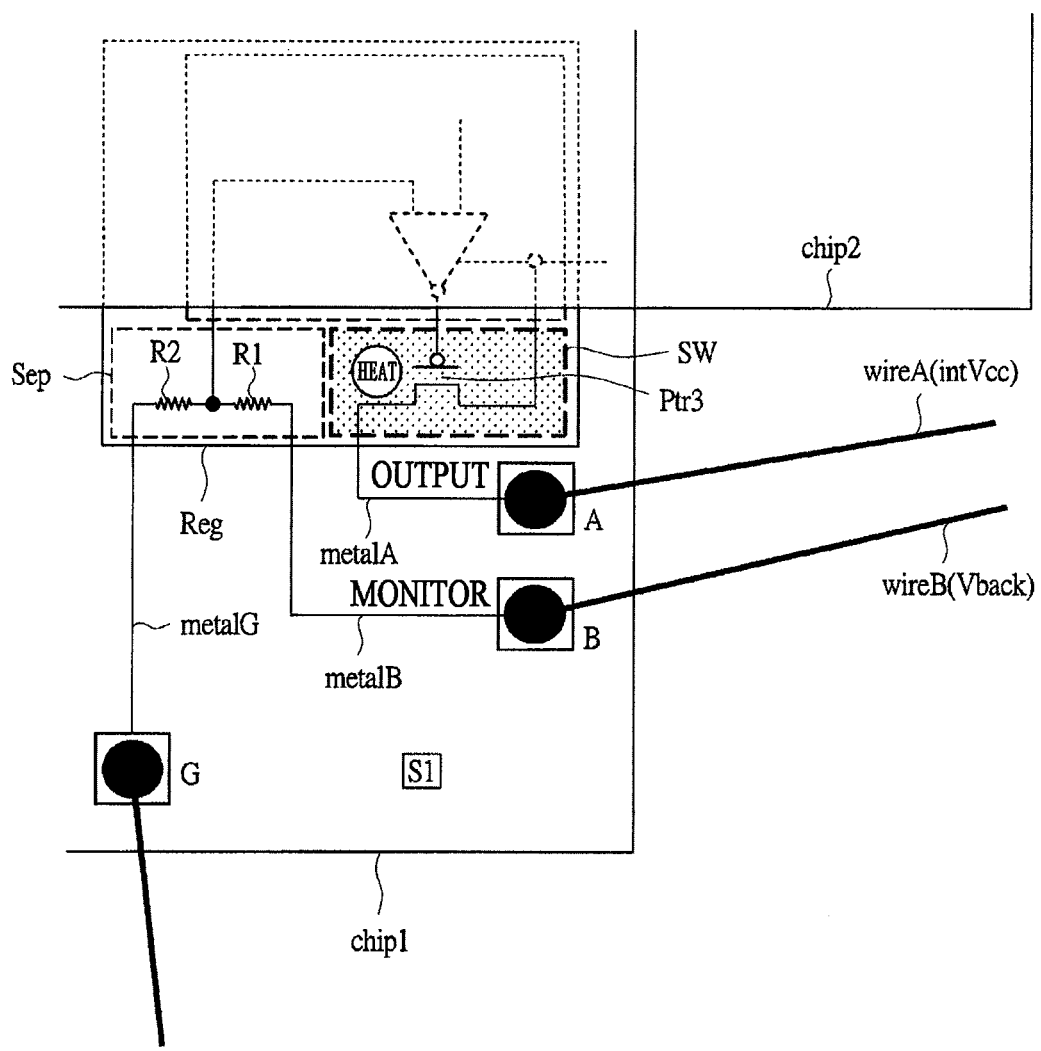
FIG. 27 is a diagram showing a configuration in which a second semiconductor chip is stacked to overlap a region except a voltage step-down switch part, when overlapping a regulator circuit.

Typically, the voltage step-down switch part SW, which generates the internal power supply voltage INTVcc by stepping down the external power supply voltage EXTVcc, is the part generating the largest heat in the regulator circuit REG. Accordingly, when stacking the second semiconductor chip CHIP2 over the regulator circuit REG, it is better to stack the second semiconductor chip CHIP2 over the area except the voltage step-down switch part SW as shown in FIG. 27.

By stacking the second semiconductor chip CHIP2 so that it does not overlap at least the voltage step-down switch part SW of the regulator circuit REG in this manner, it is possible to reduce the heat to be conducted to the second semiconductor chip CHIP2, and to prevent the operation of the second semiconductor chip CHIP2 from becoming unstable.

The next example will be described.

It is better not to dispose a pad carrying out input or output of the signal in a region located above the regulator circuit REG in the upper chip.

Figure 28:
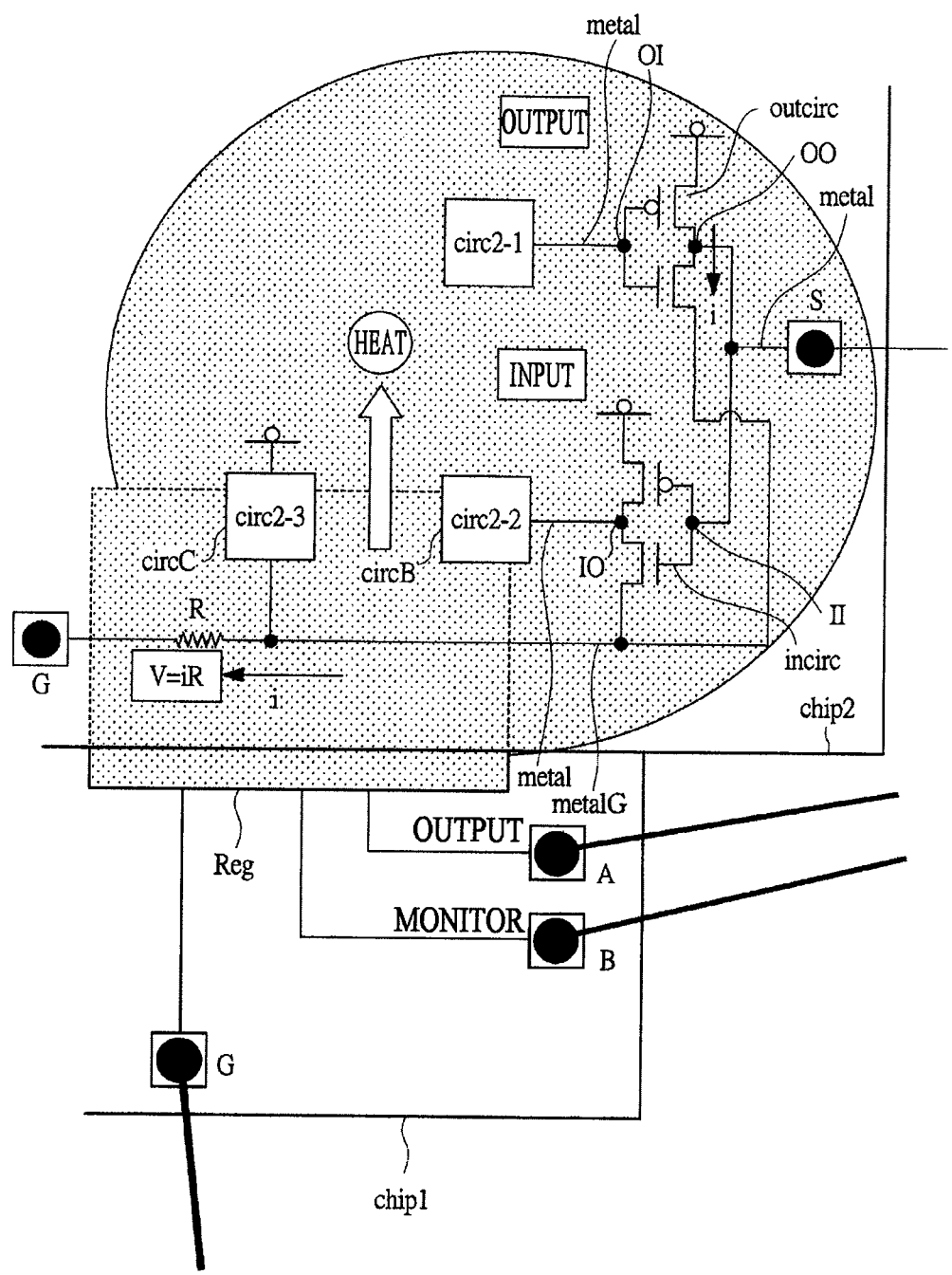
FIG. 28 is a diagram showing details of an example of a typical input/output circuit.

FIG. 28 is a diagram showing details of an example for a typical input/output circuit.

As shown in FIG. 28, the internal circuit CIRC2-1 is connected to an input part OI of an output circuit OUTCIRC with a metal wiring METAL.

Further, the internal circuit CIRC2-2 is connected to an output part IO of an input circuit INCIRC with a metal wiring METAL.

A pad S is connected to an output part OO of the output circuit OUTCIRC and an input part II of the input circuit INCIRC with metal wirings METAL. Thereby, the internal circuit CIRC2-1 and the internal circuit CIRC2-2 carry out the signal transmission and reception with the other circuit via the pad S.

The internal circuit CIRC2-1, the internal circuit CIRC2-2, and the internal circuit CIRC2-3 are connected to the ground GND with metal wirings METALG, respectively. When the signal is output to the pad S from the internal circuit CIRC2-1 via the output circuit OUTCIRC, a larger current flows in the output circuit OUTCIRC than in the input circuit INCIRC, because the output circuit OUTCIRC often has a larger transistor size (wider gate width) than the input circuit INCIRC.

At this time, a current I flows in the metal wiring METALG which connects the output circuit OUTCIRC and the ground GND.

The metal wiring METALG has a wiring resistance R and generates a voltage of IR (=V) here.

At this time, the ground GND potential float (ground shift) is caused by the generated IR (=V) and the operation of the internal circuit CIRC2-3, which is connected to the metal wiring METALG, sometimes becomes unstable affected by the influence thereof.

In particular, in the case that the internal circuit CIRC2-3 is a circuit such as an analog circuit operating at a minimal current, the circuit is likely to have the influence thereof.

For example, such a circuit corresponds to an analog circuit having a voltage threshold value around the power supply voltage or the ground GND potential or a circuit detecting a severe threshold value as measuring an ON resistance of a power transistor.

In this manner, the pad S, which carries out input and output of the signal, is connected with the input circuit INCIRC and the output circuit OUTCIRC, and these input and output circuits easily generate the ground GND potential float (ground shift) in the transmission and reception of the signal as described above.

Accordingly, in the case that the pad S is disposed close to the regulator circuit REG, the input circuit INCIRC or the output circuit OUTCIRC, which is connected to the pad S, is affected by the influence of the heat from the regulator circuit REG and the threshold value of the ground GND becomes to have further variation. At this time, the other circuit connected to the ground GND sometimes comes to have a further unstable state according to the threshold value variation.

From the above reason, it is better not to dispose the pad carrying out the signal input or output in a part located above the regulator circuit REG in the upper chip.

Note that in the case that a plurality of chips is stacked and accommodated in one package, it is better to take the following points into consideration for an order of stacking chips.

In the case that there is a chip generating heat and the heat may provide influence to the operation of the other chip, it is better to lay the chip generating heat in the lowest level.

The lowermost chip is glued to the tab TAB within the package (QFP) as shown in FIG. 22 and FIGS. 23A and 23B.

The QFP is a package assembled by use of a lead frame integrally formed with a lead terminal LEAD, a tab-hanging lead, and a tab TAB. This lead frame often is made of a copper (Cu)-based material.

Copper (Cu) has a heat conductivity of 398 W/(mK) which is higher than that of 168 W/(mK) in silicon, and conducts heat better than silicon.

Accordingly, by laying the chip generating heat in the lowermost level, the tab works as a heat radiation plate (heat sink) and it is possible to reduce the heat to be conducted to the upper chip.

Further, in the case that there is a chip having many pads, it is better to stack the chip in the top level.

By stacking the chip in the top level, it is possible to dispose the pads along all four sides and to easily connect the pads and the lead terminals with metal wires (easily to wire-bond).

As shown in FIG. 22, it is better to stack the second semiconductor chip CHIP2 over the first semiconductor chip CHIP1 so that the area of region S1 becomes larger than that of region S2 (S1>S2). That is, it is better to make the distance T1 from the first short side 1S1 of the first semiconductor chip CHIP1 to the first long side 2L1 of the second semiconductor chip CHIP2 longer than the distance T2 from the second short side 1S2 of the first semiconductor chip CHIP1 to the second long side 2L2 of the second semiconductor chip CHIP2 (T1>T2).

Thereby, compared to the case that the relationship between the distance T1 and the distance T2 is T1≤T2, the metal wire length of the metal wires WIREHJ, through which the signal is transmitted and received between the internal circuit CIRC1 and the internal circuit CIRC2, becomes short and the signal deterioration and delay can be reduced. Further, it is possible to increase the number of pads to be disposed in the region S1.

Hereinabove, some advantages have been described for the semiconductor device in Embodiment 10. The embodiment does not always need to have all these advantages but also may have one of these advantages or a combination of the advantages.

Embodiment 11

Figure 29:
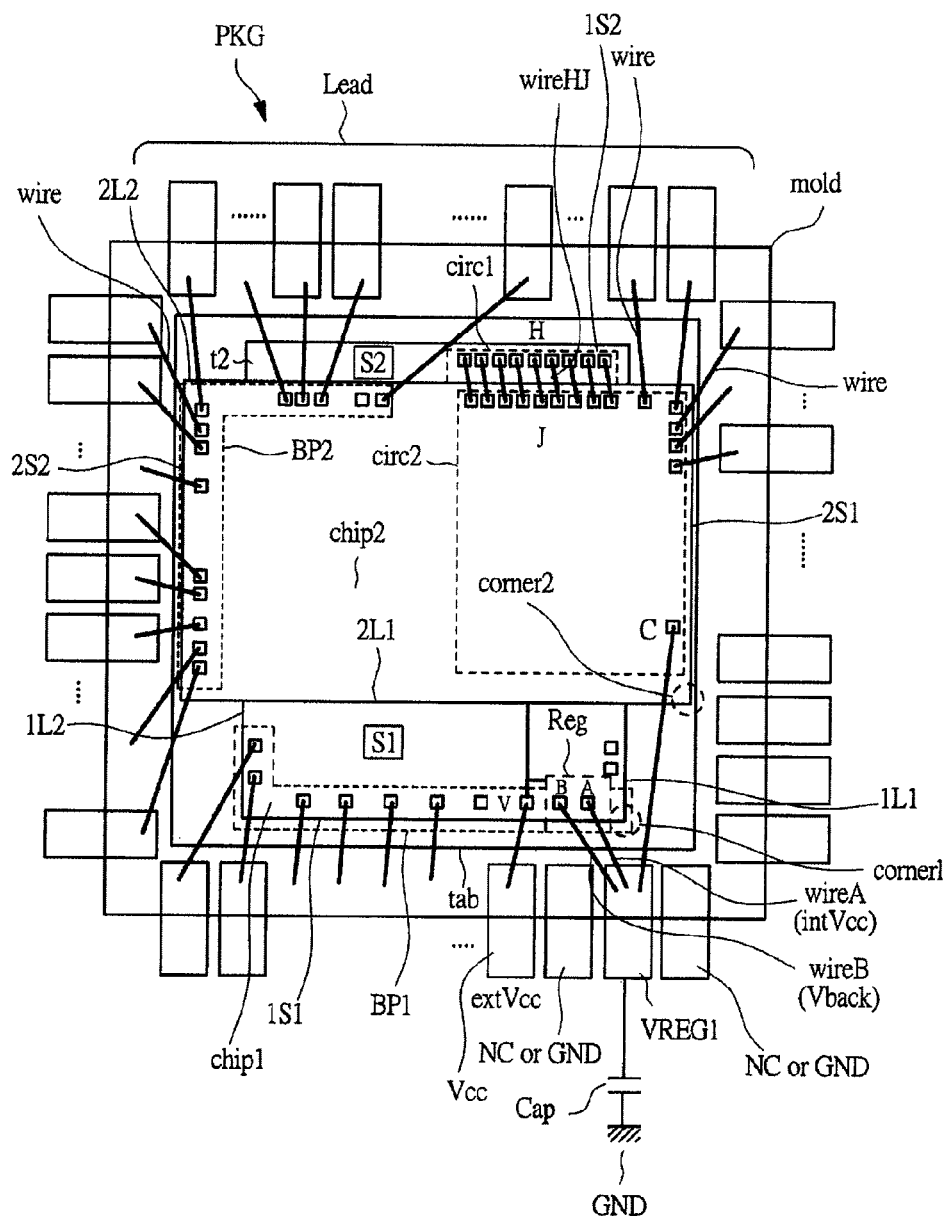
FIG. 29 is a plan view of a package structure for a semiconductor device in Embodiment 11 of the present invention.

FIG. 29 is a plan view of a package structure for the semiconductor device in Embodiment 11 of the present invention.

As shown in FIG. 29, a difference of the semiconductor device in Embodiment 11 of the present invention from that in Embodiment 10 is that the pad A and the pad B are disposed not along the first long side 1L1 of the first semiconductor chip CHIP1 but along the first short side 1S1 of the first semiconductor chip CHIP1, which is located in the direction intersecting the side of the second semiconductor chip CHIP2 along which the pad C is disposed.

Also in the arrangement of the pads A, B and C in this manner, the wiring length can be made shorter than that in the connection with the wiring on the circuit substrate as in the semiconductor device of Embodiment 10, and it is possible to reduce the voltage drop of the internal power supply voltage INTVcc caused by the wiring resistance.

The main contents described hereinabove for Embodiment 10 and Embodiment 11 of the present invention can be also expressed as follows.

The first semiconductor chip CHIP1 has the region S1 sandwiched between the first long side 2L1 of the second semiconductor chip CHIP2 and the first short side 1S1 of the first semiconductor chip CHIP1 and the region S2 sandwiched between the second long side 2L2 of the second semiconductor chip CHIP2 and the second short side 1S2 of the first semiconductor chip CHIP1. Then, in the region S1, the second semiconductor chip CHIP2 is stacked over the main surface of the first semiconductor chip CHIP1 so as to expose the pads BP1 of the first semiconductor chip CHIP1 and also to cover the first long side 1L1 and the second long side 1L2 of the first semiconductor chip CHIP1.

The first semiconductor chip CHIP1 has the four corners including the corner CORNER1 formed by the first short side 1S1 and the first long side 1L1 thereof, and the pad A and the pad B are disposed on the region S1 closer to the corner CORNER1 than to the other corners.

Further, the second semiconductor chip CHIP2 has the four corners including the corner CORNER2 formed by the first short side 2S1 and the first long side 2L1 thereof, and the pad C is disposed closer to the corner CORNER2 than to the other corners over the main surface of the second semiconductor chip CHIP2.

Moreover, the pads H are disposed on the region S2, and the pads J electrically connected to the pads H are disposed along the second long side 2L2 over the main surface of the second semiconductor chip CHIP2.

Embodiment 12

Figure 30:
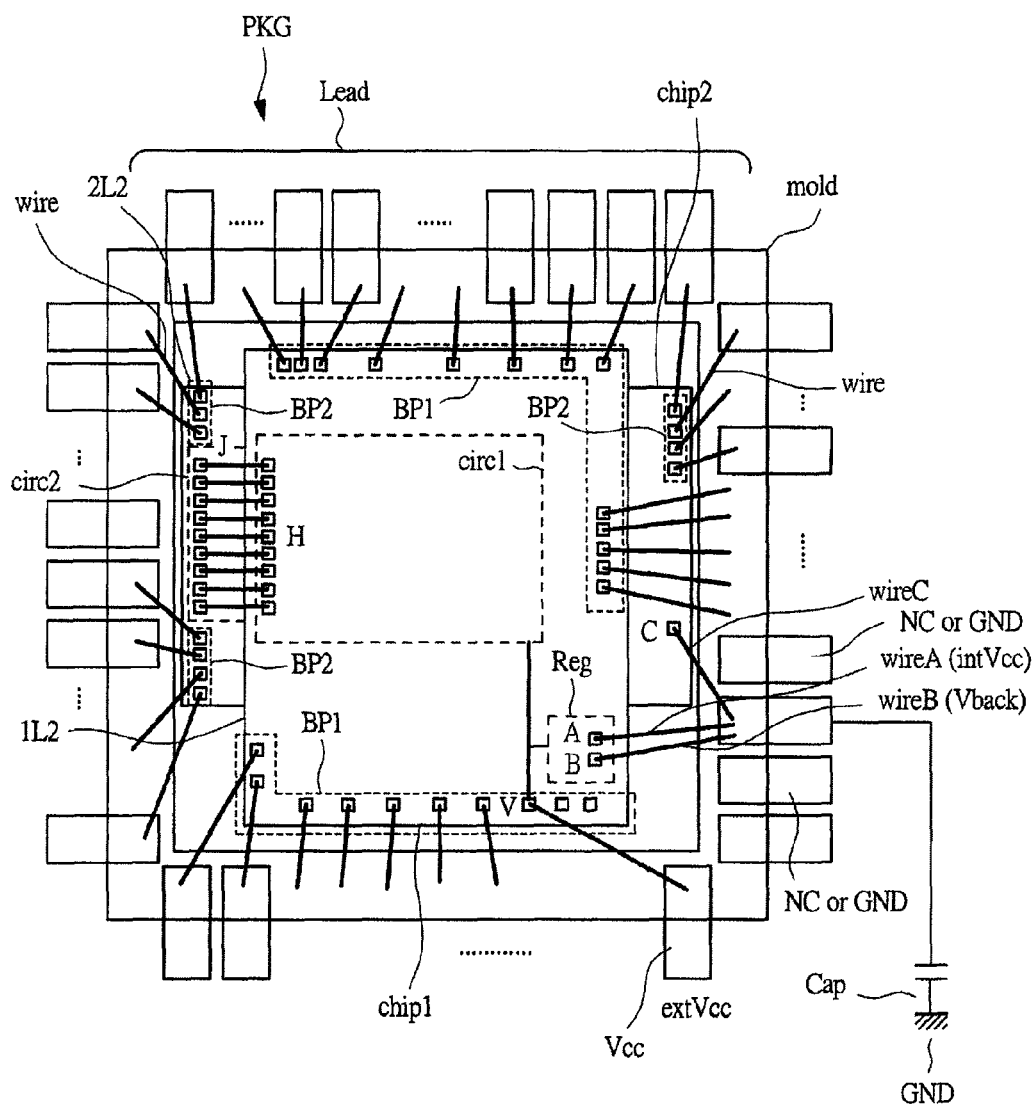
FIG. 30 is a plan view of a package structure for a semiconductor device in Embodiment 12 of the present invention.

FIG. 30 is a plan view of a package structure of a semiconductor device in Embodiment 12 of the present invention.

As shown in FIG. 30, a difference of the semiconductor device in Embodiment 12 of the present invention from that in Embodiment 10 is that the number of the pads in the first semiconductor chip CHIP1 is larger than that of pads in the second semiconductor chip CHIP2, and the first semiconductor chip CHIP1 is stacked over the main surface of the second semiconductor chip CHIP2.

In the case that the regulator circuit REG generates little heat and the radiation of the heat via the tab TAB may not be necessary, the first semiconductor chip CHIP1 having the regulator circuit REG may be stacked over the second semiconductor chip CHIP2. Also in the case that the chips are swapped between the upper and lower levels in this manner, it is better to connect the pads A, B and C to the lead terminal VREG1 with the metal wires WIREA, WIREB and WIREC, respectively.

By stacking the one of the two chips having the larger number of pads in the upper level, it is possible to expose all the pads and connect the metal wires WIRE to these pads.

Embodiment 13

A difference of a semiconductor device in Embodiment 13 of the present invention from that in Embodiment 10 is the configuration that the first semiconductor chip CHIP1 has two regulator circuits and supplies two kinds of power supply voltages having different voltage values to the second semiconductor chip CHIP2.

Figure 31:
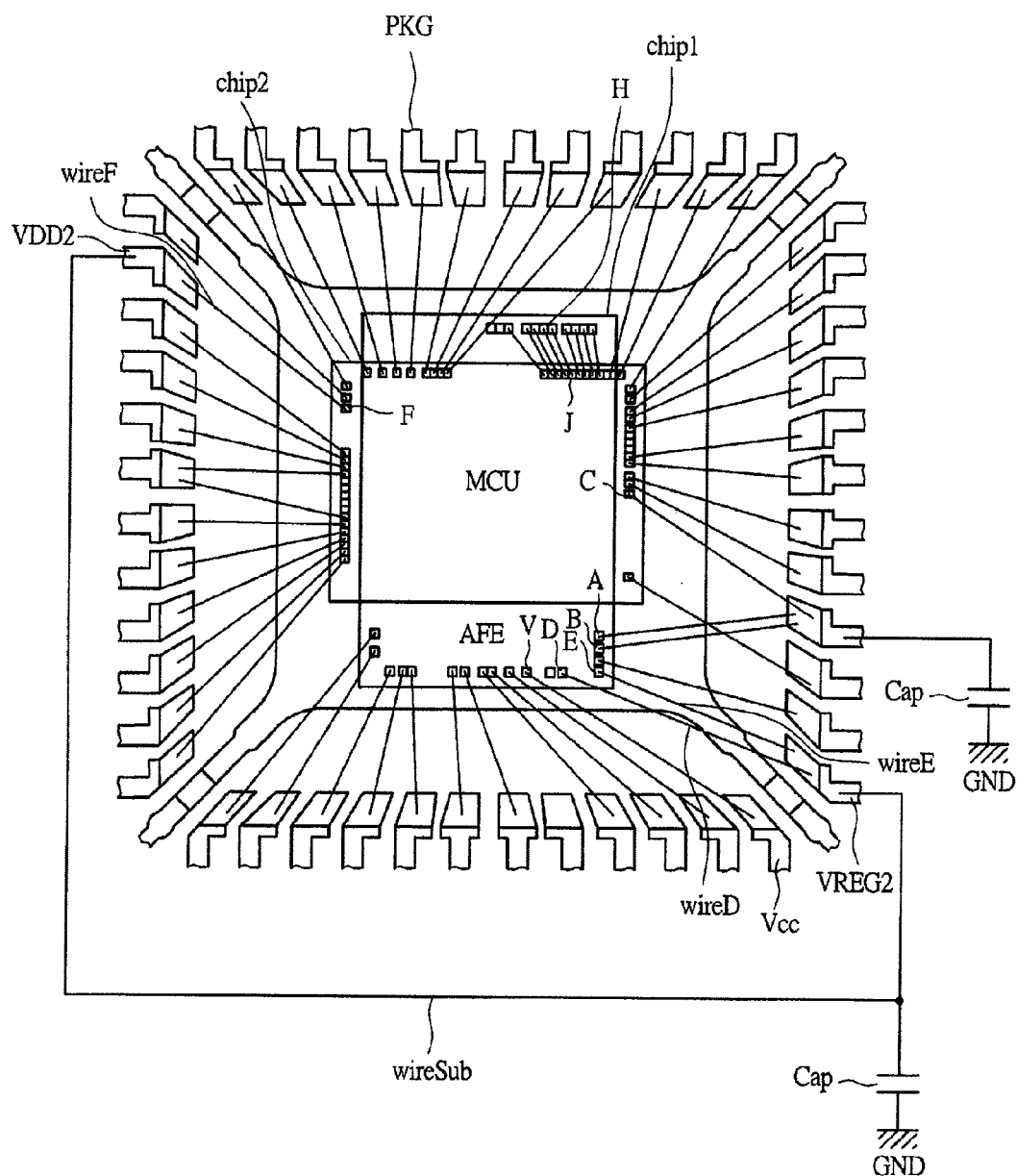
FIG. 31 is a plan view of a package structure for a semiconductor device in Embodiment 13 of the present invention.

FIG. 31 is a plan view of a package structure of the semiconductor device in Embodiment 13 of the present invention.

Figure 32:
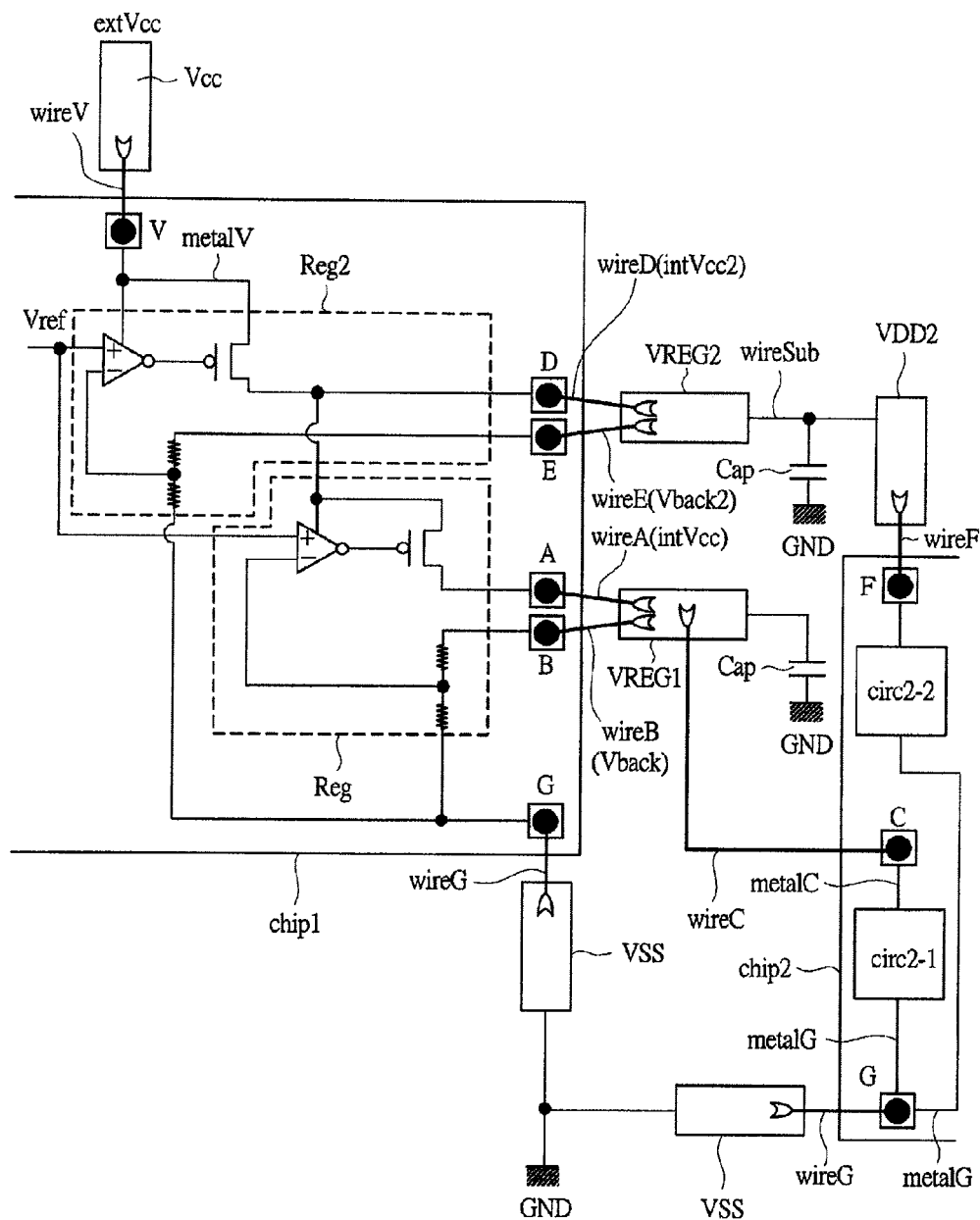
FIG. 32 is a diagram showing details of a regulator circuit and the surrounding part thereof for the semiconductor device in Embodiment 13 of the present invention.

FIG. 32 is a diagram showing details of a regulator circuit and the surrounding part thereof for the semiconductor device in Embodiment 13 of the present invention.

As shown in FIG. 32, the semiconductor device in Embodiment 13 of the present invention is provided with a regulator circuit REG2 added to the regulator circuit REG.

The regulator circuit REG2 generates an internal power supply voltage INTVcc2 by stepping down the external power supply voltage EXTVcc.

The internal power supply voltage INTVcc2 is output from a pad D and input into a pad F via a lead terminal VREG2, a wiring WIRESUB on the circuit substrate, and a lead terminal VDD2.

Further, the regulator circuit REG is supplied with the internal power supply voltage INTVcc2 from the regulator circuit REG2 and generates the internal power supply voltage INTVcc by stepping down the internal power supply voltage INTVcc2.

Therefore, the voltage value of the internal power supply voltage INTVcc2 is higher than that of the internal power supply voltage INTVcc.

As shown in FIG. 32, the pad F is connected with the internal circuit CIRC2-2. The internal circuit CIRC2-2 connected to the pad F is a circuit operating at a higher voltage than the internal circuit CIRC2-1 connected to the pad C.

For example, the voltage value of the internal power supply voltage INTVcc2 is approximately 3.45 V, and the voltage value of the internal power supply voltage INTVcc is approximately 1.5 V.

By the circuit configuration shown in FIG. 32 in this manner, it is possible to stably supply the plural kinds of voltages, which are generated in any of the plurality of semiconductor chips and have different voltage values, to the other semiconductor chip as the power supply voltages.

Further here, the internal power supply voltage INTVcc2 is configured to be output from the lead terminal VREG2 and to be supplied to the lead terminal VDD2 via the wiring WIRESUB on the circuit substrate. That is, while the internal power supply voltage INTVcc is supplied to the internal circuit CIRC2-1 of the second semiconductor chip CHIP2 within the package PKG, the internal power supply voltage INTVcc2 is supplied to the internal circuit CIRC2-2 through the outside of the package PKG.

In this manner, in a case such as one that the internal power supply voltage cannot be supplied from one chip to the other chip via the metal wire WIRE within the package PKG by restriction of the pad layout or the like, it is generally better to supply the power supply voltage having a higher voltage value, which is resistant to the influence from the wiring resistance and does not require so accurate voltage value, via the wiring WIRESUB on the circuit substrate outside the package PKG to the other chip.

Thereby, also in the case that the restriction of the pad layout or the like exists, it is possible to stably supply the plural kinds of internal power supply voltages having different voltage values to the other chip without providing the influence to the internal power supply voltage which has a lower voltage value and requires accuracy.

Note that the semiconductor device in Embodiment 13 of the present invention can be applied to various applications.

For example, the semiconductor device in Embodiment 13 of the present invention can be applied to a battery voltage control system or the like for a lithium ion battery (hereinafter, called "Li battery") which is utilized for a power supply of a digital device such as a mobile phone and a notebook type personal computer.

Hereinafter, an application example will be described for the battery voltage control system of the Li battery.

In the battery voltage control system of the Li battery, the first semiconductor chip CHIP1 is an analog chip which has an analog circuit and performs power supply control or the like. This analog chip receives and processes information such as voltage or the like from the connected Li battery, and is often called an analog front end IC (hereinafter, called "AFE").

The second semiconductor chip CHIP2 is a microcomputer chip for controlling the AFE and performing information processing (hereinafter, called "MCU").

In the battery voltage control system of the Li battery, a semiconductor device accommodating the AFE and the MCU in one package is mounted frequently in a battery pack of a notebook type personal computer or the like.

Figure 33:
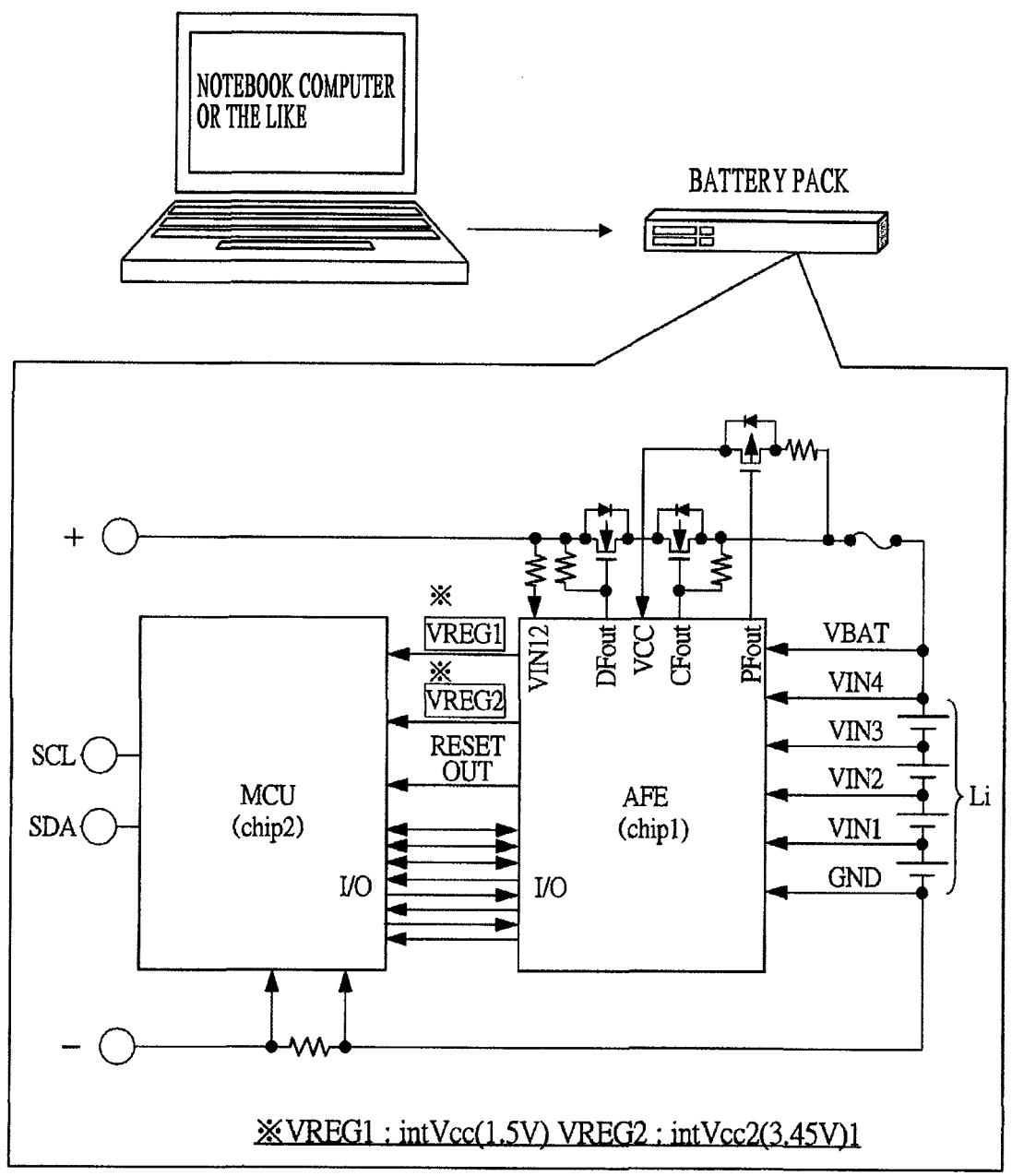
FIG. 33 is a circuit block diagram showing details of a battery voltage control system configured with an AFE and an MCU.

FIG. 33 is a circuit block diagram showing details of the battery voltage control system configured with the AFE and the MCU.

As shown in FIG. 33, the AFE monitors the voltage or the like of the four Li batteries LI connected in series, for example. The AFE is connected with a plus (+) terminal and a minus (−) terminal of each of the Li batteries. A load or a charger is connected between an original plus (+) terminal and an original minus (−) terminal.

The AFE amplifies each Li battery voltage in a predetermined magnification ratio (e.g., magnification ratio of approximately 0.3) according to a command from the MCU, and outputs the amplified voltage to the MCU as analog data based on GND.

The MCU calculates the voltage of the Li battery according to the analog data input from the AFE. The MCU has a means detecting a charge/discharge current or a temperature in addition to such a means detecting the battery voltage.

Further, the MCU judges a battery state such as an overcharge state or an overdischarge state according to these detection result and battery voltage detection result.

The judgment result by the MCU is output to the AFE. The AFE turns on or off an externally connected power MOSFET according to the judgment result by the MCU. The AFE is provided with an FET control part therein and outputs a power MOSFET control signal.

The power MOSFET is connected to a charge and discharge path in series and operates as a charge/discharge switch. In this manner, the present semiconductor device controls the voltage of the Li battery within a predetermined voltage range.

Further, the AFE has a high withstand voltage part (35 V) and a low withstand voltage part (5 V), in this case. The high withstand voltage part is provided with a terminal or the like which is connected with the four Li batteries (maximum voltage of a single cell is approximately 4.2 V) or the charger having a voltage of approximately 16 to 18 V.

The low withstand voltage part is provided with a serial data I/O part or the like for the MCU, for example. This part corresponds to a part where the pads H and the pads J shown in FIG. 31 are connected with each other directly between the chips with the metal wires WIRE.

On the other hand, the MCU is composed of a low withstand voltage part only.

The MCU operates with the internal power supply voltage supplied from a regulator circuit of the AFE. The lead terminal VREG1 and lead terminal VREG2 shown in FIG. 33 correspond to terminals for the voltage supply. The internal power supply voltage INTVcc is supplied from the lead terminal VREG1 and the internal power supply voltage INTVcc2 is supplied from the lead terminal VREG2. Note that the voltage value of the internal power supply voltage INTVcc is approximately 1.5 V, and the voltage value of the internal power supply voltage INTVcc2 is approximately 3.45 V. The MCU uses the internal power supply voltage INTVcc as a MCU power supply and the internal power supply voltage INTVcc2 as the MCU power supply and an LED power supply.

Embodiment 14

Figure 34:
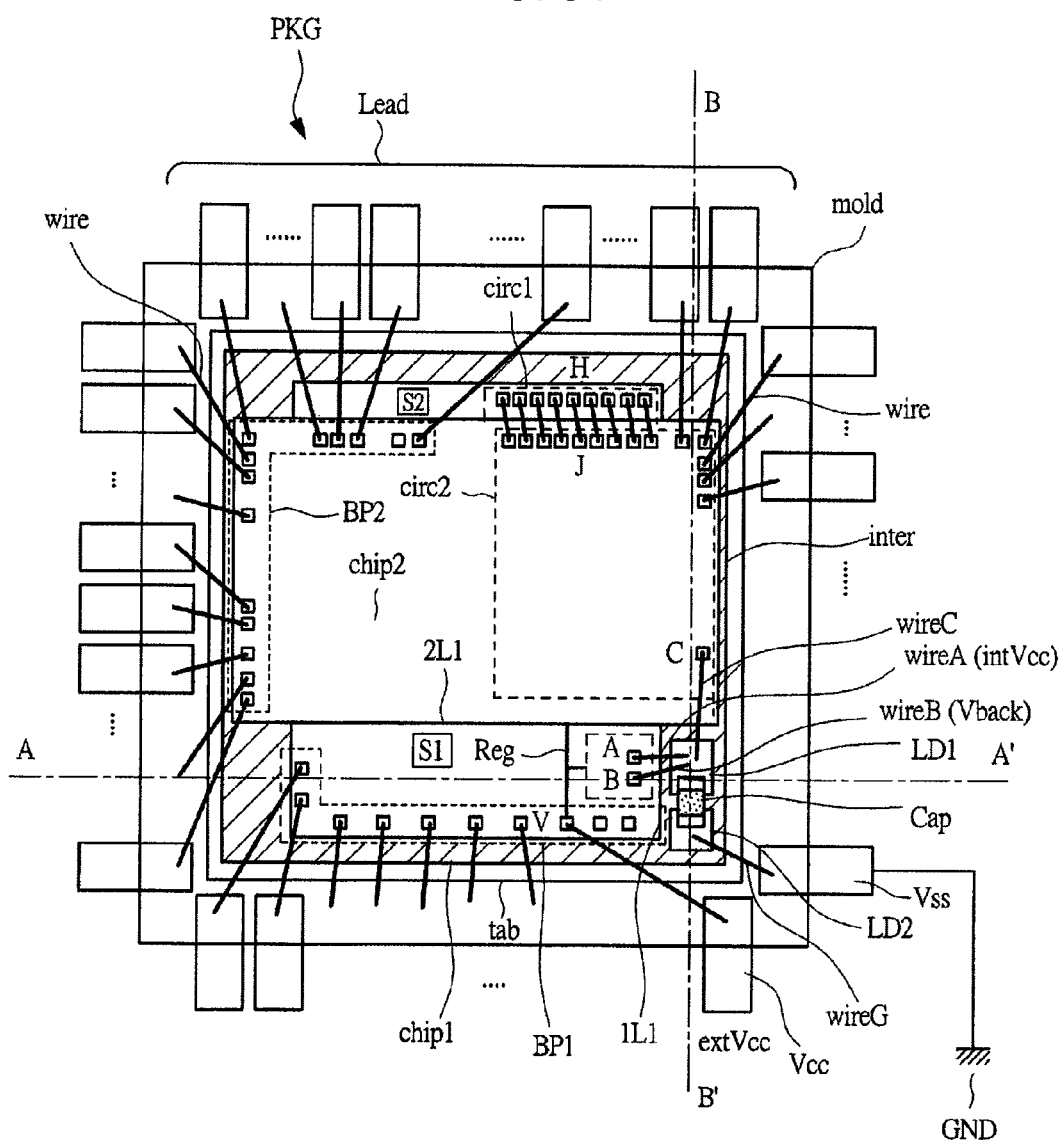
FIG. 34 is a plan view of a package structure for a semiconductor device in Embodiment 14 of the present invention.

FIG. 34 is a plan view of a package structure for a semiconductor device in Embodiment 14 of the present invention.

Figure 35:
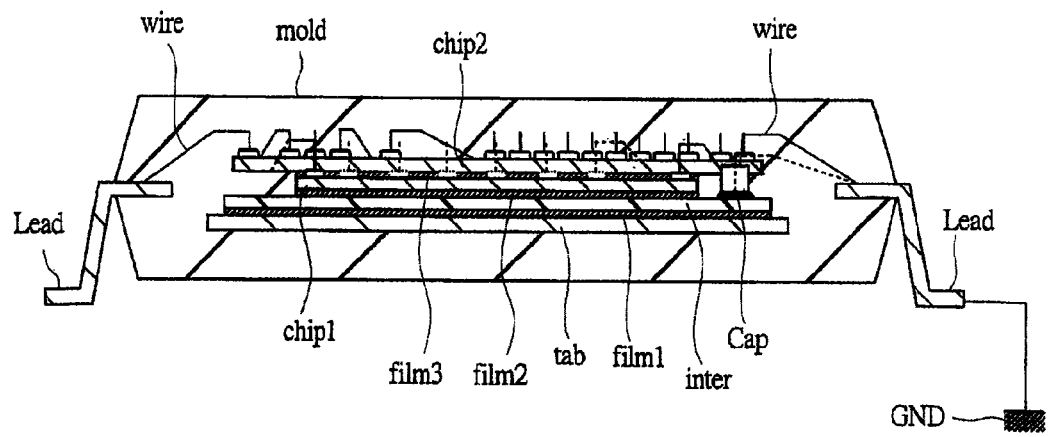
FIG. 35A is a cross-sectional view of a package structure for a semiconductor device taken along the line A-A' of FIG. 34 in Embodiment 14 of the present invention.
FIG. 35B is a cross-sectional view of the package structure for the semiconductor device taken along the line B-B' of FIG. 34 in Embodiment 14 of the present invention.
Figure 35:
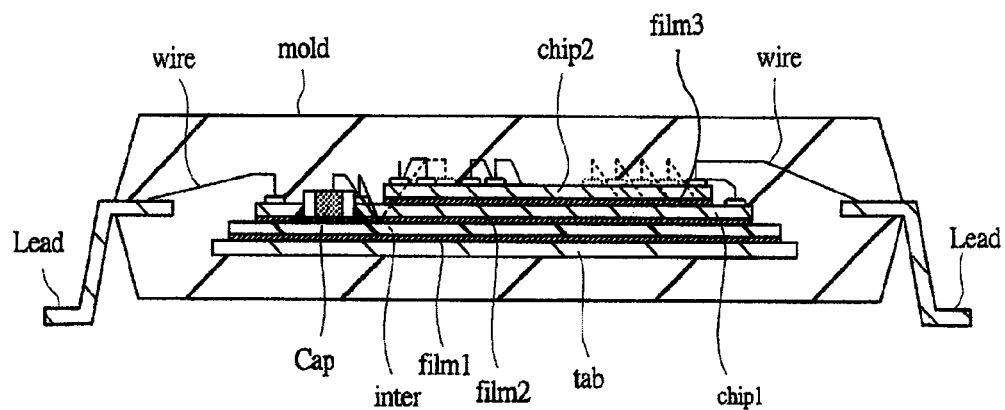

FIGS. 35A and 35B are cross-sectional views of the package structure for the semiconductor device in Embodiment 14 of the present invention.

FIG. 35A is a cross-sectional view taken along the line A-A' of FIG. 34. FIG. 35B is a cross-sectional view taken along the line B-B' of FIG. 34.

As shown in FIG. 34 and FIGS. 35A and 35B, a main difference of the semiconductor device in Embodiment 14 of the present invention from that in Embodiment 10 is that the capacitor CAP, which is a regulator capacitance for phase compensation and voltage stabilization of the internal power supply voltage INTVcc, and is taken into the inside of the package PKG.

An interposer substrate INTER is mounted on the tab TAB via the adhesive film FILM1. The interposer substrate INTER is a resin substrate, a ceramic substrate, or the like which has one or two layers and is formed by a subtractive method or the like. Further, the interposer INTER may be a film substrate which is effective for making the substrate thinner.

Over the interposer substrate INTER, the first semiconductor chip CHIP1 and the second semiconductor chip CHIP2 are stacked via adhesive films FILM2 and FILMS, respectively.

As shown in FIG. 34, a land LD1 and a land LD2 are provided in the main surface of the interposer substrate INTER, which is surrounded by the first long side 1L1 of the first semiconductor chip CHIP1, the first long side 2L1 of the second semiconductor chip CHIP2, and the outer perimeter of the interposer substrate INTER. Further, over these land LD1 and land LD2 is mounted the capacitor CAP.

For the capacitor CAP, it is better to use a surface mount type small enough to be accommodated within the package PKG (QFP). Here, the drawing shows an example of using a laminated ceramic chip capacitor formed by lamination of dielectric sheets. Further, the capacitor CAP may be a tantalum electrolytic capacitor formed by sintering of metal tantalum powder. The tantalum electrolytic capacitor can provide a larger capacitance than the laminated ceramic chip capacitor.

The two electrodes of the capacitor CAP are electrically connected to the land LD1 and the land LD2, respectively, with solder or conductive paste.

The pads A, B and C are connected to the land LD1 with metal wires WIREA, WIREB and WIREC, respectively. Further, the land LD2 is connected to a lead terminal Vss, which is provided with the earth (ground) potential GND, with a metal wire WIREG.

In this manner, by taking the capacitor CAP into the package inside, it is possible to reduce the number of components on the circuit substrate. Further, since the pads A, B and C are connected commonly to the land LD1 with metal wires WIREA, WIREB and WIREC, respectively, the lead terminal VREG1 shown in FIG. 22 becomes unnecessary. Thereby, it is possible to reduce the number of pins of the package PKG.

Moreover, by disposing the capacitor CAP in a region over the main surface of the interposer substrate INTER, the region being obtained by stacking the two chips so as to form a crisscross planar shape, that is, the region being surrounded by the first long side 1L1 of the first semiconductor chip CHIP1, the first long side 2L1 of the second semiconductor chip CHIP2, and the outer perimeter of the interposer substrate INTER, it is possible to make the package size equivalent to that of the package PKG of the semiconductor device in Embodiment 10 without enlarging the package size.

Note that it is better to use a high melting point solder which has a lead (Pb) content rate of 90% or higher for the solder connecting the capacitor CAP to the land LD1 and the land LD2. By use of the high melting point solder, the solder melting point can be made higher than a reflow temperature when the package PKG is mounted on the circuit substrate. Thereby, it is possible to prevent an interelectrode short or a package crack of the capacitor CAP, which is caused by remelting of the solder within the package PKG.

In the case that the package PKG needs to cope with lead (Pb) free solder, it is better to use an Sn—Ag based solder or an Sn—Ag—Cu based solder which has versatility as the lead (Pb) free solder and is easy to obtain. The composition ratio thereof is 1.0 to 3.5% for Ag, 0 to 0.5% for Cu, and the remaining part for Sn. Note that the generation of solder remelting cannot be avoided in the reflow when the package PKG is mounted on the circuit substrate. Accordingly, when the solder melts and the volume expands, it is better to select a resin material, the elasticity coefficient of which is reduced small enough so that the sealing body MOLD may absorb (relax) volume expansion thereof and the package crack may not occur.

Embodiment 15

Figure 36:
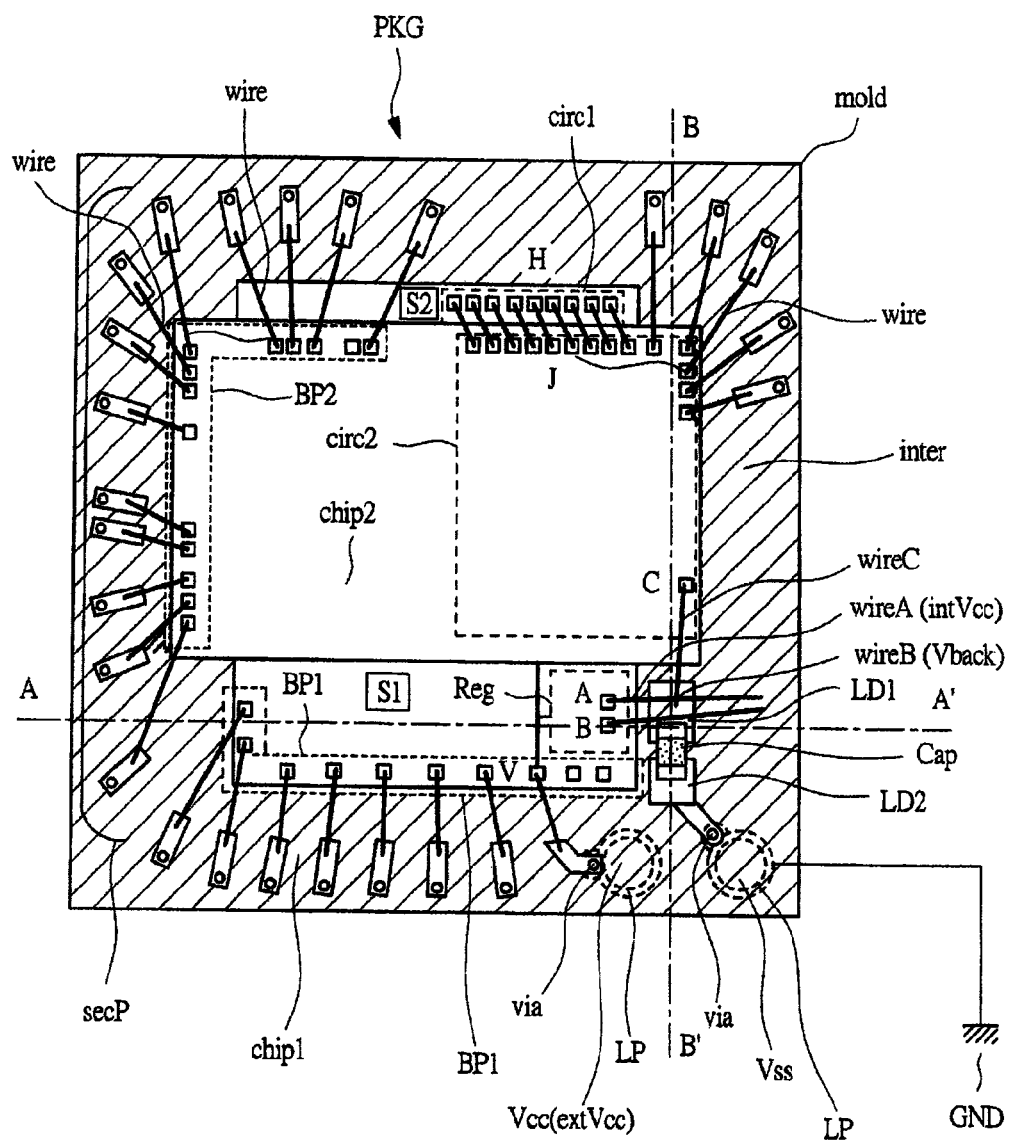
FIG. 36 is a plan view of a package structure for a semiconductor device in Embodiment 15 of the present invention.

FIG. 36 is a plan view of a package structure of a semiconductor device in Embodiment 15 of the present invention.

Figure 37:
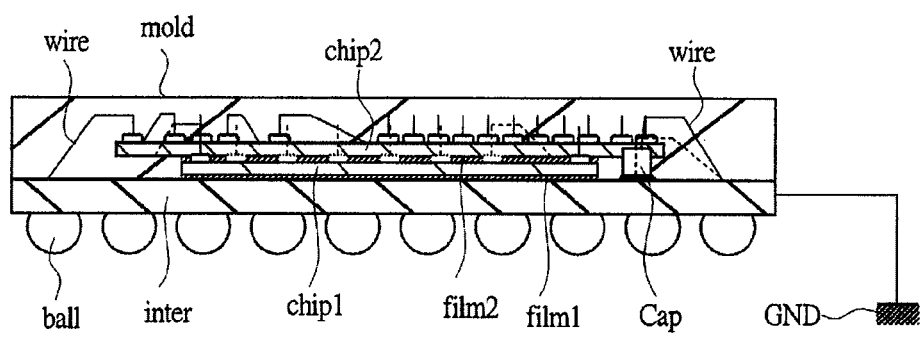
FIG. 37A is a cross-sectional view of a package structure for a semiconductor device taken along the line A-A' of FIG. 36 in Embodiment 15 of the present invention.
FIG. 37B is a cross-sectional view of the package structure for the semiconductor device taken along the line B-B' of FIG. 36 in Embodiment 15 of the present invention.
Figure 37:
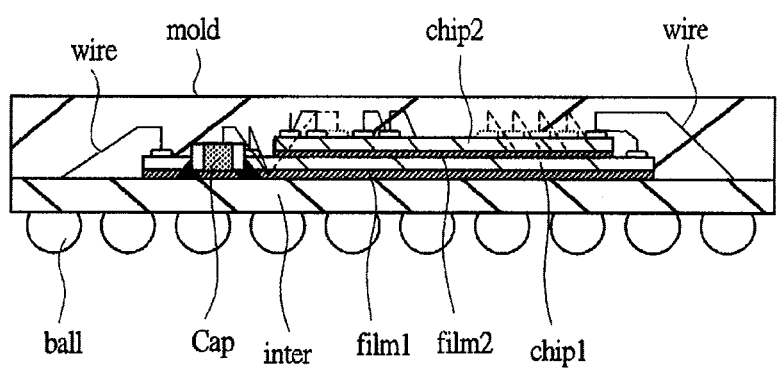

FIGS. 37A and 37B are cross-sectional views of the package structure of the semiconductor device in Embodiment 15 of the present invention.

FIG. 37A is a cross-sectional view taken along the line A-A' of FIG. 36. FIG. 37B is a cross-sectional view taken along the line B-B' of FIG. 36.

As shown in FIG. 36 and FIGS. 37A and 37B, a main difference of the semiconductor device in Embodiment 15 of the present invention from that in Embodiment 14 is that the package PKG is a BGA (Ball Grid Array) package.

The first semiconductor chip CHIP1 and the second semiconductor chip CHIP2 are stacked over an interposer substrate INTER via the adhesive films FILM1 and FILM2, respectively.

The interposer substrate INTER is a resin substrate or the like having multilayer wirings formed by a build-up method or the like. The wirings are often formed by copper (Cu) or the like.

The first semiconductor chip CHIP1 and the second semiconductor chip CHIP2 are stacked over the interposer substrate INTER via the adhesive films FILM1 and FILM2, respectively.

Further, a plurality of second pads SECP is disposed in the main surface of the interposer substrate INTER. The bonding pads BP1 of the first semiconductor chip CHIP1 and the bonding pads BP2 of the second semiconductor chip CHIP2 are connected to the corresponding pads SECP with metal wires WIRE.

Note that, as shown in FIG. 36 and FIGS. 37A and 37B, the second pads SECP are illustrated in an appropriate number for explanation, and actually may be provided in a number larger or smaller than this number.

The second pads SECP are connected to the land pads LP on the rear surface of the package PKG through via holes VIA. Further, the land pads LP are connected with solder balls BALL thereon. The solder of the solder ball BALL is often a eutectic solder of Sn—Pb. In the case that the package PKG needs to cope with lead (Pb) free solder, it is better to use a solder ball using a Sn—Ag based solder or a Sn—Ag—Cu based solder which has versatility as the lead (Pb) free solder and is easy to obtain. The composition ratio thereof is 1.0 to 3.5% for Ag, 0 to 0.5% for Cu, and the remaining part for Sn.

Note that as shown in FIG. 36 and FIGS. 37A and 37B, the land pads LP and the solder balls BALL are illustrated in an appropriate number for explanation, and actually may be provided in a number larger or smaller than this number.

The land LD2, on which the capacitor CAP is mounted, is connected to the lead terminal Vss with the metal wire WIREG in the above semiconductor device of Embodiment 14. On the other hand, in the semiconductor device of the present Embodiment 15, the land LD2 is connected to the solder ball BALL which is provided with the earth (ground) potential GND through the via hole VIA.

In this manner, by use of the BGA instead of the QFP for the package PKG, the lead terminal LEAD becomes unnecessary and it is possible to reduce the package size. Note that the advantage obtained for the QFP is similarly obtained in the semiconductor device of Embodiment 15, in which the package form is changed to the BGA.

Hereinabove, the semiconductor devices have been described for Embodiments 1 to 15 of the present invention. Any of the above described inventions provides a technique which supplies a voltage generated in any one of a plurality of semiconductor chips to the other semiconductor chips as a power supply voltage in a semiconductor device stacking the plurality of semiconductor chips in the same package, and realizes a stable operation of the semiconductor device.

While the packages of the semiconductor devices which have been described in respective embodiments are the QFP and the BGA, the package may be a CSP (Chip Size Package) which is also a surface mount package or a LGA (Land Grid Array) which is not provided with the solder balls on the rear surface of the package, and is not limited to the package type described here.

The lead terminal (lead frame) of the QFP may be formed also by a copper (Cu) based material or the 42 alloy of iron (Fe) and nickel (Ni), which is a metallic (conductive) material.

The lead terminal is composed of an outer lead which is exposed from the sealing body to the outside of the package and soldered to the circuit substrate in the mounting, and an inner lead which is connected to the semiconductor chip with the metal wire WIRE within the package.

The surface of the outer lead is provided with exterior plating. The exterior plating is Sn—Pb solder plating or the like. In the case that the package needs to cope with Pb-free solder, the external plating is Pb-free solder plating.

While the outer shape (size) of the tab is illustrated to be larger than that of the chip mounted on the tab in the QFP, the tab size may be inversely smaller than the chip size.

In the case that the outer shape (size) of the tab is smaller than that of the chip mounted on the tab, resin of the sealing body is adhered to the rear surface of the chip. Since the adhesive force between the semiconductor chip (silicon) and the resin is larger than that between the tab (metal) and the resin, it is possible to prevent water from intruding through the interface between the tab and the resin. As a result, it is possible to prevent the package crack caused by the intruding water when the water is expanded by the reflow heat in the mounting of the package onto the substrate by the solder reflow.

Further, while the structure for stacking the semiconductor chips using the adhesive films has been described so far, adhesive paste may be used instead of the adhesive films.

Note that adhesive film is easier to control in production compared to adhesive paste. Since the adhesive film has a smaller film thickness variation than a supply amount variation of the adhesive paste, a finished dimension has a smaller variation after the chip mounting. Therefore, the film (adhesion) thickness after adhesion is easy to control.

Further, a protrusion of the adhesive material from the chip after the adhesion is smaller with the adhesive film than with the adhesive paste. With the smaller protrusion, it is possible to avoid a problem such as one that the adhesive material attaches to the pad of the lower chip and the metal wire cannot be connected to the pad.

While the invention achieved by the present inventors has been described specifically according to the embodiments thereof hereinabove, the present invention is not limited to the above embodiments, and obviously can be modified variously without departing from the spirit thereof. Further, Embodiments 1 to 15 may be combined with one another appropriately. Moreover, only a part may be taken out from each of the embodiments and the parts may be combined with one another appropriately.

The present invention can be utilized widely in the manufacturing industry manufacturing semiconductor devices.

What is claimed is:

1. A semiconductor device, comprising:
a first semiconductor chip having a main surface, a first side, a second side which intersects with the first side, and a plurality of the pads formed over the main surface thereof;
a second semiconductor chip having a main surface, a first side, a second side which intersects with the first side, and a plurality of the pads formed over the main surface thereof;
a chip mounting portion being mounted the first and second semiconductor chips;
first and second leads being arranged nearby the chip mounting portion;
a sealing body sealing the first and second semiconductor chips, the chip mounting portion and parts of the first and second leads; and
wherein the first semiconductor chip includes:
a first pad supplied with an external power supply voltage from the first lead;
a regulator circuit which is electrically connected with the first pad and generates an internal power supply voltage by stepping down the external power supply voltage according to a reference voltage and an input voltage to be compared with this reference voltage;
a second pad which is electrically connected to the regulator circuit and from which the internal power supply voltage is output; and
a third pad which is electrically connected to an input part of the regulator circuit to which the input voltage is input;
wherein the second semiconductor chip includes:
a fourth pad to which the internal power supply voltage is input from the second pad;
wherein the second semiconductor chip is mounted over the chip mounting portion such that the second side of the second semiconductor chip intersects with the first side of the first semiconductor chip in a plan view,
wherein the second and third pads are arranged along the first side of the first semiconductor chip,
wherein the fourth pad is arranged along the first side of the second semiconductor chip,
wherein the second lead is arranged near the first side of the first semiconductor chip rather than the second side of the first semiconductor chip in the plan view, and
wherein the second, third, and fourth pads are electrically connected to the second lead via a plurality of wires, respectively.

2. The semiconductor device according to claim 1,
wherein the second and third pads are arranged in an area of the first semiconductor chip between the second sides of the first and second semiconductor chips in the plan view.

3. The semiconductor device according to claim 1,
wherein the second semiconductor chip is mounted over the first semiconductor chip.

4. The semiconductor device according to claim 1,
wherein the second sides of the second semiconductor chip are longer than the second sides of the first semiconductor chip.

5. The semiconductor device according to claim 1,
wherein the first and second semiconductor chip are rectangular in shape.

6. The semiconductor device according to claim 1,
wherein the fourth pad of the second semiconductor chip is arranged nearer to the corner of the first and second sides of the second semiconductor chip than other corners of the second semiconductor chip.

7. The semiconductor device according to claim 1,
wherein the first semiconductor chip has a plurality of fifth pads transmitting and receiving a signal to and from the second semiconductor chip along a side different from the first and second sides of the first semiconductor chip, wherein the second semiconductor chip has a plurality of sixth pads along a side different from first and second sides of the second sides of the second semiconductor chip, respectively, and
wherein the plurality of fifth and sixth pads are connected each other via a plurality of wires.

8. The semiconductor device according to claim 7,
wherein the first and second semiconductor chips have third sides which face the second sides, respectively, and
wherein the plurality of fifth and sixth pads are arranged along the third sides of the first and second semiconductor chips, respectively.

9. The semiconductor device according to claim 8,
wherein the plurality of the fifth pads are arranged in an area of the first semiconductor chip between the third sides of the first and second semiconductor chips in the plan view.

10. The semiconductor device according to claim 7,
wherein the first semiconductor chip includes an analog circuit and is an analog chip performing power supply control, and the second semiconductor chip is a microcomputer chip for controlling the first semiconductor chip and performing information processing.

* * * * *